(12) United States Patent
Mukai et al.

(10) Patent No.: US 6,501,110 B1
(45) Date of Patent: Dec. 31, 2002

(54) SEMICONDUCTOR MEMORY CELL

(75) Inventors: Mikio Mukai, Kanagawa (JP); Toshio Kobayashi, Kanagawa (JP); Yutaka Hayashi, Ibaraki (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/552,617

(22) Filed: Apr. 19, 2000

(30) Foreign Application Priority Data

Apr. 26, 1999 (JP) .......................................... 11-118326
May 12, 1999 (JP) .......................................... 11-131542

(51) Int. Cl.[7] .............................................. H01L 29/76
(52) U.S. Cl. ....................... 257/256; 257/365; 257/260; 257/272
(58) Field of Search .......................... 257/256, 260, 257/261, 265, 262, 270, 272, 274, 287, 335, 337, 368, 343, 345, 365, 390; 365/185

(56) References Cited

U.S. PATENT DOCUMENTS

| | | | |
|---|---|---|---|
| 4,441,117 A | * 4/1984 | Zommer | 357/43 |
| 4,641,280 A | * 2/1987 | Horiguchi et al. | 365/183 |
| 5,428,238 A | * 6/1995 | Hayashi et al. | 257/366 |
| 5,448,513 A | * 9/1995 | Hu et al. | 365/150 |
| 6,240,010 B1 | * 5/2001 | Mukai et al. | 365/175 |

FOREIGN PATENT DOCUMENTS

| | | | | |
|---|---|---|---|---|
| EP | 0819511 A2 | * 10/1998 | | G11C/11/401 |
| EP | 0 869 511 A2 | 10/1998 | | |
| JP | 411025685 A | * 1/1999 | | G11C/16/06 |

* cited by examiner

*Primary Examiner*—Minh Loan Tran
*Assistant Examiner*—Johannes P Mondt
(74) *Attorney, Agent, or Firm*—Radar, Fishman & Grauer PLLC; Ronald P. Kananen, Esq.

(57) ABSTRACT

A semiconductor memory cell comprising a first transistor for readout, a second transistor for switching, and having a first region, a second region formed in a surface region of the first region, a third region formed in a surface region of the second region, a fourth region formed in a surface region of the first region and spaced from the second region, a fifth region formed in a surface region of the fourth region, and a gate region, wherein when the semiconductor memory cell is cut with a first imaginary perpendicular plane which is perpendicular to the extending direction of the gate region and passes through the center of the gate region, the second region and the fourth region in the vicinity of the gate region are nearly symmetrical with respect to a second imaginary perpendicular plane which is in parallel with the extending direction of the gate region and passes through the center of the gate region.

22 Claims, 67 Drawing Sheets

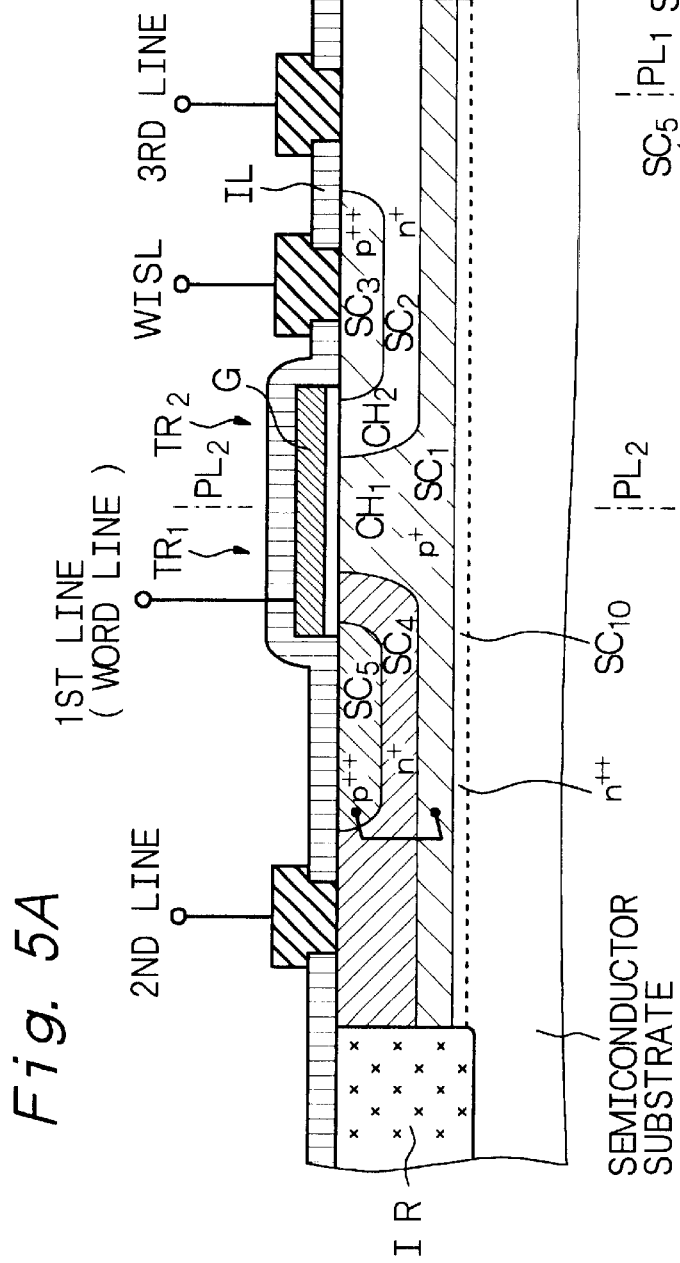
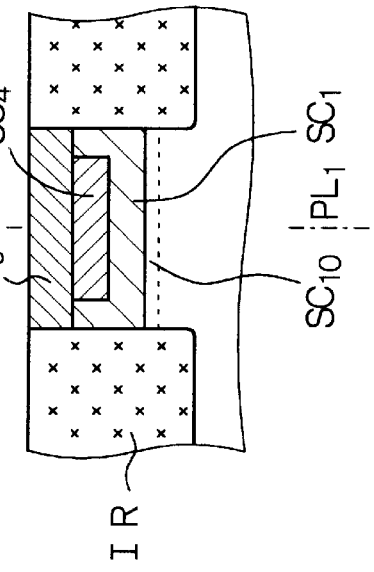
Fig. 5A
Fig. 5B

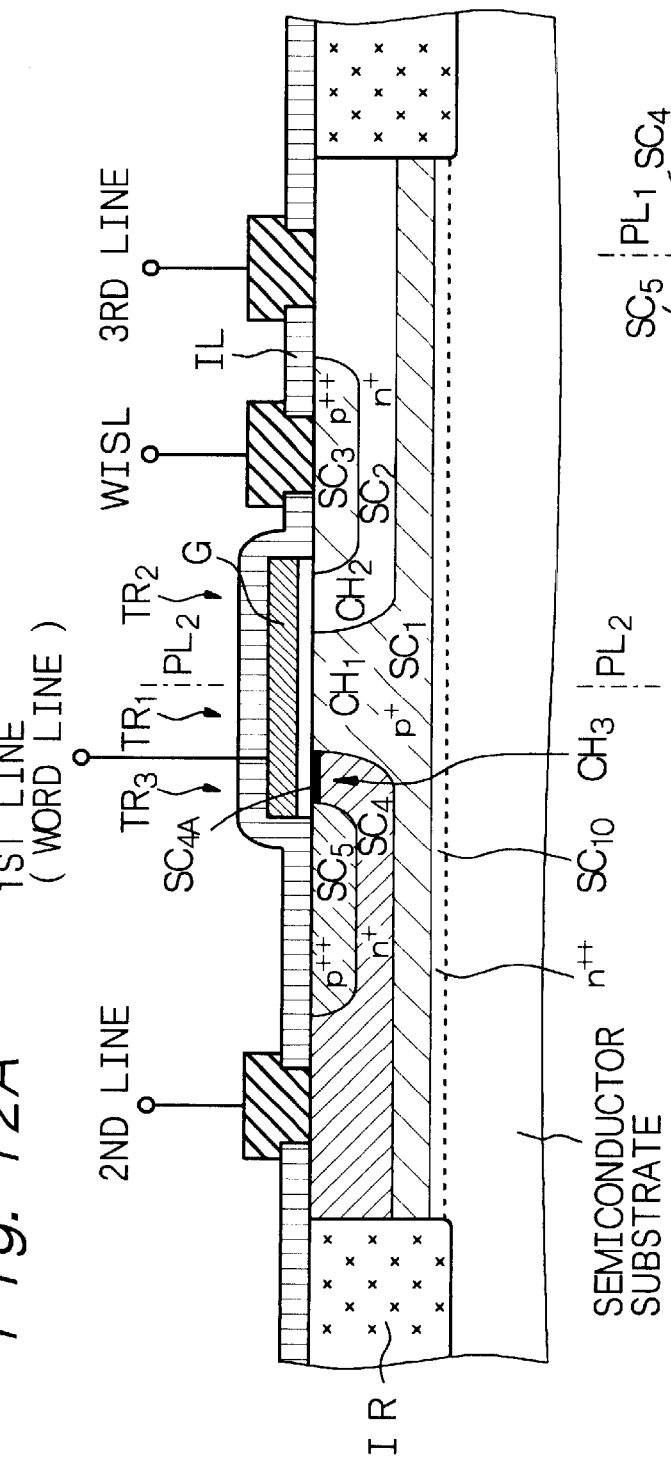
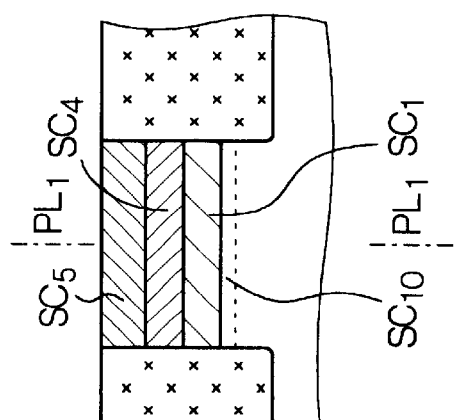
Fig. 12A
Fig. 12B

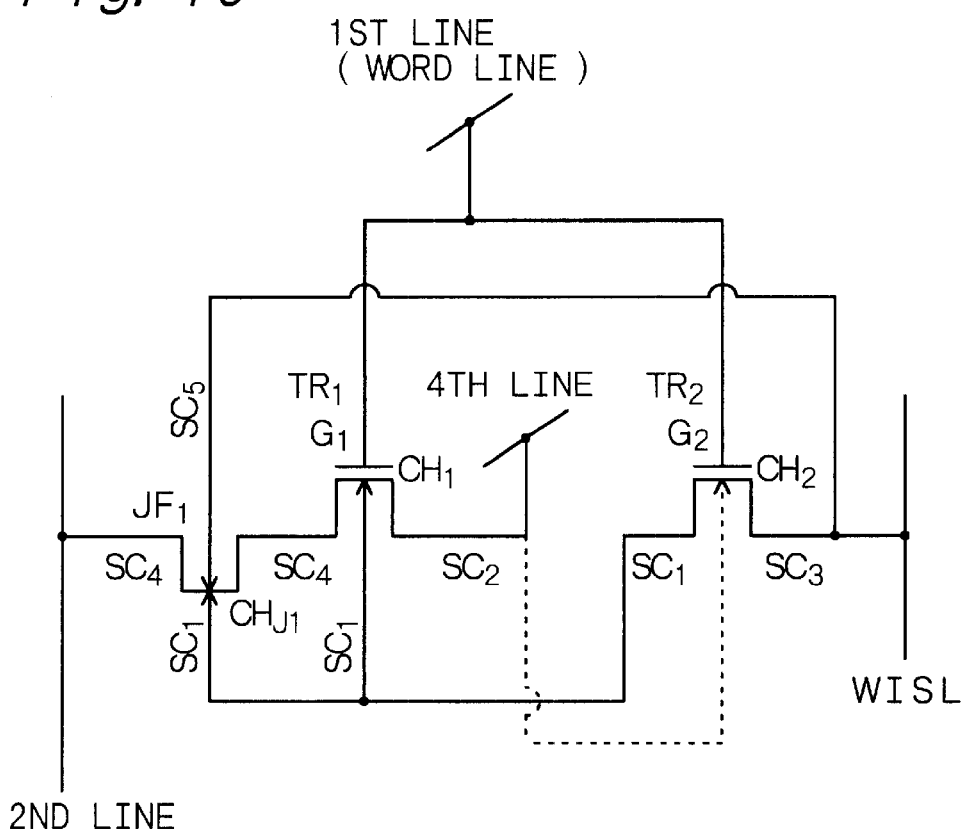

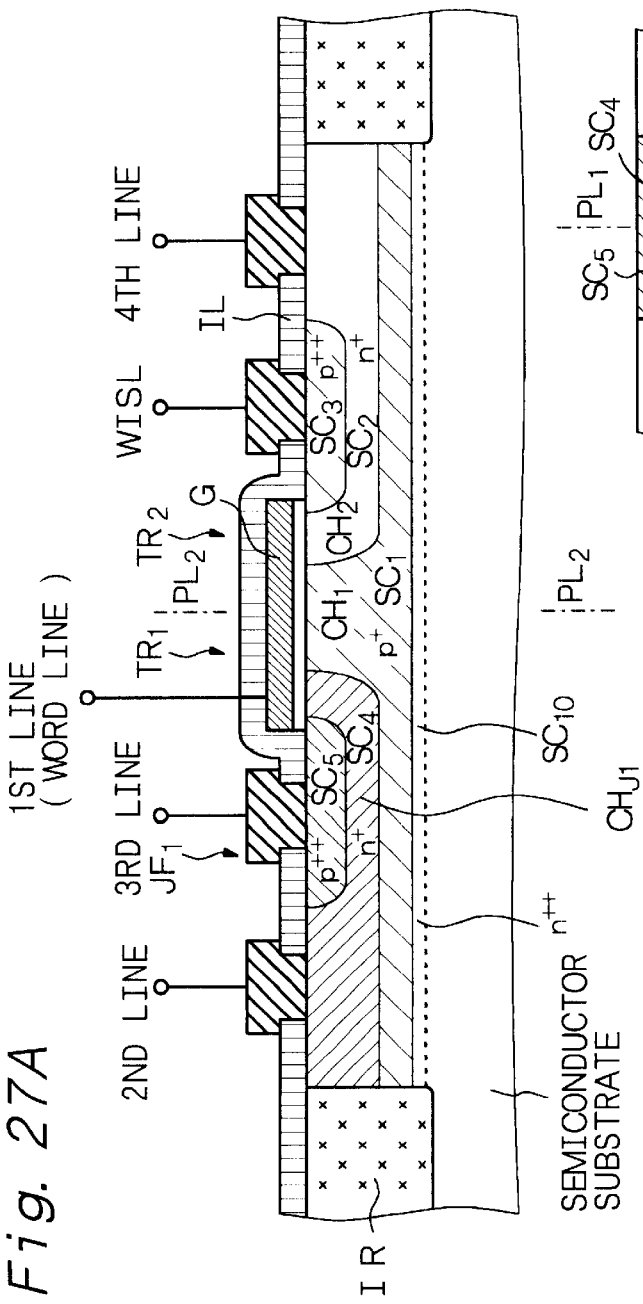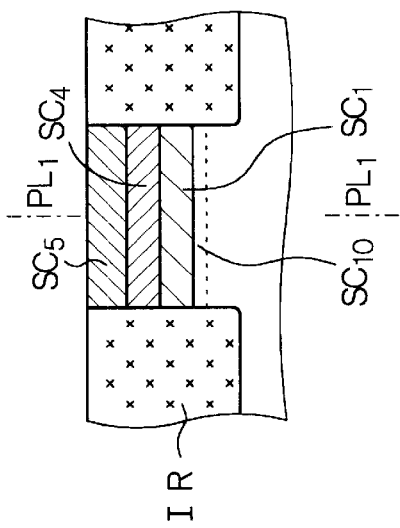
Fig. 27A
Fig. 27B

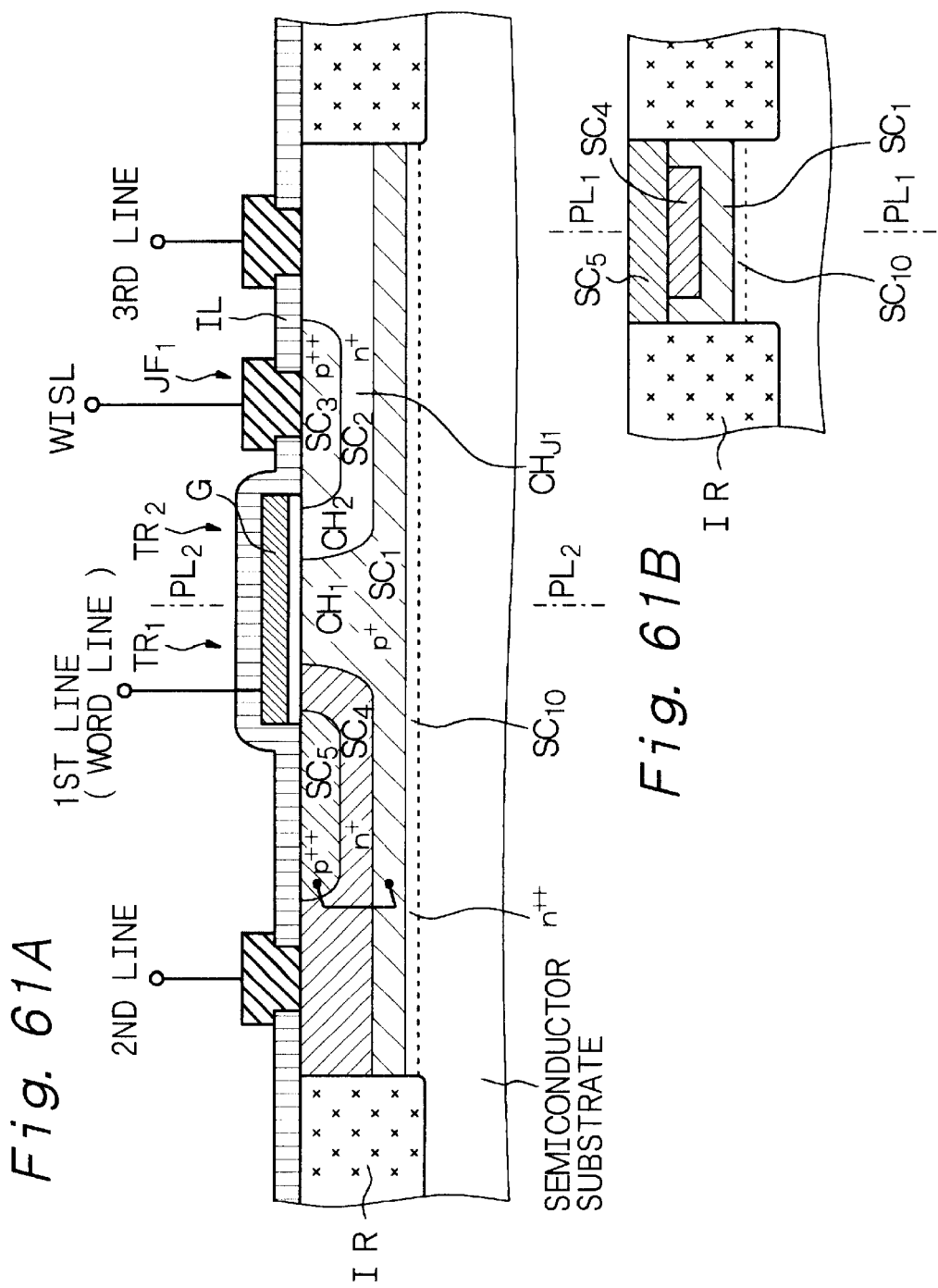

[STEP-10]

[STEP-20]

[STEP-30]

SEMICONDUCTOR MEMORY CELL

BACKGROUND OF THE INVENTION AND RELATED ART STATEMENT

The present invention relates to a semiconductor memory cell having at least two transistors merged into one unit or at least two transistors and a diode merged into one unit. Otherwise, the present invention relates to a semiconductor memory cell having two transistors and a junction-field-effect transistor merged into one unit or at least two transistors, a junction-field-effect transistor and a diode merged into one unit.

As a high-density semiconductor memory cell, conventionally, there is used a dynamic semiconductor memory cell that is called a single-transistor semiconductor memory cell including one transistor and one capacitor as shown in FIG. 67A. In the above semiconductor memory cell, an electric charge stored in the capacitor is required to be large enough to generate a sufficiently large voltage change on a bit line. However, with a decrease in the planar dimensions of the semiconductor memory cell, the capacitor formed in a parallel planar shape decreases in size, which causes the following new problem. When information stored as an electric charge in the capacitor of the semiconductor memory cell is read out, the read-out information is buried in a noise. Or, since the stray capacitance of the bit line in the semiconductor memory cell increases from generation to generation, only a small voltage change is generated on the bit line. As means for solving the above problems, there has been proposed a dynamic semiconductor memory cell having a trench capacitor cell structure as shown in FIG. 67B or a stacked capacitor cell structure. Since, however, the fabrication-related technology has its own limits on the depth of the trench (or groove) or the height of the stack, the capacitance of the capacitor is also limited. For this reason, dynamic semiconductor memory cells having the above structures are said to encounter the above limits unless expensive new materials are introduced for the capacitor as far as the dimensions thereof beyond the deep sub-micron rule (low sub-micron rule) are concerned.

In the planar dimensions smaller than those of the deep sub-micron rule (low sub-micron rule), the transistor constituting the semiconductor memory cell also has problems of deterioration of the drain breakdown voltage and a punchthrough from a drain region to a source region. There is therefore a large risk that current leakage takes place even if the voltage applied to the semiconductor memory cell is still within a predetermined range. When a semiconductor memory cell is made smaller in size, therefore, it is difficult to normally operate the semiconductor memory cell having a conventional transistor structure.

For overcoming the above limit problems of the capacitor, the present Applicant has proposed a semiconductor memory cell comprising two transistors or two transistors physically merged into one unit, as is disclosed in Japanese Patent Application No. 246264/1993 (JP-A-7-99251) corresponding to U.S. Pat. No. 5,428,238. The following explanation is made by referring to Japanese Patent Application No. 246264/1993 (JP-A-7-99251). The semiconductor memory cell shown in FIGS. 15(A) and 15(B) of the above Japanese Patent Application comprises a first semi-conductive region $SC_1$ of a first conductivity type formed in a surface region of a semiconductor substrate or formed on an insulating substrate, a first conductive region $SC_2$ formed in a surface region of the first semi-conductive region $SC_1$ so as to form a rectifier junction together with the first semi-conductive region $SC_1$, a second semi-conductive region $SC_3$ of a second conductivity type formed in a surface region of the first semi-conductive region $SC_1$ and spaced from the first conductive region $SC_2$, a second conductive region $SC_4$ formed in a surface region of the second semi-conductive region $SC_3$ so as to form a rectifier junction together with the second semi-conductive region $SC_3$, and a conductive gate G formed on a barrier layer so as to bridge the first semi-conductive region $SC_1$ and the second conductive region $SC_4$ and so as to bridge the first conductive region $SC_2$ and the second semi-conductive region $SC_3$, the conductive gate G being connected to a first memory-cell-selecting line, the first conductive region $SC_2$ being connected to a write-in information setting line, and the second conductive region $SC_4$ being connected to a second memory-cell-selecting line.

The first semi-conductive region $SC_1$ (functioning as a channel forming region $Ch_2$), the first conductive region $SC_2$ and the second semi-conductive region $SC_3$ (functioning as source/drain regions) and the conductive gate G constitute a switching transistor $TR_2$. On the other hand, the second semi-conductive region $SC_3$ (functioning as a channel forming region $Ch_1$), the first semi-conductive region $SC_1$ and the second conductive region $SC_4$ (functioning as source/drain regions) and the conductive gate G constitute an information storing transistor $TR_1$.

When information is written in the above semiconductor memory cell, the switching transistor $TR_2$ is brought into an ON-state. As a result, the information is stored in the channel forming region $Ch_1$ of the information storing transistor $TR_1$ as a potential or as an electric charge. When the information is read out, the threshold voltage of the information storing transistor $TR_1$ seen from the conductive gate G varies, depending upon the potential or the electric charge stored in the channel forming region $Ch_1$ of the information storing transistor $TR_1$. Therefore, when the information is read out, the storage state of the information storing transistor $TR_1$ can be judged from the magnitude of a channel current (including a zero magnitude) by applying a properly selected potential to the conductive gate G. The information is read out by detecting the operation state of the information storing transistor $TR_1$.

That is, when information is read out, the information storing transistor $TR_1$ is brought into an ON-state or an OFF-state, depending upon the information stored therein. Since the second conductive region $SC_4$ is connected to the second line, a current which is large or small depending upon the stored information ("0" or "1") flows in the information storing transistor $TR_1$. In this way, the information stored in the semiconductor memory cell can be read out through the information storing transistor $TR_1$.

Further, the present Applicant in Japanese Patent Application No. 251646/1997 (JP-A-10-154757) has proposed a semiconductor memory cell comprising three transistors such as a transistor $TR_1$ for readout, a transistor $TR_2$ for switching and a junction type transistor $TR_3$ for current control.

In the semiconductor memory cells disclosed in the above Laid-open publications, however, the layout and structure of the regions are asymmetric with regard to a conductive gate, so that there is involved a problem that it is constantly required to advert to the direction of the conductive gate during designing and production of the semiconductor memory cells.

OBJECT AND SUMMARY OF THE INVENTION

It is a first object of the present invention to provide a semiconductor memory cell, or a semiconductor memory cell for a logic, which permits a high freedom during designing or production thereof, which attains stabilized performances of a transistor, which requires no large capacitor unlike any conventional DRAM, which secures reliable writing and readout of information and which permits minimizing of dimensions, and further to a semiconductor memory cell in which at least two transistors, or at least two transistors and a diode are merged into one unit.

It is a second object of the present invention to provide a semiconductor memory cell, or a semiconductor memory cell for a logic, which permits a high freedom during designing or production thereof, which attains stabilized performances of a transistor, which requires no large capacitor unlike any conventional DRAM, which secures reliable writing and readout of information and which permits minimizing of dimensions, and further to a semiconductor memory cell in which at least two transistors and a junction-field-effect transistor, or at least two transistors, a junction-field-effect transistor and a diode are merged into one unit.

According to a first aspect of the present invention for achieving the above first object, there is provided a semiconductor memory cell comprising;
  (1) a first transistor for readout, having source/drain regions, a channel forming region and a gate region and having a first conductivity type, and
  (2) a second transistor for switching, having source/drain regions, a channel forming region and a gate region and having a second conductivity type,
the semiconductor memory cell having;
  (a) a semi-conductive first region having a second conductivity type,
  (b) a semi-conductive second region which is formed in a surface region of the first region and has a first conductivity type,
  (c) a third region which is formed in a surface region of the second region and is in contact with the second region so as to form a rectifier junction together with the second region,
  (d) a semi-conductive fourth region which is formed in a surface region of the first region and spaced from the second region and which has the first conductivity type,
  (e) a fifth region which is formed in a surface region of the fourth region and is in contact together with the fourth region so as to form a rectifier junction together with the fourth region, and
  (f) a gate region which is formed on an insulation layer so as to bridge the first region and the third region and so as to bridge the second region and the fourth region, and is shared by the first and second transistors,
wherein:
  (A-1) one source/drain region of the first transistor is formed of a surface region of the second region,
  (A-2) the other source/drain region of the first transistor is formed of a surface region of the fourth region,
  (A-3) the channel forming region of the first transistor is formed of a surface region of the first region which surface region is interposed between said surface region of the second region and said surface region of the fourth region,
  (B-1) one source/drain region of the second transistor is formed of said surface region of the first region which surface region forms the channel forming region of the first transistor,
  (B-2) the other source/drain region of the second transistor is formed of the third region,
  (B-3) the channel forming region of the second transistor is formed of said surface region of the second region which surface region forms the one source/drain region of the first transistor,
  (C) the gate region is connected to a first line for memory cell selection,
  (D) the third region is connected to a write-in information setting line,
  (E) the fourth region is connected to a second line, and
  (F) the fifth region is connected to the first region, and further wherein:
    when the semiconductor memory cell is cut with a first imaginary perpendicular plane which is perpendicular to the extending direction of the gate region and passes through the center of the gate region, the second region and the fourth region in the vicinity of the gate region are nearly symmetrical with respect to a second imaginary perpendicular plane which is in parallel with the extending direction of the gate region and passes through the center of the gate region.

In the present invention, the term "imaginary perpendicular plane" refers to an imaginary plane perpendicular to the surface of the first region. Further, the term "nearly symmetrical" is used for including a concept that cases where "symmetry" varies depending upon methods of forming each region are included in cases where two regions are symmetrical. The term "nearly symmetrical" is also used in this sense hereinafter.

According to a second aspect of the present invention for achieving the above first object, there is provided a semiconductor memory cell comprising;
  (1) a first transistor for readout, having source/drain regions, a channel forming region and a gate region and having a first conductivity type,
  (2) a second transistor for switching, having source/drain regions, a channel forming region and a gate region and having a second conductivity type, and
  (3) a third transistor for current control, having source/drain regions, a channel forming region and a gate region and having the second conductivity type,
the semiconductor memory cell having;
  (a) a semi-conductive first region having a second conductivity type,
  (b) a semi-conductive second region which is formed in a surface region of the first region and has a first conductivity type,
  (c) a third region which is formed in a surface region of the second region and is in contact with the second region so as to form a rectifier junction together with the second region,
  (d) a semi-conductive fourth region which is formed in a surface region of the first region and spaced from the second region and which has the first conductivity type,
  (e) a fifth region which is formed in a surface region of the fourth region and is in contact together with the fourth region so as to form a rectifier junction together with the fourth region, and
  (f) a gate region which is formed on an insulation layer so as to bridge the first region and the third region, so as to bridge the second region and the fourth region and so as to bridge the first region and fifth region, and is shared by the first, second and third transistors, wherein:
(A-1) one source/drain region of the first transistor is formed of a surface region of the second region,
(A-2) the other source/drain region of the first transistor is formed of a surface region of the fourth region,
(A-3) the channel forming region of the first transistor is formed of a surface region of the first region which surface region is interposed between said surface region of the second region and said surface region of the fourth region,
(B-1) one source/drain region of the second transistor is formed of said surface region of the first region which surface region forms the channel forming region of the first transistor,
(B-2) the other source/drain region of the second transistor is formed of the third region,
(B-3) the channel forming region of the second transistor is formed of said surface region of the second region which surface region forms the one source/drain region of the first transistor,
(C-1) one source/drain region of the third transistor is formed of said surface region of the first region,
(C-2) the other source/drain region of the third transistor is formed of the fifth region,
(C-3) the channel forming region of the third transistor is formed of said surface region of the fourth region,
(D) the gate region is connected to a first line for memory cell selection,
(E) the third region is connected to a write-in information setting line, and
(F) the fourth region is connected to a second line, and further wherein:
when the semiconductor memory cell is cut with a first imaginary perpendicular plane which is perpendicular to the extending direction of the gate region and passes through the center of the gate region, the second region and the fourth region in the vicinity of the gate region are nearly symmetrical with respect to a second imaginary perpendicular plane which is in parallel with the extending direction of the gate region and passes through the center of the gate region.

Further, in the semiconductor memory cell according to the first or second aspect of the present invention, preferably, the third region and the fifth region in the vicinity of the gate region are nearly symmetrical with respect of the above second imaginary perpendicular plane when the semiconductor memory cell is cut with the above first imaginary perpendicular plane.

In the semiconductor memory cell according to the first or second aspect of the present invention, it is preferred to employ a constitution in which the second region is connected to a third line, the second line is used as a bit line and a predetermined potential is applied to the third line, or a constitution in which the second region is connected to a third line, the third line is used as a bit line and a predetermined potential is applied to the second line.

Alternatively, in the semiconductor memory cell according to the first or second aspect of the present invention, for simplification of a wiring structure, it is preferred to employ a constitution in which a diode is formed of the second region and the third region, and the second region is connected to the write-in information setting line through the third region. In this case, it is preferred to employ a constitution in which the second line is used as a bit line or a constitution in which the write-in information setting line is used as a bit line as well and a predetermined potential is applied to the second line.

According to a third aspect of the present invention for achieving the above second object, there is provided a semiconductor memory cell comprising;
(1) a first transistor for readout, having source/drain regions, a channel forming region and a gate region and having a first conductivity type,
(2) a second transistor for switching, having source/drain regions, a channel forming region and a gate region and having a second conductivity type, and
(3) a junction-field-effect transistor for current control, having source/drain regions, a channel region and gate portions,
the semiconductor memory cell having;
(a) a semi-conductive first region having a second conductivity type,
(b) a semi-conductive second region which is formed in a surface region of the first region and has a first conductivity type,
(c) a third region which is formed in a surface region of the second region and is in contact with the second region so as to form a rectifier junction together with the second region,
(d) a semi-conductive fourth region which is formed in a surface region of the first region and spaced from the second region and which has the first conductivity type,
(e) a fifth region which is formed in a surface region of the fourth region and is in contact with the fourth region so as to form a rectifier junction together with the fourth region, and
(f) a gate region which is formed on an insulation layer so as to bridge the first region and the third region and so as to bridge the second region and the fourth region and is shared by the first and second transistors,
wherein:
(A-1) one source/drain region of the first transistor is formed of a surface region of the second region,
(A-2) the other source/drain region of the first transistor is formed of a surface region of the fourth region,
(A-3) the channel forming region of the first transistor is formed of a surface region of the first region which surface region is interposed between said surface region of the second region and said surface region of the fourth region,
(B-1) one source/drain region of the second transistor is formed of said surface region of the first region which surface region forms the channel forming region of the first transistor,
(B-2) the other source/drain region of the second transistor is formed of the third region,
(B-3) the channel forming region of the second transistor is formed of said surface region of the second region which surface region forms the one source/drain region of the first transistor,
(C-1) the gate portions of the junction-field-effect transistor are formed of the fifth region and a portion of the first region which portion is opposed to the fifth region,
(C-2) the channel region of the junction-field-effect transistor is formed of a portion of the fourth region which portion is interposed between the fifth region and said portion of the first region, (C-3) one source/drain region of the junction-field-effect transistor is formed of said surface region of the fourth region which surface region extends from one end of the channel region of the junction-field-effect transistor and forms the other source/drain region of the first transistor, (C-4) the other source/drain region of the junction-field-effect transistor is formed of a portion of the fourth region which portion extends from the other end of the channel region of the junction-field-effect transistor, (D) the gate region is connected to a first line for memory cell selection, (E) the third region is connected to a write-in information setting line, (F) the fourth region is connected to a second line, and (G) the fifth region is connected to a third line, and further wherein:

when the semiconductor memory cell is cut with a first imaginary perpendicular plane which is perpendicular to the extending direction of the gate region and passes through the center of the gate region, the second region and the fourth region in the vicinity of the gate region is nearly symmetrical with respect to a second imaginary perpendicular plane which is in parallel with the extending direction of the gate region and passes through the center of the gate region.

In the semiconductor memory cell according to the third aspect of the present invention, there may be employed a constitution in which the fifth region is connected to the write-in information setting line in place of being connected to the third line, or a constitution in which the fifth region is connected to the first region in place of being connected to the third line.

In the semiconductor memory cell according to the third aspect of the present invention, there may be employed a constitution in which the semiconductor memory cell further comprises a second junction-field-effect transistor for current control, having source/drain regions, a channel region and gate portions, the gate portions of the second junction-field-effect transistor are formed of the third region and a portion of the first region which portion is opposed to the third region, the channel region of the second junction-field-effect transistor is formed of a portion of the second region which portion is interposed between the third region and said portion of the first region, one source/drain region of the second junction-field-effect transistor is formed of said surface region of the second region which surface region extends from one end of the channel region of the second junction-field-effect transistor and forms the one source/drain region of the first transistor, and the other source/drain region of the second junction-field-effect transistor is formed of a portion of the second region which portion extends from the other end of the channel region of the second junction-field-effect transistor.

In the above case, there may be employed a constitution in which the fifth region is connected to the first region in place of being connected to the third line.

A semiconductor memory cell according to the fourth aspect of the present invention for achieving the above second object further has a third transistor for current control, and in this point, it differs from the semiconductor memory cell according to the third aspect of the present invention. That is, the semiconductor memory cell according to the fourth aspect of the present invention comprises;

(1) a first transistor for readout, having source/drain regions, a channel forming region and a gate region and having a first conductivity type, (2) a second transistor for switching, having source/drain regions, a channel forming region and a gate region and having a second conductivity type, (3) a third transistor for current control, having source/drain regions, a channel forming region and a gate region and having the second conductivity type, and (4) a junction-field-effect transistor for current control, having source/drain regions, a channel region and gate portions, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region and spaced from the second region and which has the first conductivity type, (e) a fifth region which is formed in a surface region of the fourth region and is in contact with the fourth region so as to form a rectifier junction together with the fourth region, and (f) a gate region which is formed on an insulation layer so as to bridge the first region and the third region, so as to bridge the second region and the fourth region and so as to bridge the first region and the fifth region and is shared by the first, second and third transistors, wherein:

(A-1) one source/drain region of the first transistor is formed of a surface region of the second region, (A-2) the other source/drain region of the first transistor is formed of a surface region of the fourth region, (A-3) the channel forming region of the first transistor is formed of a surface region of the first region which surface region is interposed between said surface region of the second region and said surface region of the fourth region, (B-1) one source/drain region of the second transistor is formed of said surface region of the first region which surface region forms the channel forming region of the first transistor, (B-2) the other source/drain region of the second transistor is formed of the third region, (B-3) the channel forming region of the second transistor is formed of said surface region of the second region which surface region forms the one source/drain region of the first transistor, (C-1) one source/drain region of the third transistor is formed of said surface region of the first region, (C-2) the other source/drain region of the third transistor is formed of the fifth region, (C-3) the channel forming region of the third transistor is formed of said surface region of the fourth region, (D-1) the gate portions of the junction-field-effect transistor are formed of the fifth region and a portion of the first region which portion is opposed to the fifth region, (D-2) the channel region of the junction-field-effect transistor is formed of a portion of the fourth region which portion is interposed between the fifth region and said portion of the first region, (D-3) one source/drain region of the junction-field-effect transistor is formed of said surface region of the fourth region which surface region extends from one end of the channel region of the junction-field-effect transistor, forms the other source/drain region of the first transistor and forms the channel forming region of the third transistor, (D-4) the other source/drain region of the junction-field-effect transistor is formed of a portion of the fourth region which portion extends from the other end of the channel region of the junction-field-effect transistor, (E) the gate region is connected to a first line for memory cell selection, (F) the third region is connected to a write-in information setting line, and (G) the fourth region is connected to a second line, and and further wherein:

when the semiconductor memory cell is cut with a first imaginary perpendicular plane which is perpendicular to the extending direction-of the gate region and passes through the center of the gate region, the second region and the fourth region in the vicinity of the gate region is nearly symmetrical with respect to a second imaginary perpendicular plane which is in parallel with the extending direction of the gate region and passes through the center of the gate region.

In the semiconductor memory cell according to the fourth aspect of the present invention, there may be employed a constitution in which the semiconductor memory cell further comprises a second junction-field-effect transistor for current control, having source/drain regions, a channel region and gate portions, the gate portions of the second junction-field-effect transistor are formed of the third region and a portion of the first region which portion is opposed to the third region, the channel region of the second junction-field-effect transistor is formed of a portion of the second region which portion is interposed between the third region and said portion of the first region, one source/drain region of the second junction-field-effect transistor is formed of said surface region of the second region which surface region extends from one end of the channel region of the second junction-field-effect transistor and forms the one source/drain region of the first transistor, and the other source/drain region of the second junction-field-effect transistor is formed of a portion of the second region which portion extends from the other end of the channel region of the second junction-field-effect transistor.

A semiconductor memory cell according to a fifth aspect of the present invention for achieving the above second object differs from the semiconductor memory cell according to the third aspect of the present invention in a position where the junction-field-effect transistor is formed. That is, the semiconductor memory cell according to the fifth aspect of the present invention comprises;

(1) a first transistor for readout, having source/drain regions, a channel forming region and a gate region and having a first conductivity type, (2) a second transistor for switching, having source/drain regions, a channel forming region and a gate region and having a second conductivity type, and (3) a junction-field-effect transistor for current control, having source/drain regions, a channel region and gate portions, the semiconductor memory cell having;

(a) a semi-conductive first region having a second conductivity type, (b) a semi-conductive second region which is formed in a surface region of the first region and has a first conductivity type, (c) a third region which is formed in a surface region of the second region and is in contact with the second region so as to form a rectifier junction together with the second region, (d) a semi-conductive fourth region which is formed in a surface region of the first region and spaced from the second region and which has the first conductivity type, (e) a fifth region which is formed in a surface region of the fourth region and is in contact with the fourth region so as to form a rectifier junction together with the fourth region, and (f) a gate region which is formed on an insulation layer so as to bridge the first region and the third region and so as to bridge the second region and the fourth region and is shared by the first and second transistors, wherein:

(A-1) one source/drain region of the first transistor is formed of a surface region of the second region, (A-2) the other source/drain region of the first transistor is formed of a surface region of the fourth region, (A-3) the channel forming region of the first transistor is formed of a surface region of the first region which surface region is interposed between said surface region of the second region and said surface region of the fourth region, (B-1) one source/drain region of the second transistor is formed of said surface region of the first region which surface region forms the channel forming region of the first transistor, (B-2) the other source/drain region of the second transistor is formed of the third region, (B-3) the channel forming region of the second transistor is formed of said surface region of the second region which surface region forms the one source/drain region of the first transistor, (C-1) the gate portions of the junction-field-effect transistor are formed of the third region and a portion of the first region which portion is opposed to the third region, (C-2) the channel region of the junction-field-effect transistor is formed of a portion of the second region which portion is interposed between the third region and said portion of the first region, (C-3) one source/drain region of the junction-field-effect transistor is formed of said surface region of the second region which surface region extends from one end of the channel region of the junction-field-effect transistor and forms the one source/drain region of the first transistor, (C-4) the other source/drain region of the junction-field-effect transistor is formed of a portion of the second region which portion extends from the other end of the channel region of the junction-field-effect transistor, (D) the gate region is connected to a first line for memory cell selection, (E) the third region is connected to a write-in information setting line, (F) the fourth region is connected to a second line, and (G) the fifth region is connected to the first region, and further wherein:

when the semiconductor memory cell is cut with a first imaginary perpendicular plane which is perpendicular to the extending direction of the gate region and passes through the center of the gate region, the second region and the fourth region in the vicinity of the gate region are symmetrical with respect to a second imaginary perpendicular plane which is in parallel with the extending direction of the gate region and passes through the center of the gate region.

Differing from the semiconductor according to the third aspect of the present invention, the fifth region does not take part in the constitution of the junction-field-effect transistor. Since, however, the fifth region and the first region are connected to each other, a region where information is to be stored can be increased, and the length of time period for which the semiconductor memory cell stores information can be increased.

The junction-field-effect transistor (JFET) or the second junction-field-effect transistor in the semiconductor memory cell according to each of the third to fifth aspects of the present invention can be formed by (i) optimizing the distance between the opposing gate portions of each junction-field-effect transistor (thickness of the channel region), and (ii) optimizing the impurity concentration of the opposing gate portions of each junction-field-effect transistor and the impurity concentration of the channel region of each junction-field-effect transistor.

When the distance between the gate portions (thickness of the channel region) and the impurity concentration of each of the gate portions and the channel region are not optimized, a depletion layer does not broaden, and no ON-OFF operation of each junction-field-effect transistor can be obtained. The above optimization is required to be attained by computer simulation or experiments.

Further, in the semiconductor memory cell according to the third, fourth or fifth aspect of the present invention, preferably, when semiconductor memory cell is cut with the above first imaginary perpendicular plane, the third region and the fifth region in the vicinity of the gate region are nearly symmetrical with respect to the above second imaginary perpendicular plane.

In the semiconductor memory cell according to the third aspect of the present invention, it is preferred to employ a constitution in which the second region is connected to a fourth line, the second line is used as a bit line and a predetermined potential is applied to the fourth line, or a constitution in which the second region is connected to a fourth line, the fourth line is used as a bit line and a predetermined potential is applied to the second line.

In the semiconductor memory cell according to the fourth or fifth aspect of the present invention, it is preferred to employ a constitution in which the second region is connected to a third line, the second line is used as a bit line and the a predetermined potential is applied to the third line, or a constitution in which the second region is connected to a third line, the third line is used as a bit line and a predetermined potential is applied to the second line.

Alternatively, in the semiconductor memory cell according to the third, fourth or fifth aspect of the present invention including various variants, for simplification of a wiring structure, it is preferred to employ a constitution in which a diode is formed of the second region and the third region, and the second region is connected to the write-in information setting line through the third region. In this case, it is preferred to employ a constitution in which the second line is used as a bit line, or a constitution in which the write-in information setting line is used as a bit line as well and a predetermined potential is applied to the second line.

When the third region is formed of a semi-conductive region having an opposite conductivity type to the second region, the diode is a pn junction diode, and the pn junction diode can be formed by adjusting impurity concentrations of these regions forming the pn junction diode to proper values. When potentials in the regions forming the pn junction diode are set improperly, or when designing of the relationship of the impurity concentrations in these regions is improper, carriers injected from the above pn junction diode may latch up the semiconductor memory cell.

For avoiding the above failure, it is preferred to employ a constitution in which a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region. The diode-constituting region is preferably made from a material which forms a Schottky junction or an ISO type hetero-junction in which such a diode operates on the basis of majority carriers in the second region and majority carriers are not injected even when a forward-direction bias is applied to the junction portion. That is, the rectifier junction is preferably a majority carrier junction such as a Schottky junction or an ISO type hetero-junction. The term "ISO type hetero-junction" refers to a hetero-junction formed between two semi-conductive regions which have an identical conductivity type but are different in kind. Particulars of the ISO type hetero-junction are described in "Physics of Semiconductor Devices", S. M. Sze, 2nd Edition, page 122 (issued by John Wiley & Sons). In the above Schottky junction or ISO type hetero-junction, the forward-direction voltage is lower than the forward-direction voltage in a pn junction. The majority carrier diode having the above properties can avoid the latch-up phenomenon. The Schottky junction can be formed when the diode-constituting region is made of a metal such as aluminum, molybdenum or titanium or silicide such as $TiSi_2$ or $WSi_2$. The ISO type hetero-junction can be formed when the diode-constituting region is made of a semi-conductive material which differs from a material constituting the second region and which has the same conductivity type as the conductivity type of the second region. The diode-constituting region may be made of the same material as a material (for example, titanium silicide or TiN for use as a barrier layer or a glue layer) used for constituting the write-in information setting line. That is, there can be employed a structure in which the diode-constituting region is formed in a surface region of the second region and the so-formed diode-constituting region is used as part of the write-in information setting line. The above structure in which "the diode-constituting region is used as part of the write-in information setting line" also includes a state where the diode-constituting region is made of a compound formed by a reaction between a wiring material and silicon of a silicon semiconductor substrate.

In the semiconductor memory cell according to the second aspect of the present invention, preferably, an impurity-containing layer having the second conductivity type is formed in a surface region of the fourth region forming the channel forming region of the third transistor. In this case, when information is retained, and when the potential of the first line is set at 0 volt, the third transistor is brought into an ON-state, and the fifth region and the first region are brought into a conduction sate. Preferably, the impurity content of the impurity-containing layer is adjusted such that the third transistor is brought into an OFF-state by a potential which is applied to the first line when information is read out.

The semiconductor memory cell of the present invention may be formed in a surface region of a semiconductor substrate, on an insulating layer formed on a semiconductor substrate, in a well structure formed in a semiconductor substrate or on an insulator. For coping with a soft-error caused by a particle or neutron, preferably, the semiconductor memory cell is formed in a well structure or on an insulator (insulating layer), or it has a so-called SOI structure or a TFT structure. The insulator or insulating layer may be formed not only on a semiconductor substrate, but also on a glass substrate or a quartz substrate.

In the semiconductor memory cell of the present invention, it is preferred to form a high-impurity-concentration layer having a first conductivity type below the first region, since, in this case, the potential or charge stored in the channel forming region of the first transistor can be increased.

The channel forming region can be made from silicon, GaAs or the like according to a conventional method. The gate region of the first transistor or the second transistor can be made from a metal, an impurity-containing silicon, an impurity-containing amorphous silicon, an impurity-containing polysilicon, silicide, or GaAs containing a high concentration of an impurity, according to a conventional method. The insulation layer can be made from $SiO_2$, $Si_3N_4$, $Al_2O_3$ or GaAlAs according to a conventional method. Each region can be made from an impurity-containing silicon, an impurity-containing amorphous silicon, an impurity-containing polysilicon, silicide, silicon-germanium (Si—Ge) or GaAs containing a high concentration of an impurity according to a conventional method depending upon required properties and structure thereof.

In the semiconductor memory cell of the present invention, the third region may be made from silicide, a metal or a metal compound depending upon required properties. However, the third region is preferably made from a semiconductor. Further, the fifth region may be made from a semiconductor, or it may be made from silicide, a metal or a metal compound.

In the present invention, when the semiconductor memory cell is cut with the first imaginary perpendicular plane, the second and fourth regions in the vicinity of the gate region are symmetrical with respect to the second imaginary perpendicular plane, and in some constitutions, further, the third and fifth regions in the vicinity of the gate region are symmetrical with respect to the second imaginary perpendicular plane. Therefore, the freedom during designing or production of the semiconductor memory cell can be increased.

In the semiconductor memory cell of the present invention, further, the gate region is common to the first transistor and the second transistor and is connected to the first line for memory cell selection, so that one line is sufficient for the first line for memory cell selection, which serves to decrease a chip area. Further, since the first transistor for readout and the second transistor for switching are merged into one unit, so that a cell area can be decreased and that a leak current can be decreased.

In the semiconductor memory cell of the present invention, the ON-OFF state of the first transistor and the second transistor can be controlled by selecting a proper potential in the first line for memory cell selection. That is, when information is written in, the potential of the first line for memory cell section is set at a level at which the second transistor is sufficiently turned on. Therefore, the second transistor is brought into conduction, and a charge is stored in a capacitor formed between the channel forming region and one source/drain region of the second transistor depending upon a potential of the write-in information setting line. As a result, information is stored in the channel forming region of the first transistor in the form of a potential difference between the channel forming region of the second transistor and the channel forming region of the first transistor, or a charge. When the information is read out, the potential of the source/drain region of the first transistor comes to be a readout potential, and in the first transistor, the potential or charge (information) stored in the channel forming region is converted to a potential difference between the channel forming region and the other source/drain region or a charge, and the threshold value of the first transistor, seen from the gate region, changes depending upon the above charge (information). When information is read out, a properly selected potential is applied to the gate region, whereby the ON-OFF operation of the first transistor can be controlled. The operation state of the first transistor is detected, whereby the information can be read out.

Further, a diode obviates the third line which is to be connected to one source/drain region (second region) of the first transistor. In the above semiconductor memory cell of the present invention, when the potentials are improperly set in the regions constituting the diode, or when the impurity concentration relationship of these regions is designed improperly, a latch-up phenomenon may take place during writing of information if the voltage applied to the write-in information setting line is not at a low level (for example, smaller than, or equal to, 0.4 volt when the junction is a pn junction) at which no large forward-direction current flows in the junction portion of the third region and the second region. For avoiding the latch-up phenomenon, there is provided a method as is already explained, in which a diode-constituting region is formed in a surface region of the second region, and the diode-constituting region is made of a silicide, a metal or a metal compound, to form a Schottky junction or an ISO type hetero-junction as a junction of the diode-constituting region and the second region, so that majority carriers mainly constitute a forward-direction current.

In the semiconductor memory cell according to any one of the third to fifth aspects of the present invention, further, the junction-field-effect transistor is provided in addition to the first transistor of a first conductivity type and the second transistor of a second conductivity type. The ON-OFF operation of the junction-field-effect transistor is controlled when the information is read out, so that a margin of a current which flows between the source/drain regions of the first transistor can be remarkably broadened. As a result, there is almost no limitation to be imposed on the number of the semiconductor memory cells that can be connected, for example, to the second line. Further, when the third transistor for current control is provided, the ON-OFF operation is controlled during reading of information, so that a margin of a current which flows between the source/drain regions of the first transistor can be more reliably remarkably broadened. As a result, the number of the semiconductor memory cells that can be connected, for example, to the second line is limited to a far less degree.

The semiconductor memory cell of the present invention retains information in the form of a potential, a potential difference or a charge, while it is attenuated by a lead current such as junction leak and a refreshing operation is required. The semiconductor memory cell therefore operates like DRAM.

BRIEF DESCRIPTION OF THE DRAWINGS

The present invention will be explained on the basis of Examples with reference to drawings. Schematic partial cross sectional views in the following explanation are views obtained by cutting semiconductor memory cells with the first imaginary perpendicular plane which is perpendicular to the extending direction of a gate region and passes through the center of the gate region, unless otherwise specified.

FIGS. 5A and 5B are schematic partial cross-sectional views of a semiconductor memory cell of Example 1.

FIGS. 12A and 12B are schematic partial cross-sectional views of a semiconductor memory cell of Example 2.

FIG. 19 is a principle-showing view of a variant of the semiconductor memory cell according to the third aspect of the present invention.

FIGS. 27A and 27B are schematic partial cross-sectional views of a semiconductor memory cell of Example 3.

FIGS. 61A and 61B are schematic partial cross-sectional views of a semiconductor memory cell of Example 7.

DESCRIPTION OF THE PREFERRED EMBODIMENTS

EXAMPLE 1

Example 1 is concerned with the semiconductor memory cell according to the first aspect of the present invention.

Figure 1:
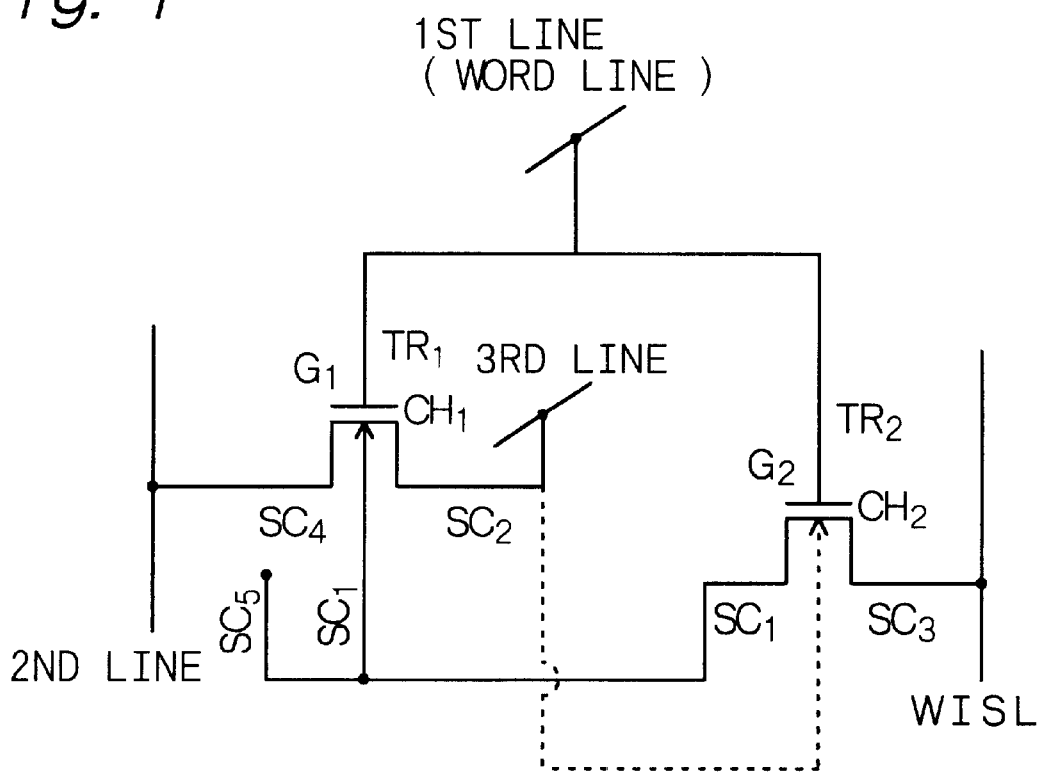
FIG. 1 is a principle-showing view of a semiconductor memory cell according to the first aspect of the present invention.

FIG. 1 is a principle-showing view of the semiconductor memory cell of Example 1, and FIGS. 5A and 5B are schematic partial cross-sectional views thereof. FIG. 5A is a partial cross-sectional view prepared by cutting the semiconductor memory cell with a first imaginary perpendicular plane (shown by a chain line $PL_1$ in FIG. 5B) which is perpendicular to the extending direction of the gate region G and passes through the center of the gate region G. FIG. 5B is a partial cross-sectional view prepared by cutting the semiconductor memory cell including a fifth region $SC_5$ with an imaginary perpendicular plane which is in parallel with a second imaginary perpendicular plane (shown by a chain line $PL_2$ in FIG. 5A) which is in parallel with the extending direction of the gate region G and passes through the center of the gate region G.

The semiconductor memory cell of Example 1 comprises;

(1) a first transistor $TR_1$ for readout, having source/drain regions, a channel forming region $CH_1$ and a gate region G and having a first conductivity type (for example, n channel type), and (2) a second transistor $TR_2$ for switching, having source/drain regions, a channel forming region $CH_2$ and a gate region G and having a second conductivity type (for example, p channel type), and the semiconductor memory cell has;

(a) a semi-conductive first region $SC_1$ having a second conductivity type (for example, $p^+$ type), (b) a semi-conductive second region $SC_2$ which is formed in a surface region of the first region $SC_1$ and has a first conductivity type (for example, $n^+$ type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$ type) or which is conductive and is made of silicide, metal or a metal compound, (d) a semi-conductive fourth region $SC_4$ which is formed in a surface region of the first region $SC_1$ and spaced from the second region $SC_2$ and has the first conductivity type (for example, $n^+$ type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$ type) or which is conductive and is made of silicide, metal or a metal compound, and (f) a gate region G which is formed on an insulation layer so as to bridge the first region $SC_1$ and the third region $SC_3$ and so as to bridge the second region $SC_2$ and the fourth region $SC_4$ and which is shared by the first transistor $TR_1$ and the second transistor $TR_2$.

Concerning the first transistor $TR_1$, (A-1) one source/drain region is formed of a surface region of the second region $SC_2$, (A-2) the other source/drain region is formed of a surface region of the fourth region $SC_4$, and (A-3) the channel forming region $CH_1$ is formed of a surface region of the first region $SC_1$ which surface region is interposed between or sandwiched by said surface region of the second region $SC_2$ and said surface region of the fourth region $SC_4$.

Concerning the second transistor $TR_2$, (B-1) one source/drain region is formed of said surface region of the first region $SC_1$ which surface region forms the channel forming region $CH_1$ of the first transistor $TR_1$, (B-2) the other source/drain region is formed of the third region $SC_3$, and (B-3) the channel forming region $CH_2$ is formed of said surface region of the second region $SC_2$ which surface region forms the one source/drain region of the first transistor $TR_1$.

Further, (C) the gate region G is connected to a first line for memory cell selection (for example, word line), (D) the third region $SC_3$ is connected to a write-in information setting line WISL, (E) the fourth region $SC_4$ is connected to a second line, and (F) the fifth region $SC_5$ is connected to the first region $SC_1$.

When the semiconductor memory cell is cut with the first imaginary perpendicular plane (shown by a chain line $PL_1$ in FIG. 5B) which is perpendicular to the extending direction of the gate region G and passes through the center of the gate region G, the second region $SC_2$ and the fourth region $SC_4$ in the vicinity of the gate region G are nearly symmetrical with respect to the second imaginary perpendicular plane (shown by a chain line $PL_2$ in FIG. 5A) which is in parallel with the extending direction of the gate region G and passes through the center of the gate region G. That is, the surface region of the second region $SC_2$ and the surface region of the fourth region $SC_4$, which are positioned immediately below the gate region G, are nearly symmetrical in position with respect to the second imaginary perpendicular plane $PL_2$. Further, the depth of the second region $SC_2$ (depth measured from a surface of the first region $SC_1$; the term "depth" will be also used in this sense hereinafter) and the depth of the fourth region $SC_4$ are nearly equal to each other. The above symmetry may vary depending upon methods of forming these regions, and the term "nearly symmetrical" is used for including such cases where symmetry varies. Further, the depths of the above regions may vary depending upon methods of forming them, and the term "nearly equal" is used for including such cases where the depths vary. These terms are used in these senses hereinafter.

In the semiconductor memory cell of Example 1, further, the third region $SC_3$ and the fifth region $SC_5$ in the vicinity of the gate region G are nearly symmetrical with respect to the second imaginary perpendicular plane $PL_2$ when the semiconductor memory cell is cut with the first imaginary perpendicular plane $PL_1$. That is, an edge portion of the surface region of the third region $SC_3$ positioned immediately below the gate region G and an edge portion of the surface region of the fifth region $SC_5$ positioned immediately below the gate region G are nearly symmetrical in position with respect to the second imaginary perpendicular plane $PL_2$. Further, the depth of the third region $SC_3$ and the depth of the fifth region $SC_5$ are nearly equal to each other.

In the semiconductor memory cell of Example 1 shown in FIGS. 5A and 5B, the second region $SC_2$ is connected to the third line. It is preferred to employ a constitution in which the second line is used as a bit line and a predetermined potential is applied to the third line, or a constitution in which the third line is used as a bit line and a predetermined potential is applied to the second line.

The semiconductor memory cell (specifically, the first region $SC_1$) is formed in the second conductivity type (for example, p type) well structure formed in, for example, an n type semiconductor substrate. And, when a high-concentration-impurity-containing layer $SC_{10}$ having the first conductivity type (for example, $n^{++}$ type) is formed immediately below the first region $SC_1$, a potential or a charge to be stored in the channel forming region $CH_1$ of the first transistor $TR_1$ for readout can be increased. In Figures, "IR" shows a device isolation region, and "IL" shows an insulation interlayer.

The fifth region $SC_5$ is directly connected to the first region $SC_1$. When the fifth region $SC_5$ and the first region $SC_1$ are so connected, a region where information is to be stored can be increased, and the length of the time period for which the semiconductor memory cell retains information can be increased. The first region $SC_1$ and the fifth region $SC_5$ can be connected to each other by forming a structure in which part of the first region $SC_1$ is extended up to a vicinity of the surface of the semiconductor substrate and the fifth region $SC_5$ and the extending portion of the first region $SC_1$ come in contact with each other outside the fourth region $SC_4$, as shown in FIG. 5B. When the semiconductor memory cell is so structured, the wiring structure of the semiconductor memory cell can be simplified.

FIGS. 6 to 11 show variants of the semiconductor memory cell shown in FIGS. 5A and 5B.

Figure 6:
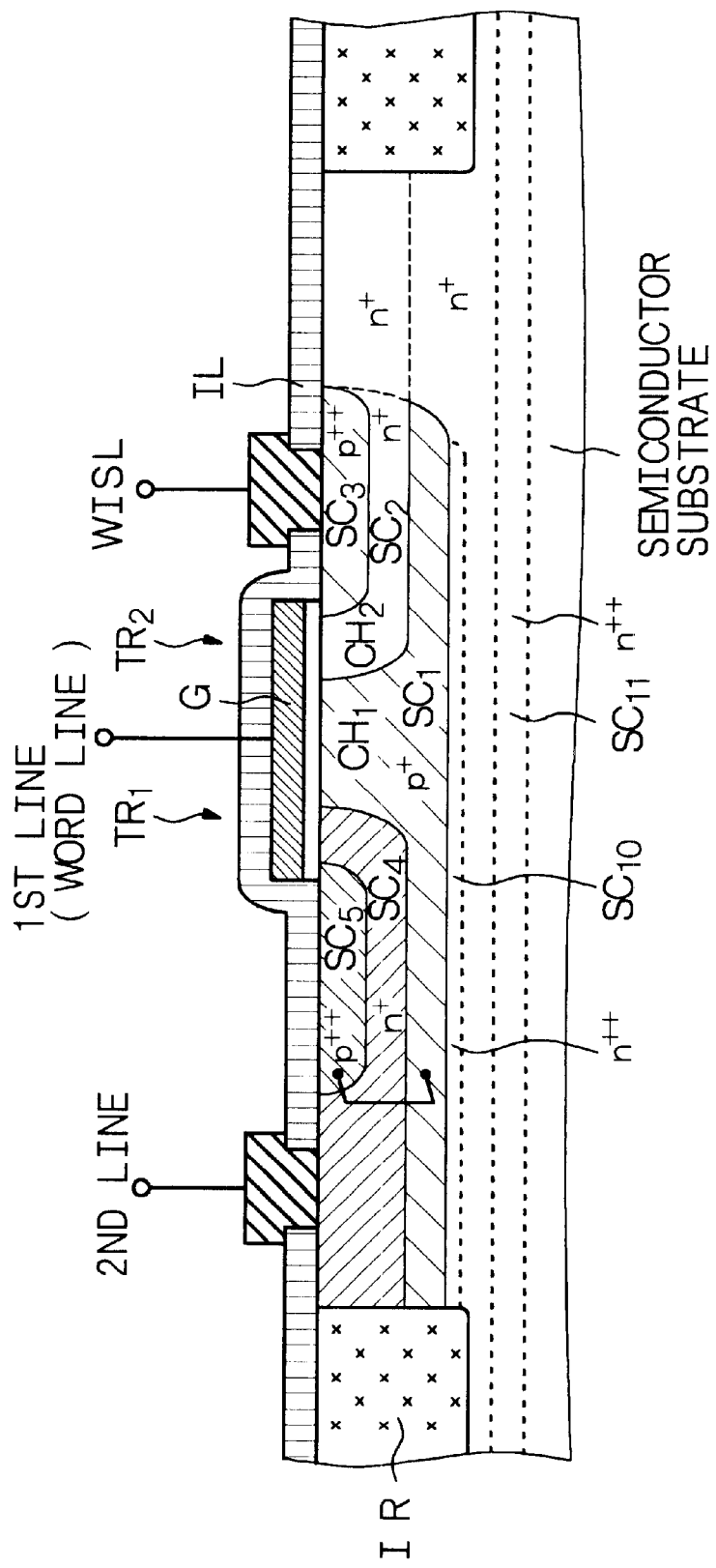
FIG. 6 is a schematic partial cross-sectional view of a variant of the semiconductor memory cell of Example 1.

In the semiconductor memory cell shown in FIG. 6, a high-concentration-impurity-containing layer $SC_{11}$ which has the first conductivity type (for example, $n^{++}$ type) and works as the third line is formed below the first region $SC_1$, and the high-concentration-impurity-containing layer $SC_{11}$ is connected to the second region $SC_2$. This structure serves to simplify the wiring structure.

Figure 7:
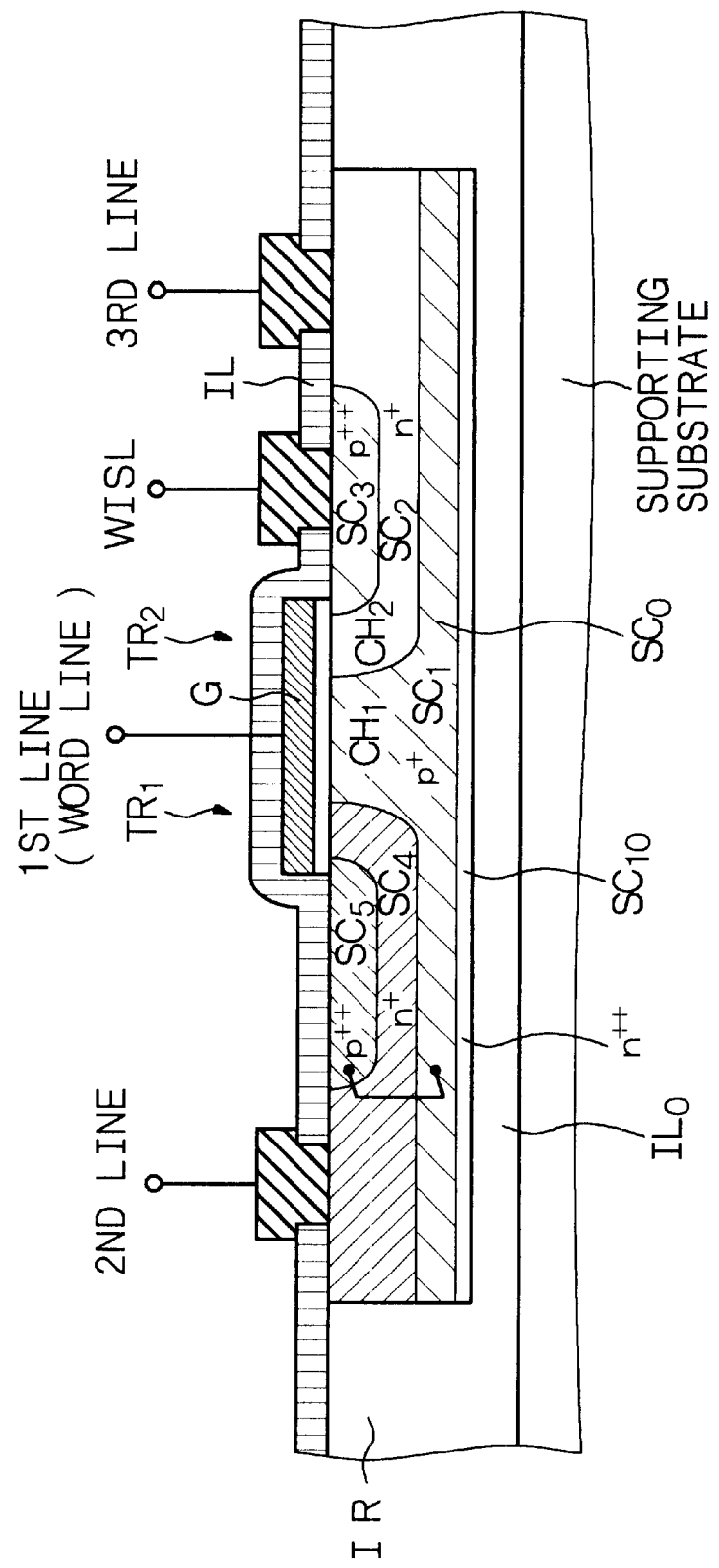
FIG. 7 is a schematic partial cross-sectional view of a variant of the semiconductor memory cell of Example 1.

In the semiconductor memory cell shown in FIG. 7, the semiconductor memory cell structured as shown in FIGS. 5A and 5B is formed in a semiconductor layer $SC_0$ formed on an insulating layer $IL_0$ on a supporting substrate. The so-structured semiconductor memory cell can be fabricated by a so-called substrate bonding method in which an insulator (insulating layer) is formed on the entire surface of a semiconductor substrate, the insulator (insulating layer) and the a supporting substrate are attached to each other and then the semiconductor substrate is ground and polished from its reverse surface. Alternatively, an insulator (insulating layer) according to an SIMOX method is formed by ion-implanting a silicon semiconductor substrate with oxygen and then heat-treating the substrate, and the semiconductor memory cell can be formed in a silicon layer remaining on the insulator (insulating layer). That is, these semiconductor memory cells have a so-called SOI structure. Alternatively, for example, an amorphous silicon layer or a polysilicon layer is formed on an insulator (insulating layer) by a CVD method or the like, then, a silicon layer is formed by a known single-crystallization method such as a zone melting crystallization method using laser beams or electron beams or a lateral solid phase growth method in which crystal growth is carried out thorough an opening formed in an insulator (insulating layer), and the semiconductor memory cell can be formed in the above silicon layer. Alternatively, for example, a polysilicon layer or an amorphous silicon layer is formed on an insulator (insulating layer) formed on a supporting substrate, and then the semiconductor memory cell is formed in the above polysilicon layer or the amorphous silicon layer. Such a semiconductor memory cell has a so-called TFT structure.

Figure 2A:
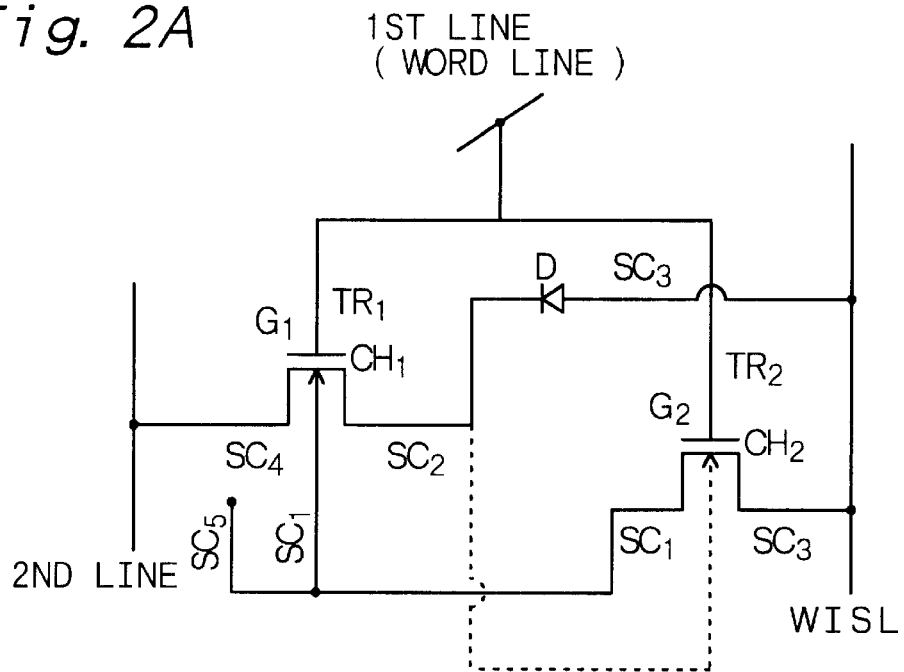
FIGS. 2A and 2B are principle-showing views of variants of the semiconducter memory cell according to the first aspect of the present invention.
Figure 8:
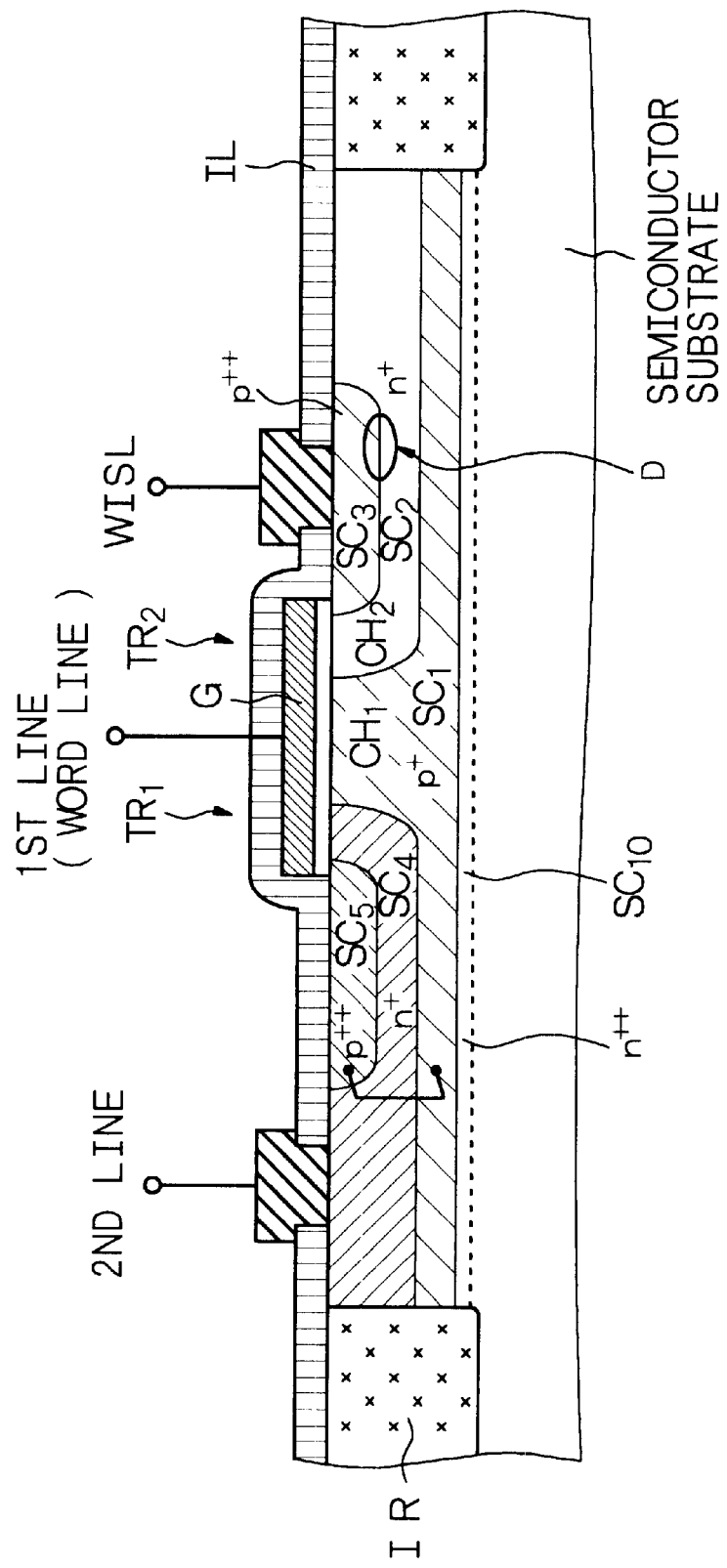
FIG. 8 is a schematic partial cross-sectional view of a variant of the semiconductor memory cell of Example 1.

In the semiconductor memory cell shown in the schematic partial cross-sectional view of FIG. 8 and the principle-showing view of FIG. 2A, one source/drain region (second region $SC_2$) of the first transistor $TR_1$ is connected to the write-in information setting line WISL through a pn junction diode D in place of being connected to the third line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line.

Figure 2B:
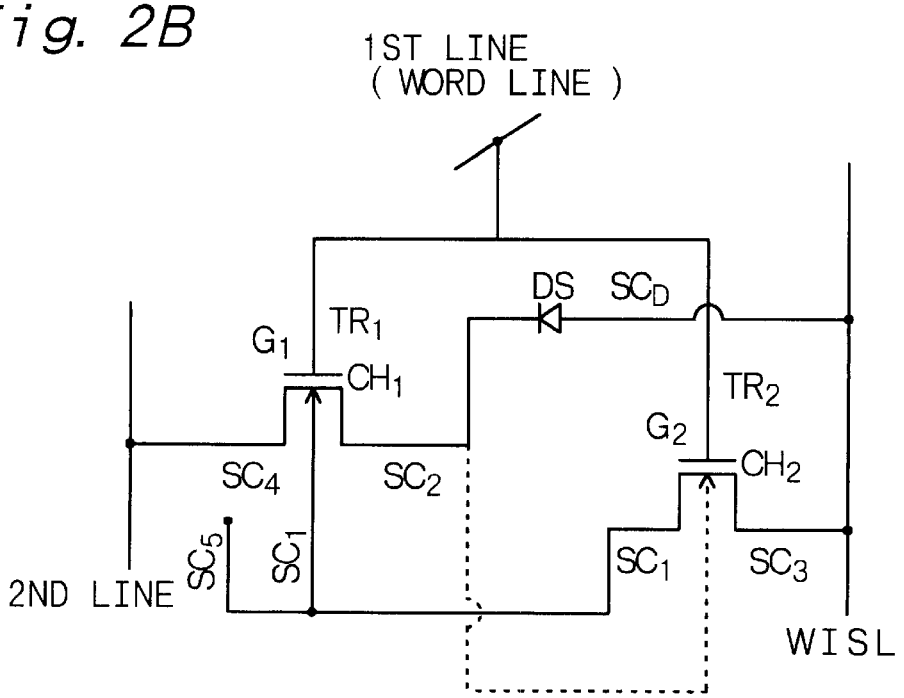
Figure 9:
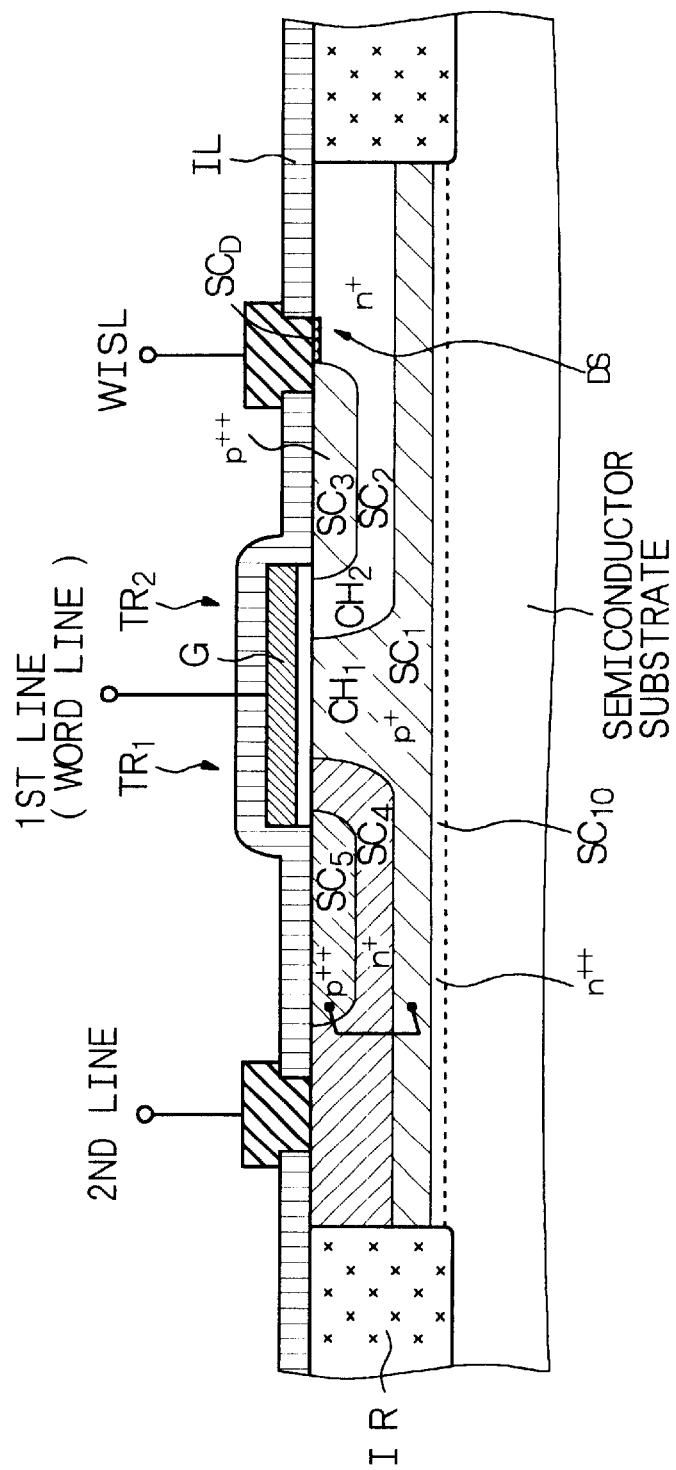
FIG. 9 is a schematic partial cross-sectional view of a variant of the semiconductor memory cell of Example 1.

A semiconductor memory cell shown in the schematic partial cross-sectional view of FIG. 9 (see FIG. 2B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the third line. That is, one source/drain region of the first transistor $TR_1$ is connected to the write-in information setting line WISL through the majority carrier diode DS. In the semiconductor memory cell shown in FIG. 9, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line.

Figure 10:
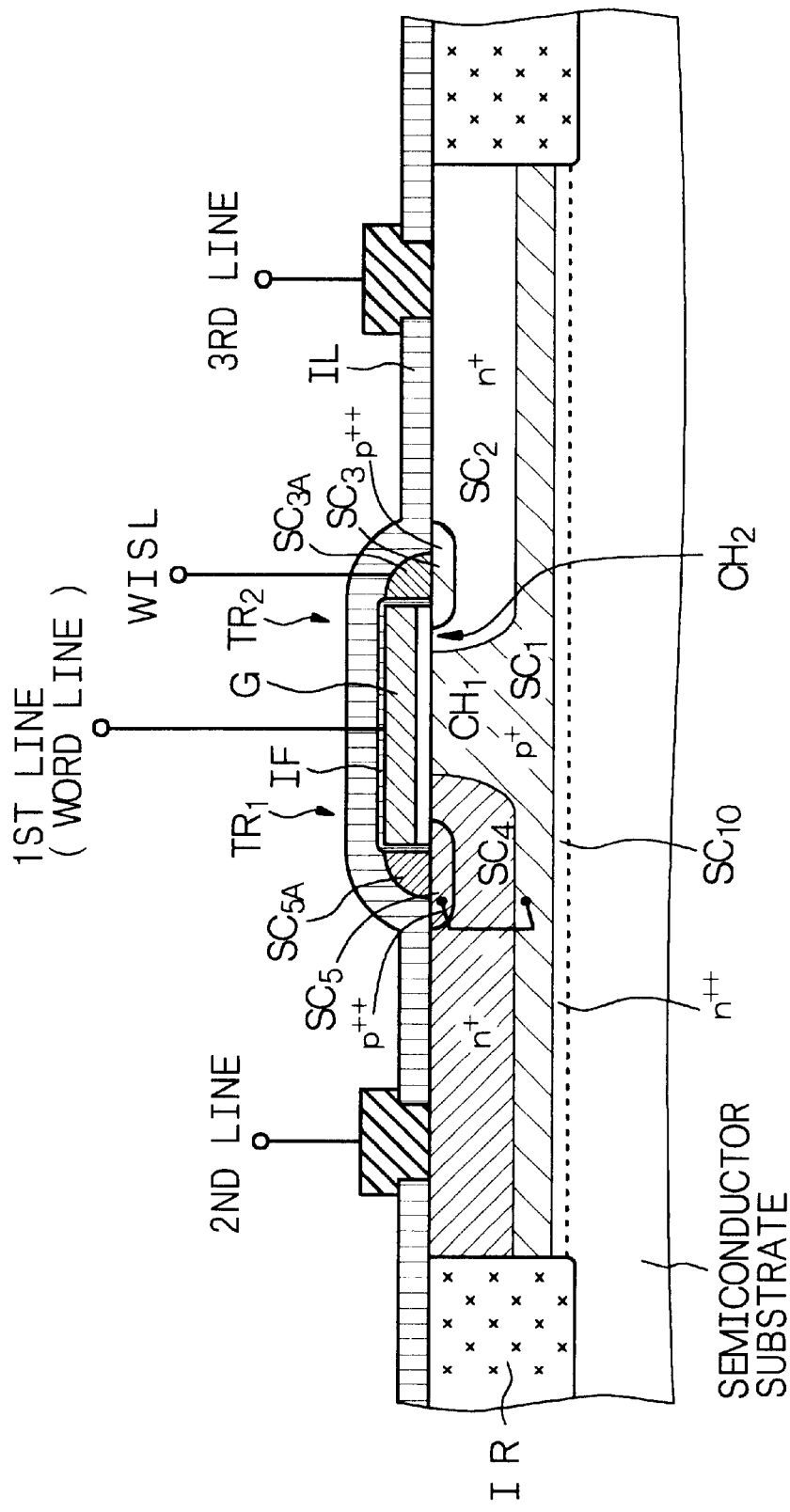
FIG. 10 is a schematic partial cross-sectional view of a variant of the semiconductor memory cell of Example 1.

A semiconductor memory cell shown in the schematic partial cross-sectional view of FIG. 10 is obtained by constitutionally modifying the third region $SC_3$ and the fifth region $SC_5$ of the semiconductor memory cell shown in the schematic partial cross-sectional view of FIGS. 5A and 5B. That is, an impurity-containing layer $SC_{3A}$ having the second conductivity type (for example, $p^{++}$ type) is formed on the third region $SC_3$. The third region $SC_3$ is connected to the write-in information setting line WISL through the impurity-containing layer $SC_{3A}$. The third region $SC_3$ is formed in a self-alignment manner by solid phase diffusion of a p-type impurity from the impurity-containing layer $SC_{3A}$, and it has a shallow pn junction. Further, the impurity-containing layer $SC_{3A}$ is positioned on one side of the gate region G through an insulation material layer IF and has the form of a side-wall. There may be employed a constitution in which the impurity-containing layer $SC_{3A}$ works as the write-in information setting line WISL as well. That is, the impurity-containing layer $SC_{3A}$ extends in the direction perpendicular to a paper surface of the drawing, and an extending portion of the impurity-containing layer $SC_{3A}$ is an impurity-containing layer $SC_{3A}$ of an adjacent semiconductor memory cell and works as the write-in information setting line WISL. This structure serves to simplify a wiring structure and to attain the formation of a finer-structure of the semiconductor memory cell. The above form of a side-wall refers to a form which is obtained by depositing a layer for forming an impurity-containing layer on the entire surface, for example, of a semiconductor substrate on which the gate region G has been formed, and then etching back the above layer to leave part of the layer (i.e., impurity-containing layer) on a side surface of the gate region G. The form of a side-wall of an impurity-containing layer in each semiconductor memory cell to be explained hereinafter has the same meaning. The form of cross section of the impurity-containing layer obtained by cutting the impurity-containing layer with a plane perpendicular to the extending direction of the gate region G includes a form obtained by dividing a circle into four equal portions, a form obtained by dividing an ellipse into four equal portions and a form obtained by combining such a form with a segment. Further, the impurity-containing layer can be made from silicon, amorphous silicon or polysilicon containing, or doped with, an impurity having the first conductivity type or the second conductivity type or silicon-germanium (Si—Ge).

Figure 11:
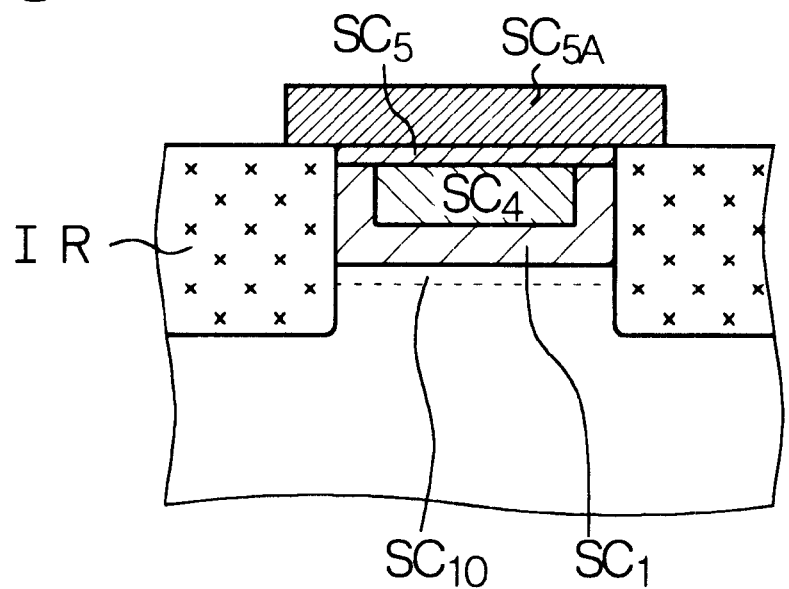
FIG. 11 is a schematic partial cross-sectional view of the variant shown in FIG. 10, prepared by cutting the same through other plane.

An impurity-containing layer $SC_{5A}$ having the second conductivity type (for example, $p^{++}$ type) is formed on the fifth region $SC_5$. The fifth region $SC_5$ is formed in a self-alignment manner by solid phase diffusion of a p-type impurity from the impurity-containing layer $SC_{5A}$, and it has a shallow p junction. Further, the impurity-containing layer $SC_{5A}$ is positioned on the other side of the gate region G through the insulation material layer IF, and has the form of a side-wall. FIG. 11 shows a schematic partial cross-sectional view of the semiconductor memory cell including the fifth region $SC_5$ when the semiconductor memory cell including the fifth region $SC_5$ is cut with an imaginary perpendicular plane in parallel with the second imaginary perpendicular plane $PL_2$ which is in parallel with the extending direction of the gate region G and passes through the gate region G.

The third region $SC_3$ and the fifth region $SC_5$ of each of the semiconductor memory cells shown in FIGS. 6 to 9 may be replaced with a constitution of the impurity-containing layers $SC_{3A}$ and $SC5_A$, the third region $SC_3$ and the fifth region $SC_5$ of the semiconductor memory cell shown in FIG. 10.

EXAMPLE 2

Figure 3:
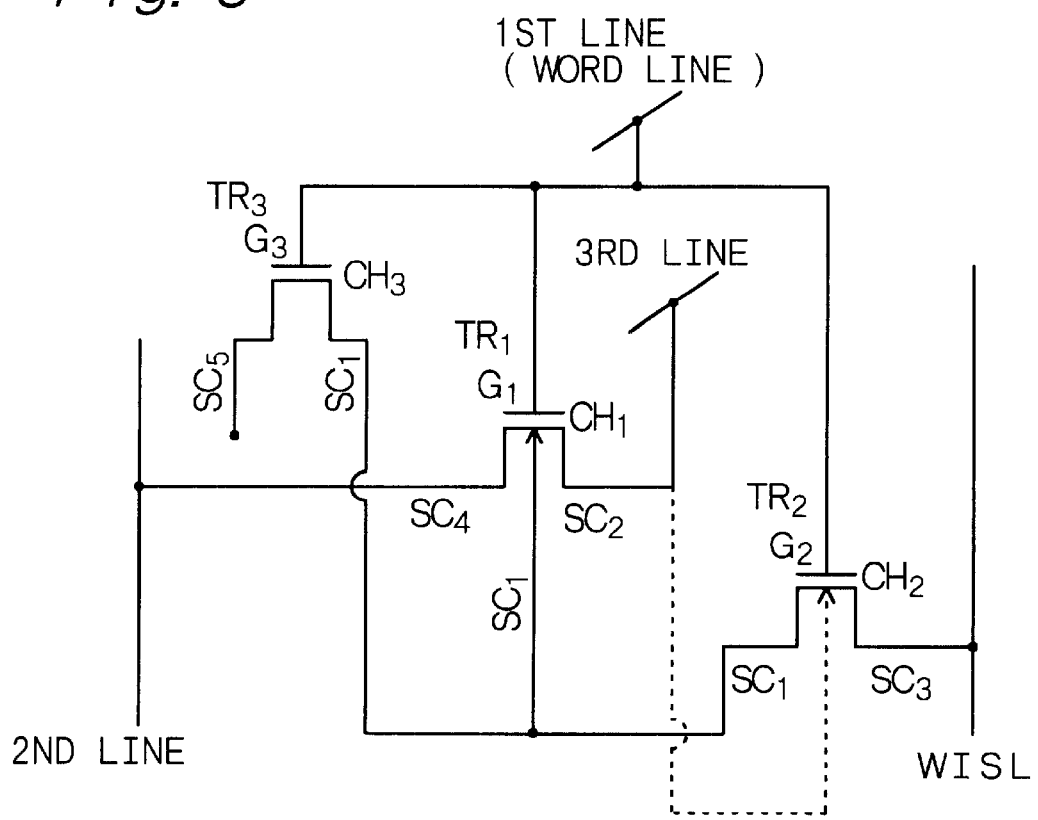
FIG. 3 is a principle-showing view of a semiconductor memory cell according to the second aspect of the present invention.

Example 2 is concerned with the semiconductor memory cell according to the second aspect of the present invention. FIG. 3 shows the principle of the semiconductor memory cell of Example 2, and FIGS. 12A and 12B show schematic partial cross-sectional views thereof. FIG. 12A is a partial cross-sectional view prepared by cutting the semiconductor memory cell with a first imaginary perpendicular plane (shown by a chain line $PL_1$ in FIG. 12B) which is perpendicular to the extending direction of the gate region G and passes through the center of the gate region G. FIG. 12B is a partial cross-sectional view prepared by cutting the semiconductor memory cell including a fifth region $SC_5$ with an imaginary perpendicular plane which is in parallel with a second imaginary perpendicular plane (shown by a chain line $PL_2$ in FIG. 12A) which is in parallel with the extending direction of the gate region G and passes through the center of the gate region G.

The semiconductor memory cell of Example 2 has a third transistor for current control, and in this point, the semiconductor memory cell of Example 3 differs from the semiconductor memory cell of Example 1. That is, the semiconductor memory cell of Example 2 comprises;

(1) a first transistor $TR_1$ for readout, having source/drain regions, a channel forming region $CH_1$ and a gate region G and having a first conductivity type (for example, n channel type), (2) a second transistor $TR_2$ for switching, having source/drain regions, a channel forming region $CH_2$ and a gate region G and having a second conductivity type (for example, p channel type), and (3) a third transistor $TR_3$ for current control, having source/drain regions, a channel forming region $CH_3$ and a gate region G and having the second conductivity type (for example, p channel type), and the semiconductor memory cell has;

(a) a semi-conductive first region $SC_1$ having a second conductivity type (for example, $p^+$ type), (b) a semi-conductive second region $SC_2$ which is formed in a surface region of the first region $SC_1$ and has a first conductivity type (for example, $n^+$ type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$ type) or which is conductive and is made of silicide, metal or a metal compound, (d) a semi-conductive fourth region $SC_4$ which is formed in a surface region of the first region $SC_1$ and spaced from the second region $SC_2$ and has the first conductivity type (for example, $n^+$ type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$ type) or which is conductive and is made of silicide, metal or a metal compound, and (f) a gate region G which is formed on an insulation layer so as to bridge the first region $SC_1$ and the third region $SC_3$, so as to bridge the second region $SC_2$ and the fourth region $SC_4$ and so as to bridge the first region $SC_1$ and the fifth region $SC_5$ and which is shared by the first transistor $TR_1$, the second transistor $TR_2$ and the third transistor $TR_3$.

Concerning the first transistor $TR_1$, (A-1) one source/drain region is formed of a surface region of the second region $SC_2$, (A-2) the other source/drain region is formed of a surface region of the fourth region $SC_4$, and (A-3) the channel forming region $CH_1$ is formed of a surface region of the first region $SC_1$ which surface region is interposed between or sandwiched by said surface region of the second region $SC_2$ and said surface region of the fourth region $SC_4$.

Concerning the second transistor $TR_2$, (B-1) one source/drain region is formed of said surface region of the first region $SC_1$ which surface region forms the channel forming region $CH_1$ of the first transistor $TR_1$, (B-2) the other source/drain region is formed of the third region $SC_3$, and (B-3) the channel forming region $CH_2$ is formed of said surface region of the second region $SC_2$ which surface region forms the one source/drain region of the first transistor $TR_1$.

Concerning the third transistor $TR_3$, (C-1) one source/drain region is formed of said surface region of the first region $SC_1$, (C-2) the other source/drain region is formed of the fifth region $SC_5$, and (C-3) the channel forming region $CH_3$ is formed of said surface region of the fourth region $SC_4$.

Further, (D) the gate region G is connected to a first line for memory cell selection (for example, word line), (E) the third region $SC_3$ is connected to a write-in information setting line WISL, and (F) the fourth region $SC_4$ is connected to a second line.

When the semiconductor memory cell is cut with a first imaginary perpendicular plane (shown by a chain line $PL_1$ in FIG. 12B) which is perpendicular to the extending direction of the gate region G and passes through the center of the gate region G, the second region $SC_2$ and the fourth region $SC_4$ in the vicinity of the gate region G are nearly symmetrical with respect to a second imaginary perpendicular plane (shown by a chain line $PL_2$ in FIG. 12A) which is in parallel with the extending direction of the gate region G and passes through the center of the gate region G. That is, the surface region of the second region $SC_2$ and the surface region of the fourth region $SC_4$, which are positioned immediately below the gate region G, are nearly symmetrical in position with respect to the second imaginary perpendicular plane $PL_2$. Further, the depth of the second region $SC_2$ and the depth of the fourth region $SC_4$ are nearly equal to each other.

In the semiconductor memory cell of Example 2, further, the third region $SC_3$ and the fifth region $SC_5$ in the vicinity of the gate region G are nearly symmetrical with respect to the second imaginary perpendicular plane $PL_2$ when the semiconductor memory cell is cut with the first imaginary perpendicular plane $PL_1$. That is, an edge portion of the surface region of the third region $SC_3$ positioned immediately below the gate region G and an edge portion of the surface region of the fifth region $SC_5$ positioned immediately below the gate region G are nearly symmetrical in position with respect to the second imaginary perpendicular plane $PL_2$. Further, the depth of the third region $SC_3$ and the depth of the fifth region $SC_5$ are nearly equal to each other.

In the semiconductor memory cell of Example 2, preferably, an impurity-containing layer $SC_{4A}$ having the second conductivity type (for example, $p^{++}$ type) is formed in a surface region of the fourth region $SC_4$ which surface region forms the channel forming region $CH_3$ of the third transistor $TR_3$. In this case, when information is retained, and when, for example, the potential of the first line is set at 0 volt, the third transistor $TR_3$ is brought into an ON-state, and the fifth region $SC_5$ and the first region $SC_1$ are brought into a conduction state. The fifth region $SC_5$ and the first region $SC_1$ are connected to each other through the third transistor $TR_3$ as described above, whereby a region where information is to be stored can be increased, and the length of the time period for which the semiconductor memory cell retains information can be increased. It is preferred to adjust the impurity content of the impurity-containing layer $SC_{4A}$ such that the third transistor $TR_3$ is brought into an OFF-state by a potential applied to the first line when information is read out.

In the semiconductor memory cell of Example 2 shown in FIGS. 12A and 12B, the second region $SC_2$ is connected to a third line. It is preferred to employ a constitution in which the second line is used as a bit line and a predetermined potential is applied to the third line, or a constitution in which the third line is used as a bit line and a predetermined potential is applied to the second line.

The semiconductor memory cell (specifically, the first region $SC_1$) is formed in the second conductivity type (for example, p type) well structure formed in, for example, an n type semiconductor substrate. And, when a high-concentration-impurity-containing layer $SC_{10}$ having the first conductivity type (for example, $n^{++}$ type) is formed immediately below the first region $SC_1$, a potential or a charge to be stored in the channel forming region $CH_1$ of the first transistor $TR_1$ for readout can be increased.

FIGS. 13 to 16 show variants of the semiconductor memory cell shown in FIGS. 12A and 12B.

Figure 13:
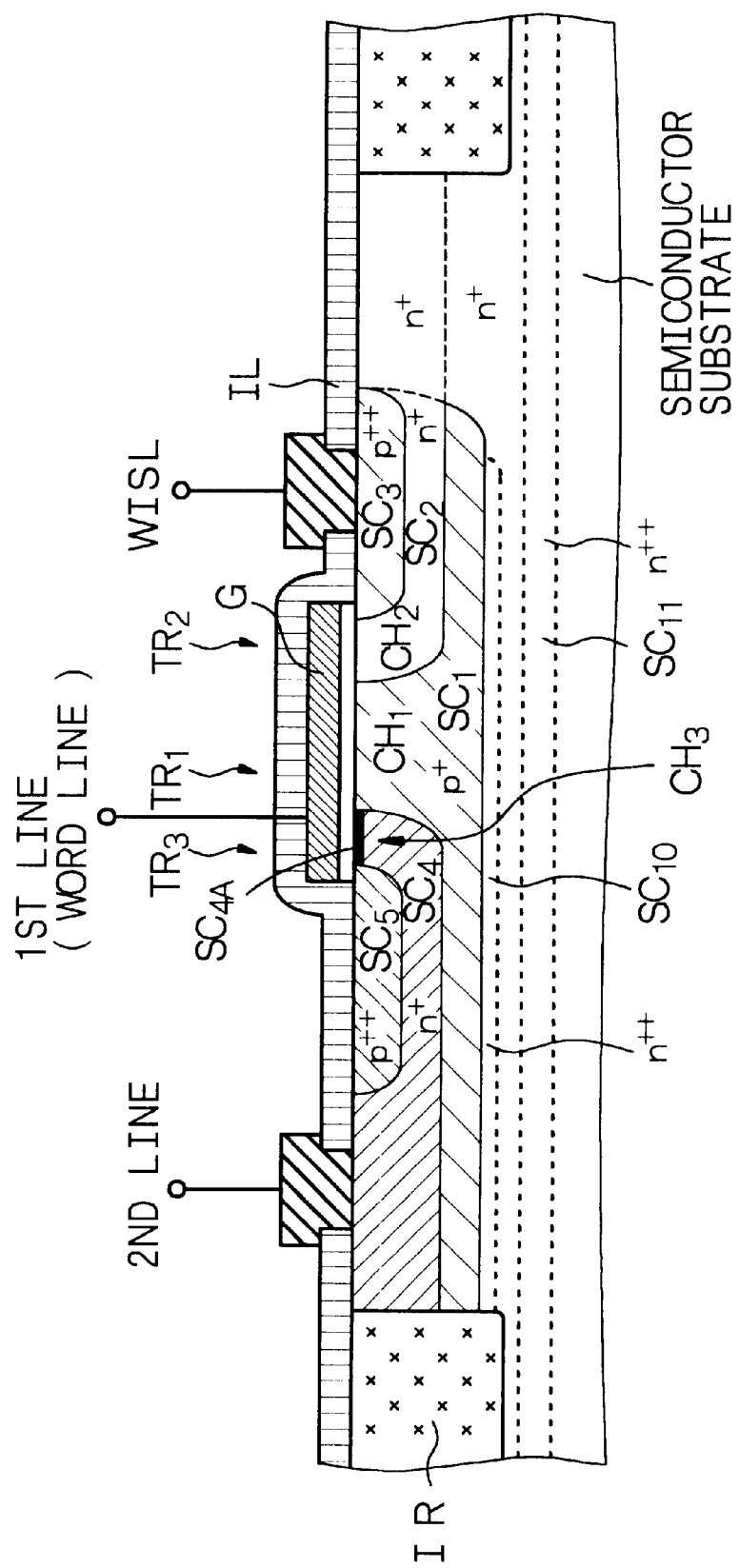
FIG. 13 is a schematic partial cross-sectional view of a variant of the semiconductor memory cell of Example 2.

In a semiconductor memory cell shown in FIG. 13, a high-concentration-impurity-containing layer $SC_{11}$ which has the first conductivity type (for example, $n^{++}$ type) and works as the third line is formed below the first region $SC_1$, and the high-concentration-impurity-containing layer $SC_{11}$ is connected to the second region $SC_2$. This structure serves to simplify the wiring structure.

Figure 4A:
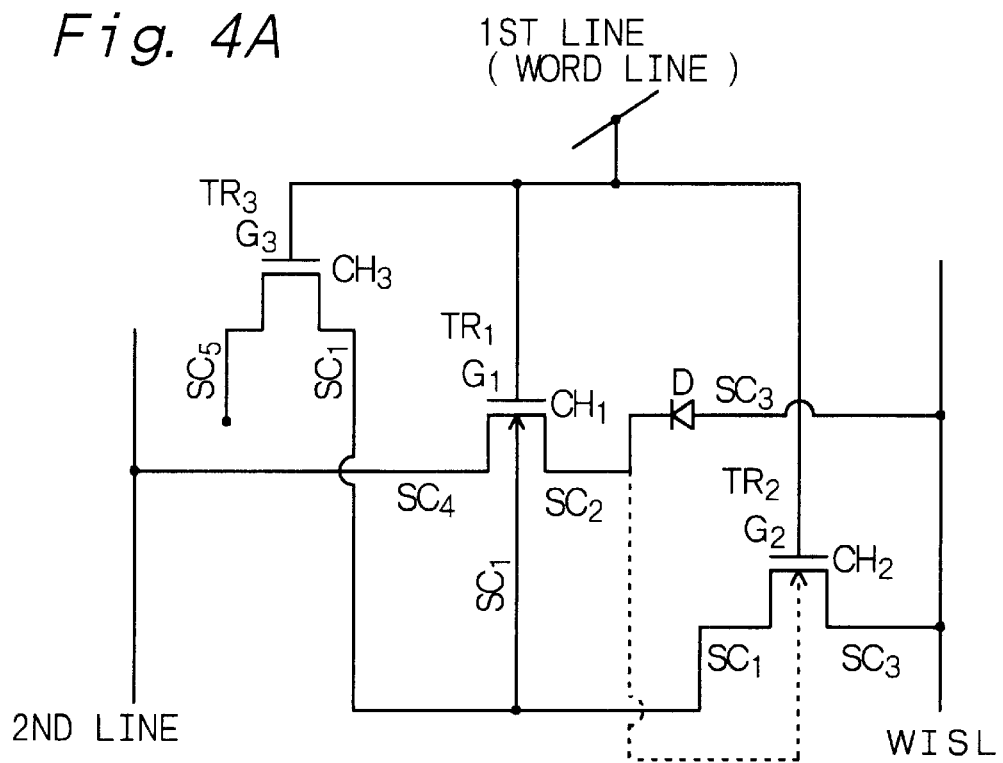
FIGS. 4A and 4B are principle-showing views of variants of the semiconductor memory cell according to the second aspect of the present invention.
Figure 14:
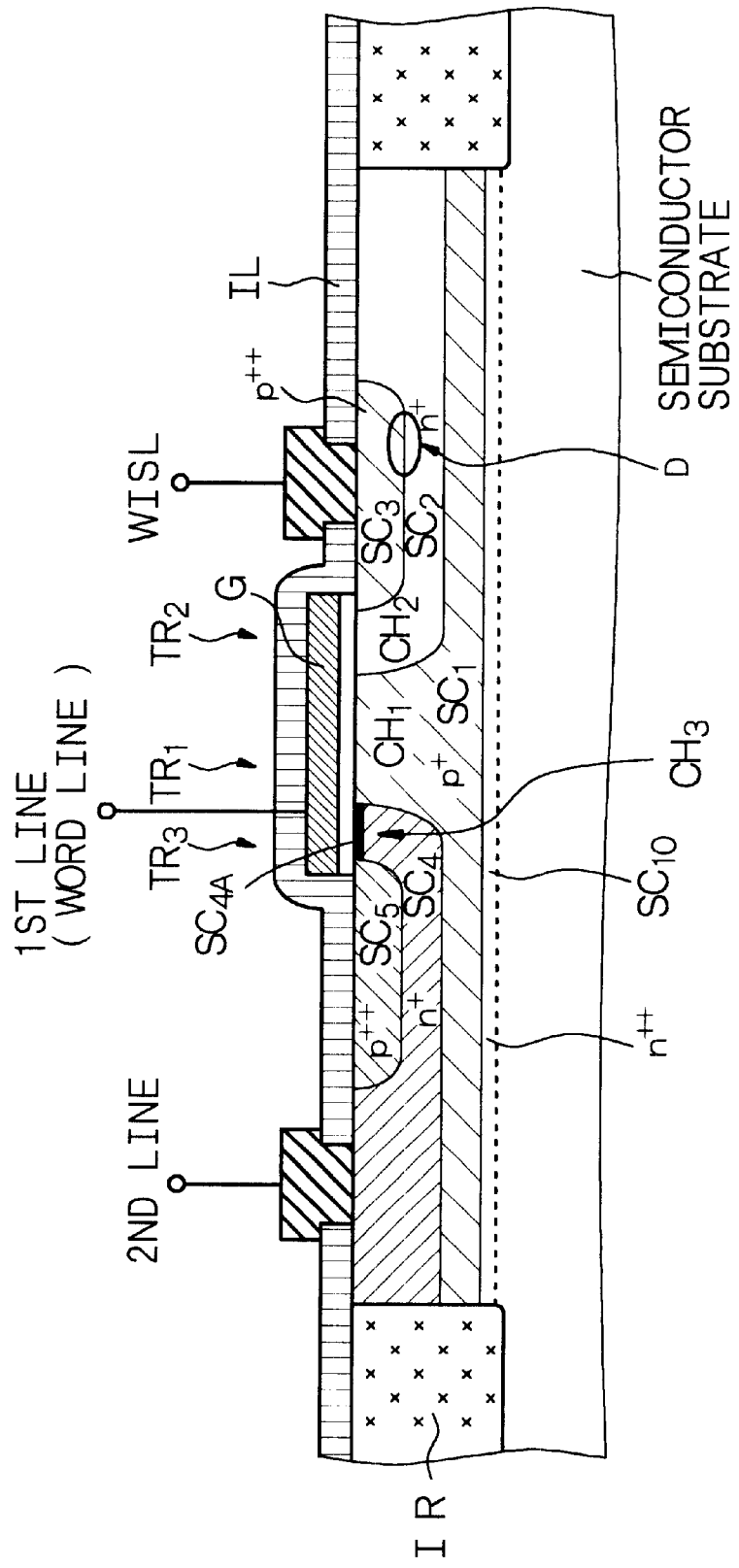
FIG. 14 is a schematic partial cross-sectional view of a variant of the semiconductor memory cell of Example 2.

In a semiconductor memory cell shown in the schematic partial cross-sectional view of FIG. 14 and the principle-showing view of FIG. 4A, one source/drain region (second region $SC_2$) of the first transistor $TR_1$ is connected to the write-in information setting line WISL through a pn junction diode D in place of being connected to the third line. That is, the pn junction diode D is formed between or formed of the second region $SC_2$ and the third region $SC_3$, and the second region $Sc_2$ is connected to the write-in information setting line WISL through the third region $SC_3$. The pn junction diode D can be formed between or formed of the second region $Sc_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line.

Figure 4B:
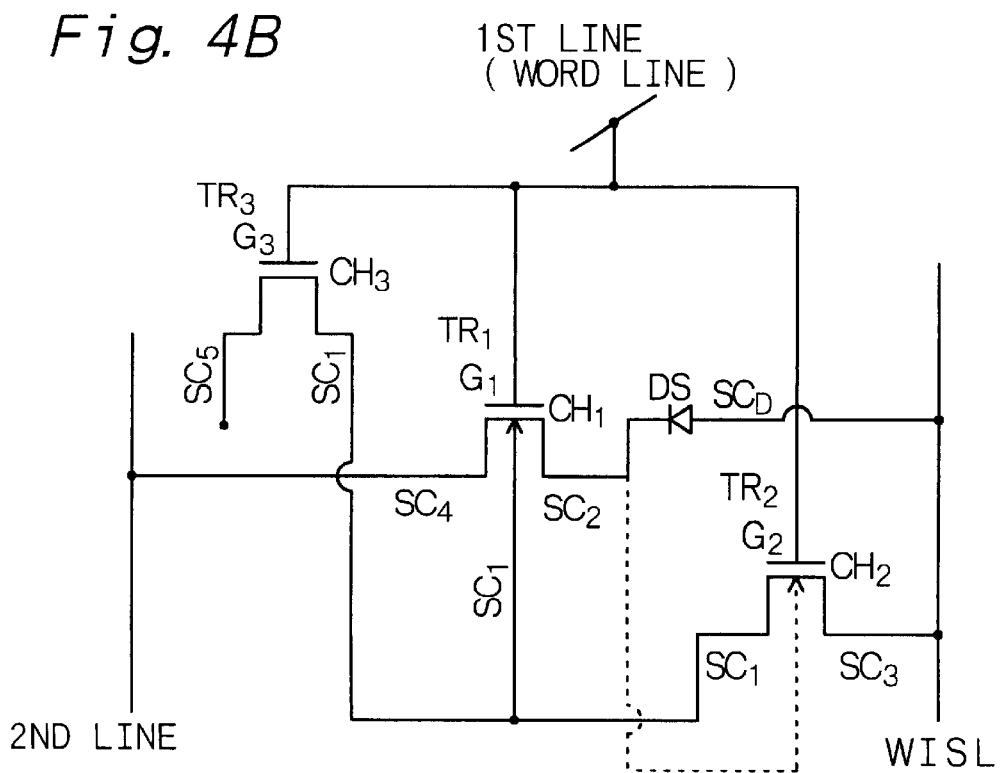
Figure 15:
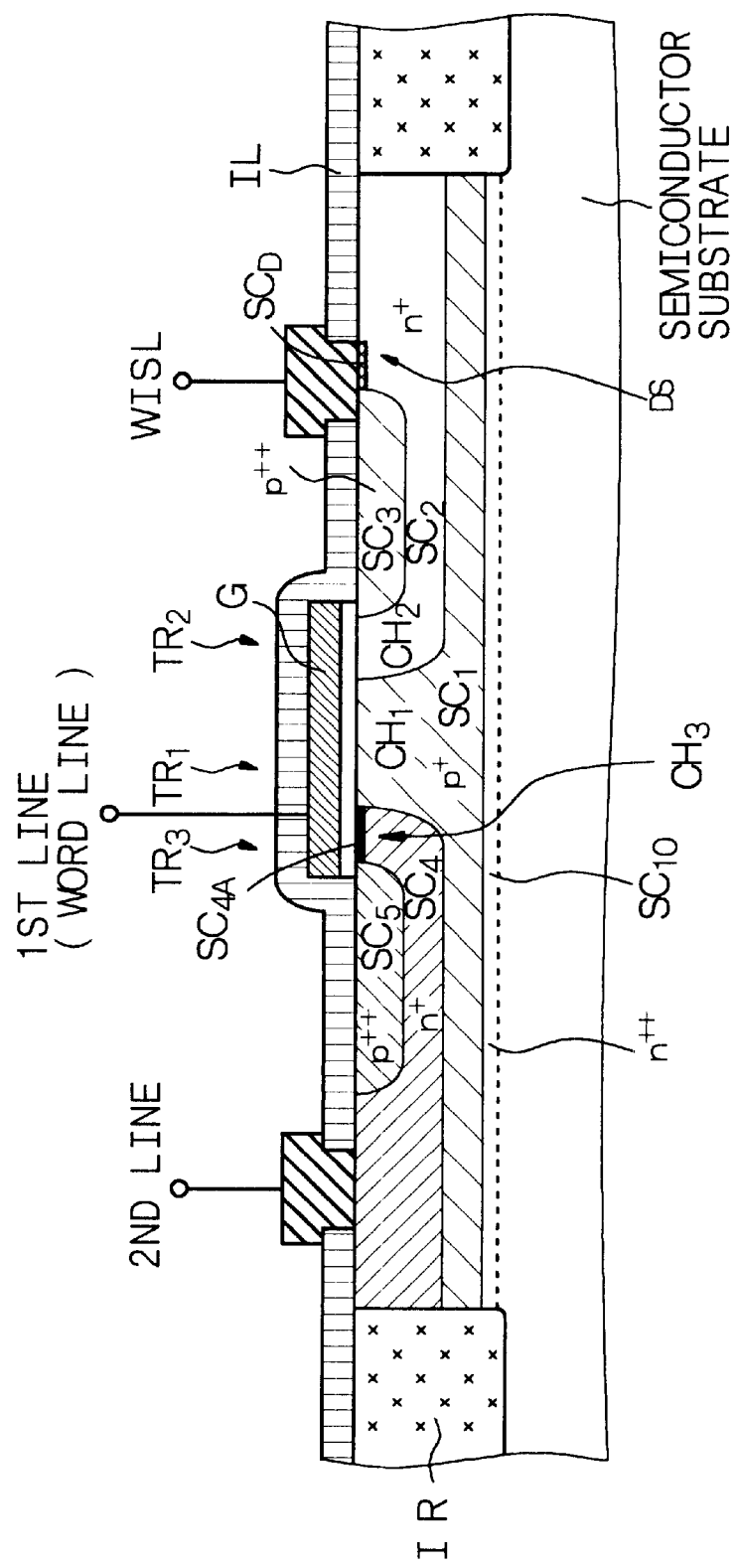
FIG. 15 is a schematic partial cross-sectional view of a variant of the semiconductor memory cell of Example 2.

A semiconductor memory cell shown in the schematic partial cross-sectional view of FIG. 15 (see FIG. 4B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the third line. That is, one source/drain region of the first transistor $TR_1$ is connected to the write-in information setting line WISL through the majority carrier diode DS. In the semiconductor memory cell shown in FIG. 15, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line.

Figure 16:
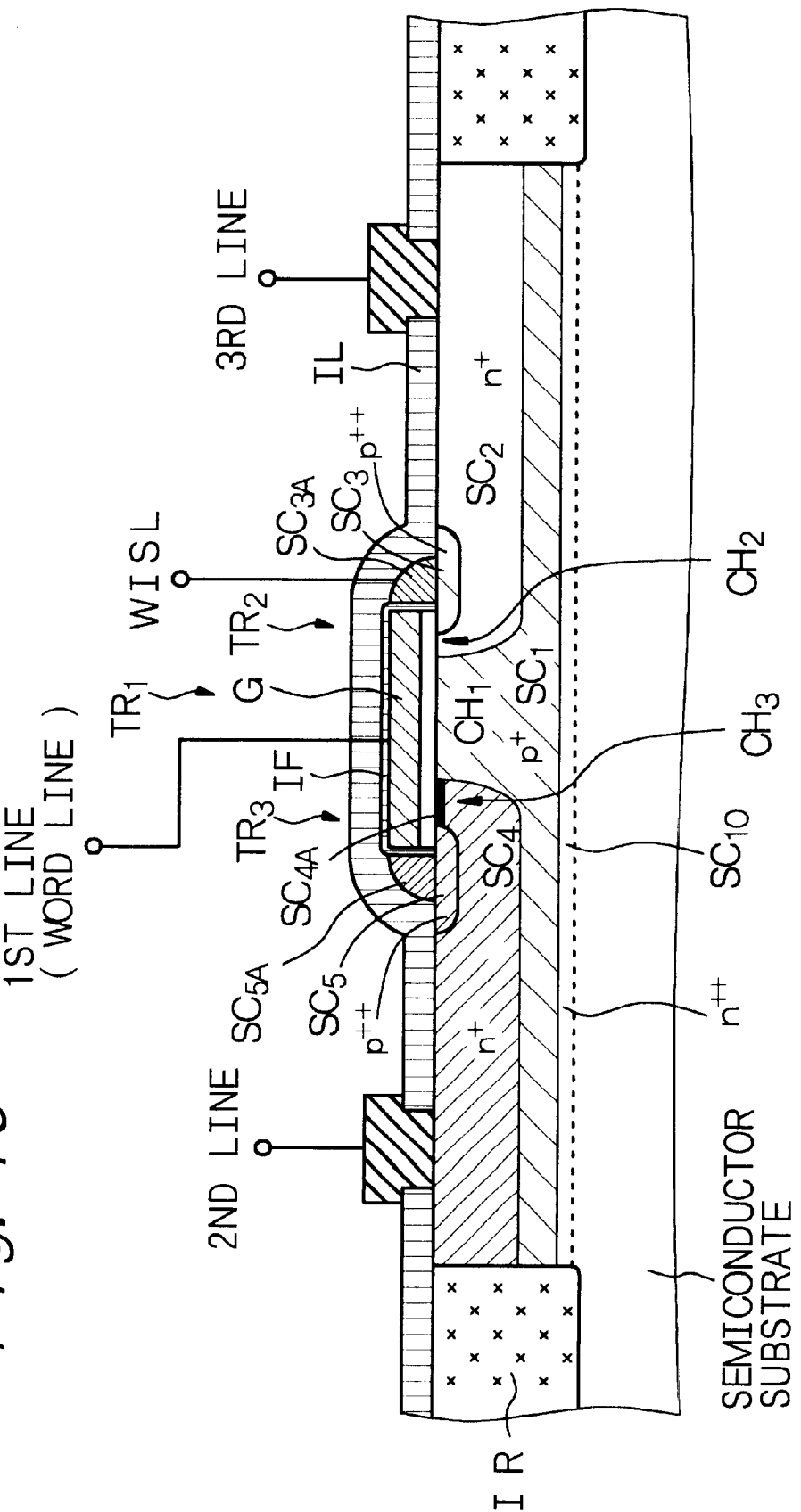
FIG. 16 is a schematic partial cross-sectional view of a variant of the semiconductor memory cell of Example 2.

A semiconductor memory cell shown in the schematic partial cross-sectional view of FIG. 16 is obtained by constitutionally modifying the third region $SC_3$ and the fifth region $SC_5$ of the semiconductor memory cell shown in the schematic partial cross-sectional view of FIGS. 12A and 12B. That is, an impurity-containing layer $SC_{3A}$ having a second conductivity type (for example, $p^{++}$ type) is formed on the third region $SC_3$. The third region $SC_3$ is connected to the write-in information setting line WISL through the impurity-containing layer $SC_{3A}$. The third region $SC_3$ is formed in a self-alignment manner by solid phase diffusion of a p-type impurity from the impurity-containing layer $SC_{3A}$, and it has a shallow pn junction. Further, the impurity-containing layer $SC_{3A}$ is positioned on one side of the gate region G through an insulation material layer IF and has the form of a side-wall. There may be employed a constitution in which the impurity-containing layer $SC_{3A}$ works as the write-in information setting line WISL as well. That is, the impurity-containing layer $SC_{3A}$ extends in the direction perpendicular to a paper surface of the drawing, and an extending portion of the impurity-containing layer $SC_{3A}$ is an impurity-containing layer $SC_{3A}$ of an adjacent semiconductor memory cell and works as the write-in information setting line WISL. This structure serves to simplify a wiring structure and to attain the formation of a finer-structure of the semiconductor memory cell.

An impurity-containing layer $SC_{5A}$ having the second conductivity type (for example, $p^{++}$ type) is formed on the fifth region $SC_5$. The fifth region $SC_5$ is formed in a self-alignment manner by solid phase diffusion of a p-type impurity from the impurity-containing layer $SC_{5A}$, and it has a shallow p junction. Further, the impurity-containing layer $SC_{5A}$ is positioned on the other side of the gate region G through the insulation material layer IF, and has the form of a side-wall.

The third region $SC_3$ and the fifth region $SC_5$ of each of the semiconductor memory cells shown in FIGS. 12 to 15 may be replaced with a constitution of the impurity-containing layers $SC_{3A}$ and $SC5_A$, the third region $SC_3$ and the fifth region $SC_5$ of the semiconductor memory cell shown in FIG. 16.

EXAMPLE 3

Figure 17:
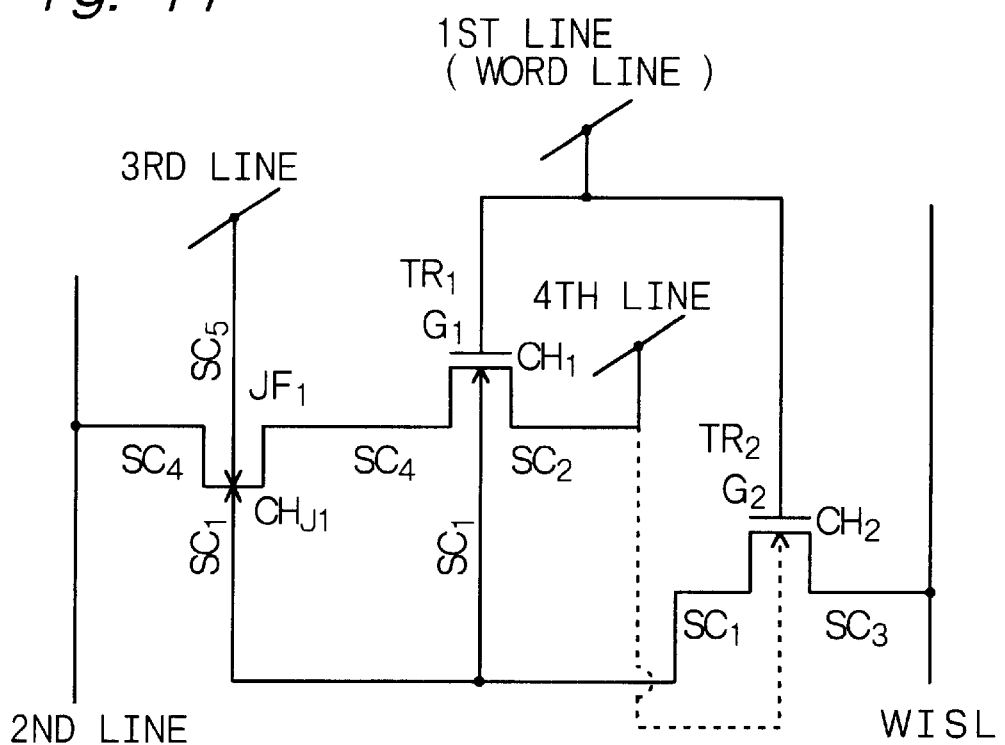
FIG. 17 is a principle-showing view of a semiconductor memory cell according to the third aspect of the present invention.

Example 3 is concerned with the semiconductor memory cell according to the third aspect of the present invention. FIG. 17 shows the principle of the semiconductor memory cell of Example 3, and FIGS. 27A and 27B show schematic partial cross-sectional views thereof. FIG. 27A is a partial cross-sectional view prepared by cutting the semiconductor memory cell with a first imaginary perpendicular plane (shown by a chain line $PL_1$ in FIG. 27B) which is perpendicular to the extending direction of the gate region G and passes through the center of the gate region G. FIG. 27B is a partial cross-sectional view prepared by cutting the semiconductor memory cell including a fifth region $SC_5$ with an imaginary perpendicular plane in parallel with a second imaginary perpendicular plane (shown by a chain line $PL_2$ in FIG. 27A) which is in parallel with the extending direction of the gate region G and passes through the center of the gate region G.

The semiconductor memory cell of Example 3 comprises;
(1) a first transistor $TR_1$ for readout, having source/drain regions, a channel forming region $CH_1$ and a gate region G and having a first conductivity type (for example, n channel type),
(2) a second transistor $TR_2$ for switching, having source/drain regions, a channel forming region $CH_2$ and a gate region G and having a second conductivity type (for example, p channel type), and
(3) a junction-field-effect transistor $JF_1$ having source/drain regions, a channel region $CH_{J1}$ and gate portions, and the semiconductor memory cell has;
 (a) a semi-conductive first region $SC_1$ having a second conductivity type (for example, $p^+$ type),
 (b) a semi-conductive second region $SC_2$ which is formed in a surface region of the first region $SC_1$ and has a first conductivity type (for example, $n^+$ type),
 (c) a third region $SC_3$ which is formed in a surface region of the second region $SC_2$ and is in contact with the second region $SC_2$ so as to form a rectifier junction together with the second region $SC_2$, the third region $Sc_3$ being a region which is semi-conductive and has the second conductivity type (for example, $p^{++}$ type) or which is conductive and is made of silicide, metal or a metal compound, (d) a semi-conductive fourth region $SC_4$ which is formed in a surface region of the first region $SC_1$ and spaced from the second region $SC_2$ and which has the first conductivity type (for example, $n^+$ type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$ type) or which is conductive and is made of silicide, metal or a metal compound, and (f) a gate region G which is formed on an insulation layer so as to bridge the first region $SC_1$ and the third region $SC_3$ and so as to bridge the second region $SC_2$ and the fourth region $SC_4$ and which is shared by the first transistor $TR_1$ and the second transistor $TR_2$.

Concerning the first transistor $TR_1$, (A-1) one source/drain region is formed of a surface region of the second region $SC_2$, (A-2) the other source/drain region is formed of a surface region of the fourth region $SC_4$, and (A-3) the channel forming region $CH_1$ is formed of a surface region of the first region $SC_1$ which surface region is interposed between or sandwiched by said surface region of the second region $SC_2$ and said surface region of the fourth region $SC_4$.

Concerning the second transistor $TR_2$, (B-1) one source/drain region is formed of said surface region of the first region $SC_1$ which surface region forms the channel forming region $CH_1$ of the first transistor $TR_1$, (B-2) the other source/drain region is formed of the third region $SC_3$, and (B-3) the channel forming region $CH_2$ is formed of said surface region of the second region $SC_2$ which surface region forms the one source/drain region of the first transistor $TR_1$.

Concerning the junction-field-effect transistor $JF_1$, further, (C-1) the gate portions are formed of the fifth region $SC_5$ and a portion of the first region $SC_1$ which portion is opposed to the fifth region $SC_5$, (C-2) the channel region $CH_{J1}$ is formed of a portion of the fourth region $SC_4$ which portion is interposed between or sandwiched by the fifth region $SC_5$ and said portion of the first region $SC_1$, (C-3) one source/drain region is formed of said surface region of the fourth region $SC_4$ which surface region extends from one end of the channel region $CH_{J1}$ of the junction-field-effect transistor $JF_1$ and forms the other source/drain region of the first transistor $TR_1$, and (C-4) the other source/drain region is formed of a portion of the fourth region $SC_4$ which portion extends from the other end of the channel region $CH_{J1}$ of the junction-field-effect transistor $JF_1$.

Further, (D) the gate region G is connected to a first line for memory cell selection (for example, word line), (E) the third region $SC_3$ is connected to a write-in information setting line WISL, (F) the fourth region $SC_4$ is connected to a second line, and (G) the fifth region $SC_5$ is connected to a third line.

When the semiconductor memory cell is cut with a first imaginary perpendicular plane (shown by a chain line $PL_1$ in FIG. 27B) which is perpendicular to the extending direction of the gate region G and passes through the center of the gate region G, the second region $SC_2$ and the fourth region $SC_4$ in the vicinity of the gate region G are nearly symmetrical with respect to a second imaginary perpendicular plane (shown by a chain line $PL_2$ in FIG. 27A) which is in parallel with the extending direction of the gate region G and passes through the center of the gate region G. That is, the surface region of the second region $SC_2$ and the surface region of the fourth region $SC_4$, which are positioned immediately below the gate region G, are nearly symmetrical in position with respect to the second imaginary perpendicular plane $PL_2$. Further, the depth of the second region $SC_2$ and the depth of the fourth region $SC_4$ are nearly equal to each other.

In the semiconductor memory cell of Example 3, further, when the semiconductor memory cell is cut with the first imaginary perpendicular plane $PL_1$, the third region $SC_3$ and the fifth region $SC_5$ in the vicinity of the gate region G are nearly symmetrical with respect to the second imaginary perpendicular plane $PL_2$. That is, an edge portion of the surface region of the third region $SC_3$ positioned immediately below the gate region G and an edge portion of the surface region of the fifth region $SC_5$ positioned immediately below the gate region G are nearly symmetrical in position with respect to the second imaginary perpendicular plane $PL_2$. Further, the depth of the third region $SC_3$ and the depth of the fifth region $SC_5$ are nearly equal to each other.

The junction-field-effect transistor $JF_1$ is formed by (i) optimizing the distance (thickness of the channel region $CH_{J1}$) between the opposing gate portions (the fifth region $SC_5$ and the portion of the first region $SC_1$ which portion is opposed to the fifth region $SC_5$) and (ii) optimizing impurity concentrations of the opposing gate portions (the fifth region $SC_5$ and the portion of the first region $SC_1$ which portion is opposed to the fifth region $SC_5$) and the impurity concentration of the channel region $CH_{J1}$.

In the semiconductor memory cell shown in FIGS. 27A and 27B, the second region $SC_2$ is connected to a fourth line. It is preferred to employ a constitution in which the second line is used as a bit line and a predetermined potential is applied to the fourth line or a constitution in which the fourth line is used as a bit line and a predetermined potential is applied to the second line.

The semiconductor memory cell (specifically, the first region $SC_1$) is formed in the second conductivity type (for example, p type) well structure formed in, for example, an n type semiconductor substrate. And, when a high-concentration-impurity-containing layer $SC_{10}$ having the first conductivity type (for example, $n^{++}$ type) is formed immediately below the first region $SC_1$, a potential or a charge to be stored in the channel forming region $CH_1$ of the first transistor $TR_1$ for readout can be increased.

FIGS. 28 to 37 show variants of the semiconductor memory cell shown in FIGS. 27A and 27B.

Figure 28:
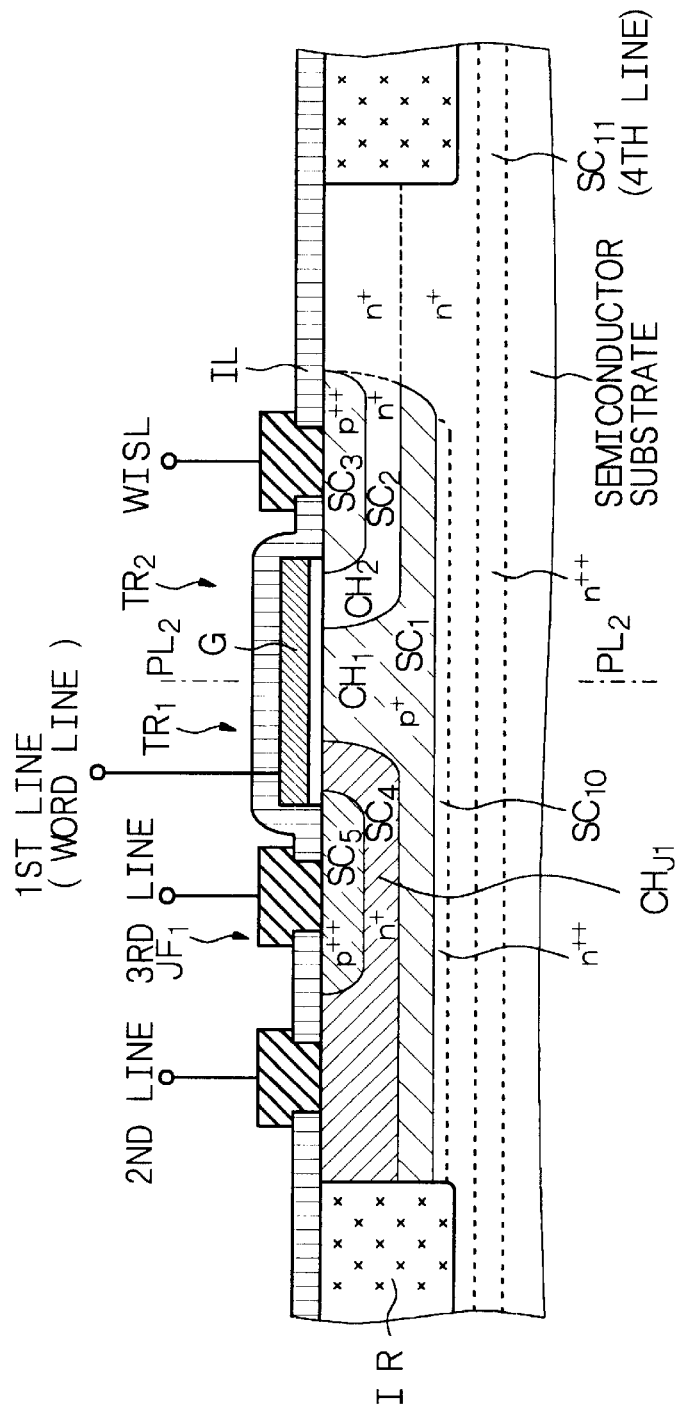
FIG. 28 is a schematic partial cross-sectional view of a variant of the semiconductor memory cell of Example 3.

In the semiconductor memory cell shown in FIG. 28, a high-concentration-impurity-containing layer $SC_{11}$ which has the first conductivity type (for example, $n^{++}$ type) and works as a fourth line is formed below the first region $SC_1$, and the high-concentration-impurity-containing layer $SC_{11}$ is connected to the second region $SC_2$. This structure serves to simplify the wiring structure.

Figure 29:
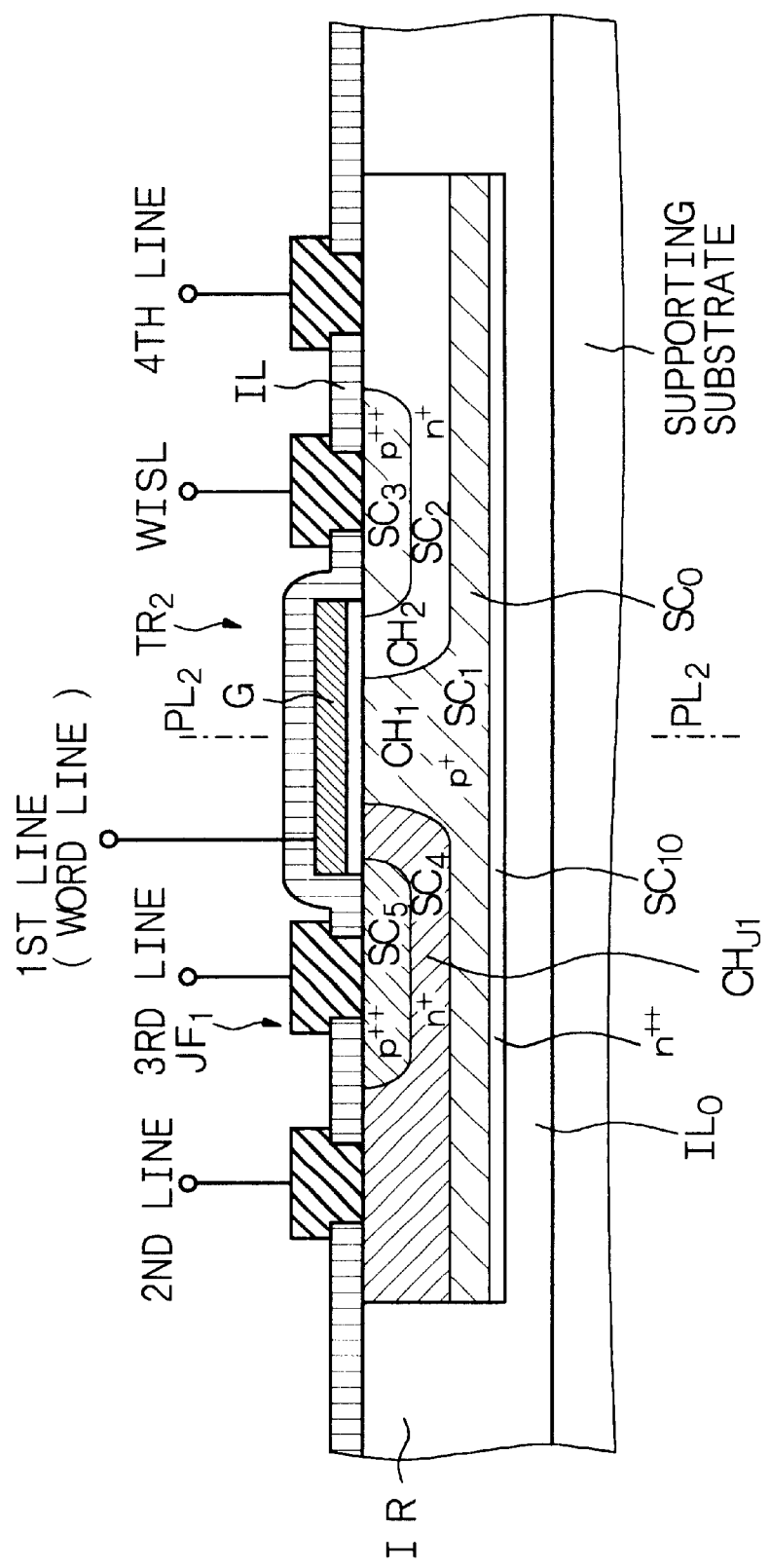
FIG. 29 is a schematic partial cross-sectional view of a variant of the semiconductor memory cell of Example 3.

In the semiconductor memory cell shown in FIG. 29, the semiconductor memory cell structured as shown in FIGS. 27A and 27B is formed in a semiconductor layer $SC_0$ formed on an insulating layer $IL_0$ on a supporting substrate. The so-structured semiconductor memory cell can be fabricated by the same method as that explained in Example 1.

Figure 32:
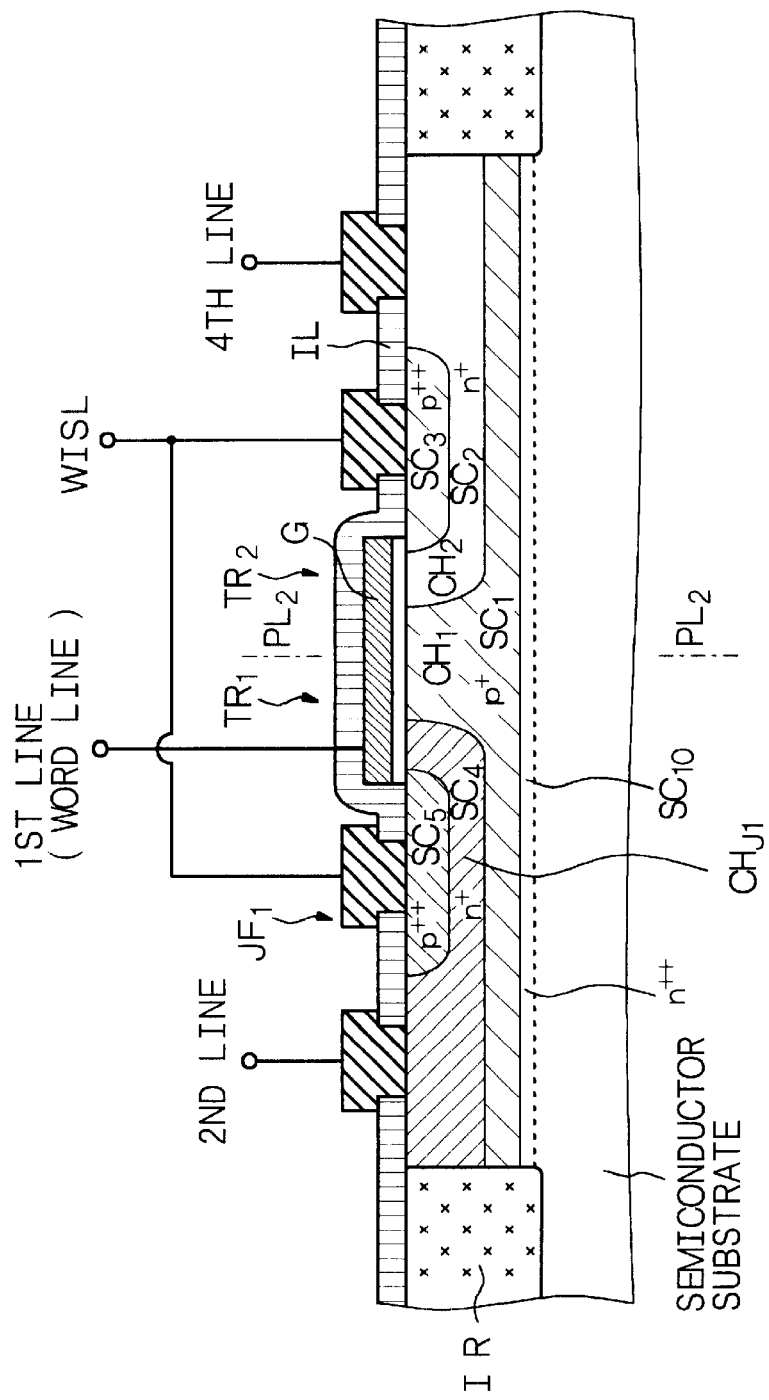
FIG. 32 is a schematic partial cross-sectional view of a variant of the semiconductor memory cell of Example 3.

In a semiconductor memory cell shown in the schematic partial cross-sectional view of FIG. 32 and the principle-showing view of FIG. 19, the fifth region $SC_5$ is connected to the write-in information setting line WISL in place of being connected to the third line. This structure serves to simplify a wiring structure.

Figure 21:
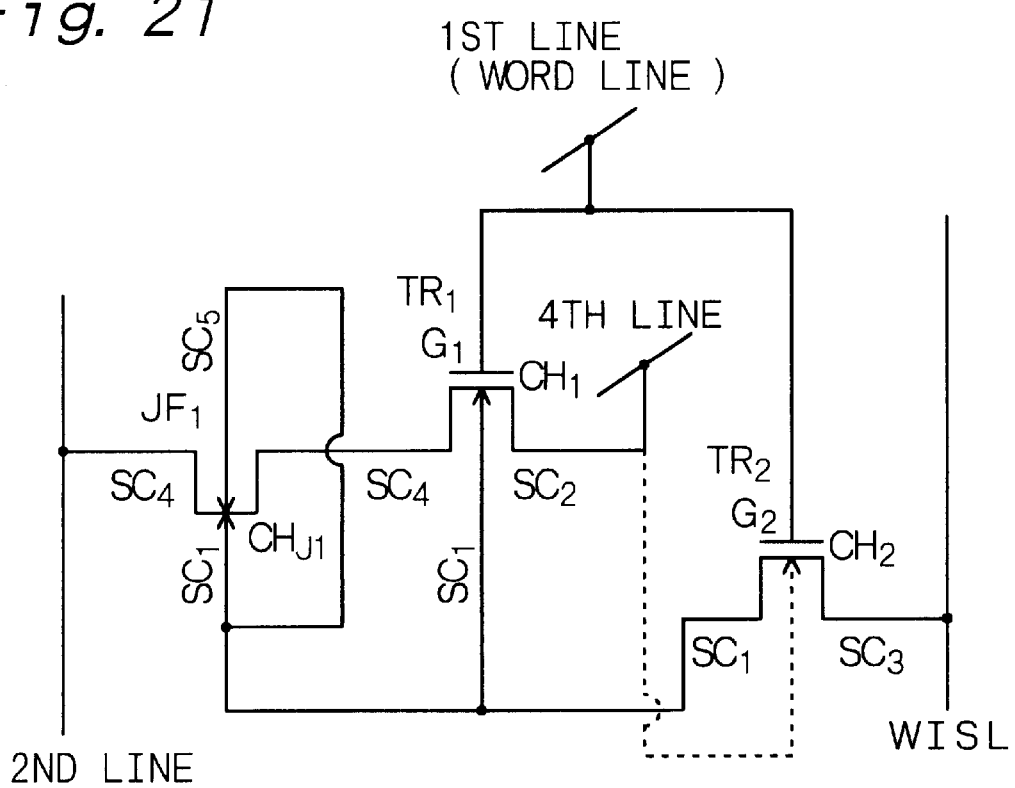
FIG. 21 is a principle-showing view of a variant of the semiconductor memory cell according to the third aspect of the present invention.

In a semiconductor memory cell shown in the schematic partial cross-sectional view of FIGS. 35A and 35B and the principle-showing view of FIG. 21, the fifth region $SC_5$ is connected to the first region $SC_1$ in place of being connected to the third line. This structure also serves to simplify a wiring structure. The first region $SC_1$ and the fifth region $SC_5$ can be connected to each other by forming a structure in which part of the first region $SC_1$ is extended up to a vicinity of the surface of a semiconductor substrate and the fifth region $SC_5$ and the extending portion of the first region $SC_1$ come in contact with each other outside the fourth region $SC_4$, as shown in FIG. 35B.

Figure 18A:
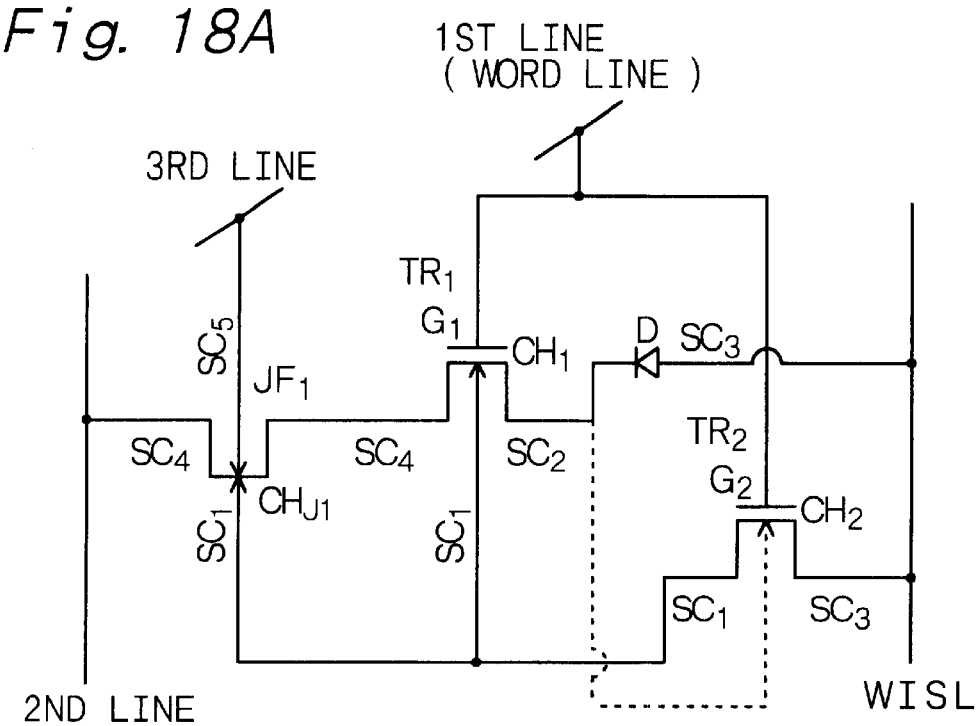
FIGS. 18A and 18B are principle-showing views of variants of the semiconductor memory cell according to the third aspect of the present invention.
Figure 20A:
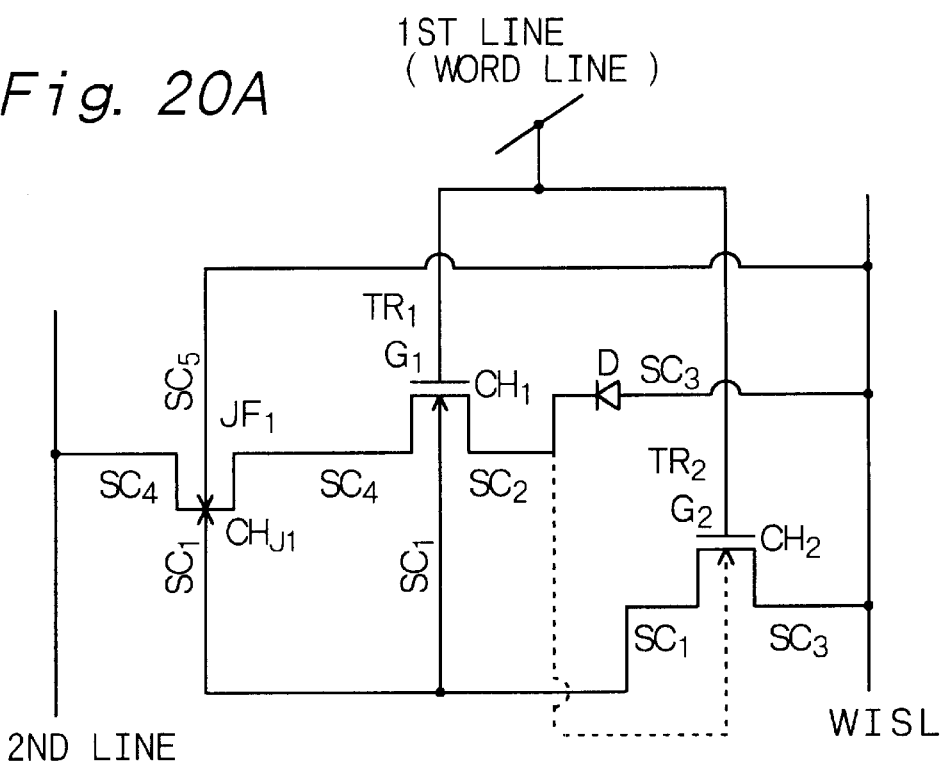
FIGS. 20A and 20B are principle-showing views of variants of the semiconductor memory cell according to the third aspect of the present invention.
Figure 22A:
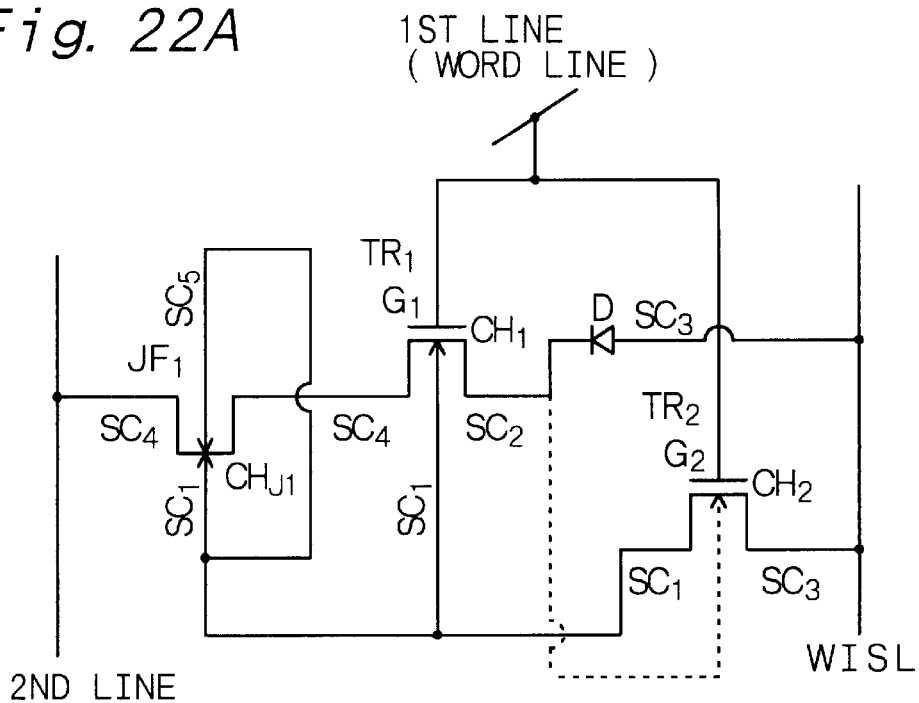
FIGS. 22A and 22B are principle-showing views of variants of the semiconductor memory cell according to the third aspect of the present invention.
Figure 30:
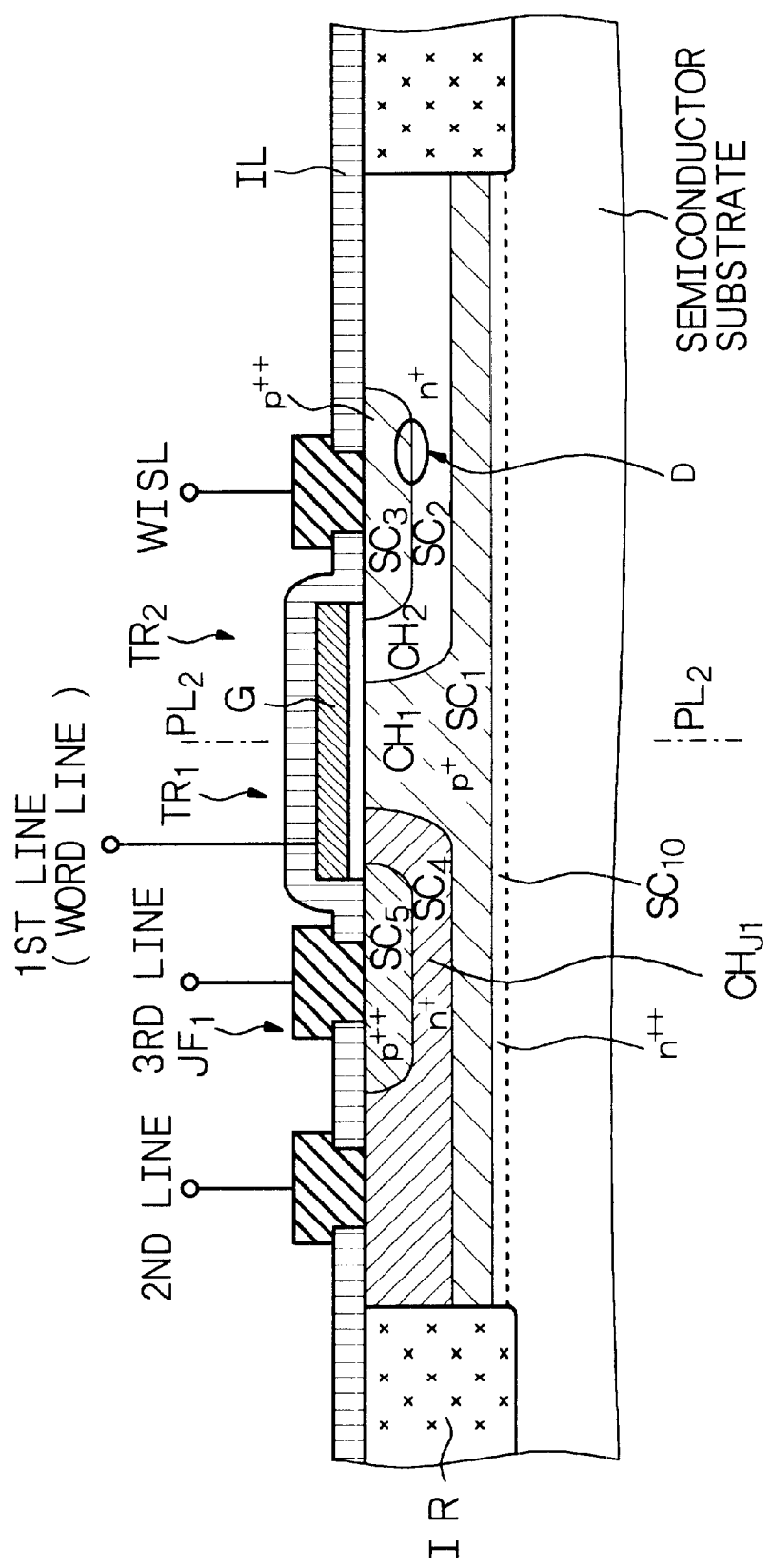
FIG. 30 is a schematic partial cross-sectional view of a variant of the semiconductor memory cell of Example 3.
Figure 33:
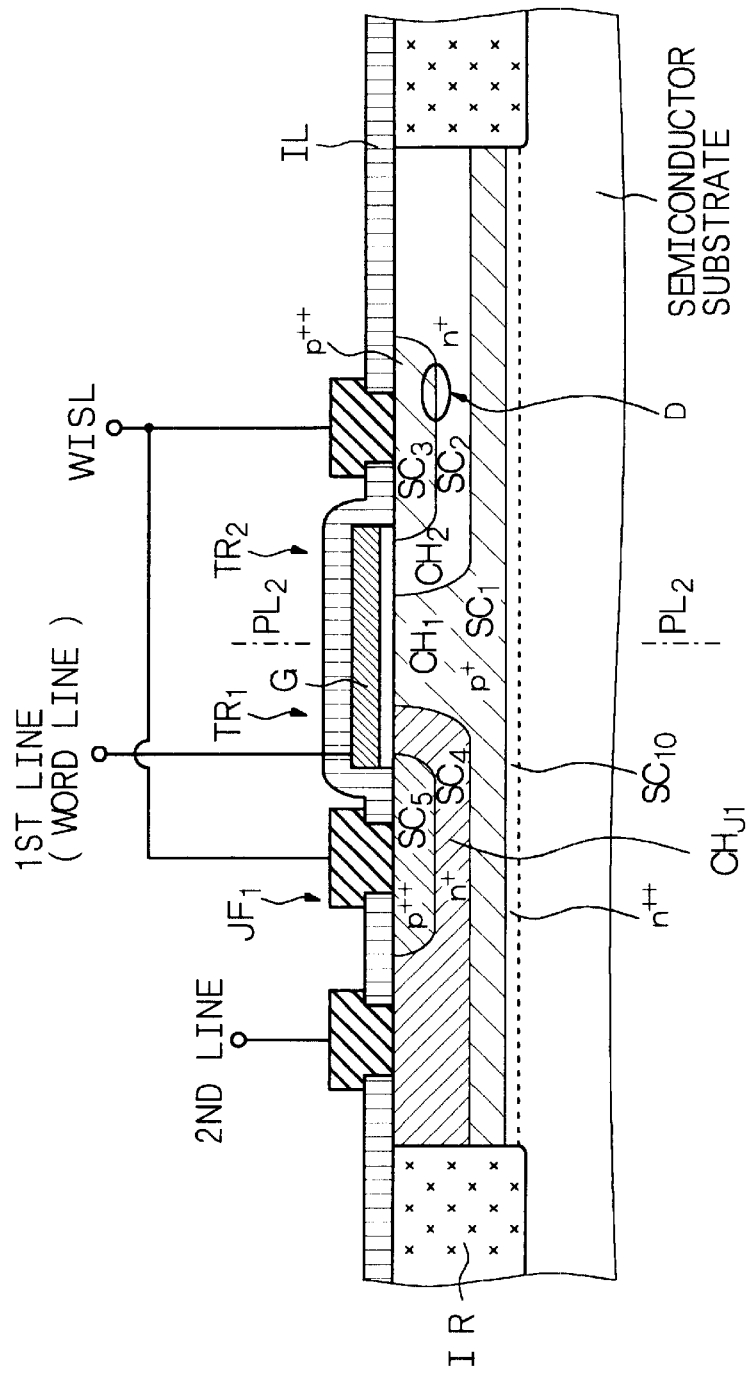
FIG. 33 is a schematic partial cross-sectional view of a variant of the semiconductor memory cell of Example 3.
Figure 36:
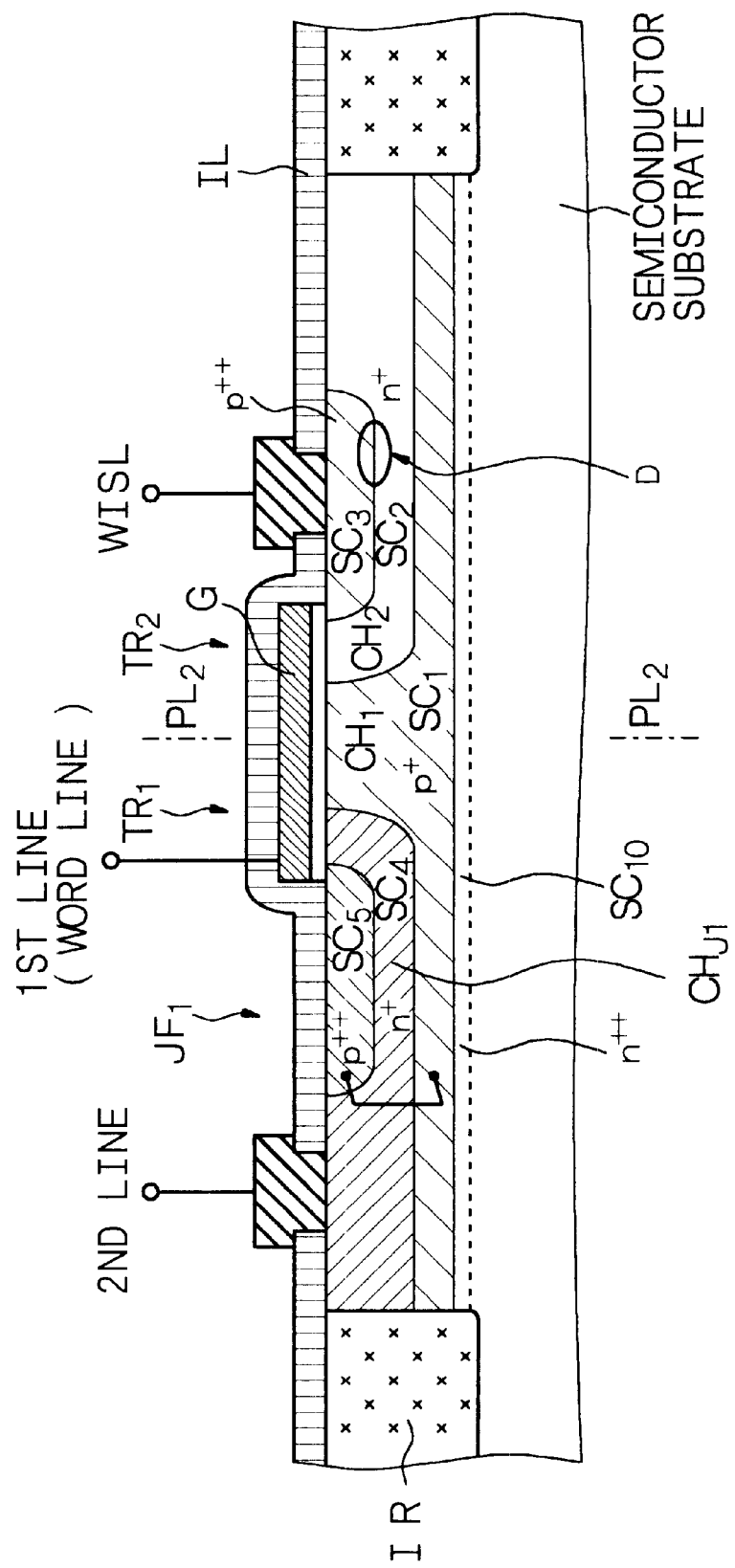
FIG. 36 is a schematic partial cross-sectional view of a variant of the semiconductor memory cell of Example 3.

In a semiconductor memory cell shown in the schematic partial cross-sectional view of FIG. 30, 33 or 36 and the principle-showing view of FIG. 18A, 20A or 22A, one source/drain region (second region $SC_2$) of the first transistor $TR_1$ is connected to the write-in information setting line WISL through a pn junction diode D in place of being connected to the fourth line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line. The semiconductor memory cell shown in FIG. 30 is basically the same as the semiconductor memory cell shown in FIG. 27 in constitution. The semiconductor memory cell shown in FIG. 33 is basically the same as the semiconductor memory cell shown in FIG. 32 in constitution. The semiconductor memory cell shown in FIG. 36 is basically the same as the semiconductor memory cell shown in FIG. 35 in constitution.

Figure 18B:
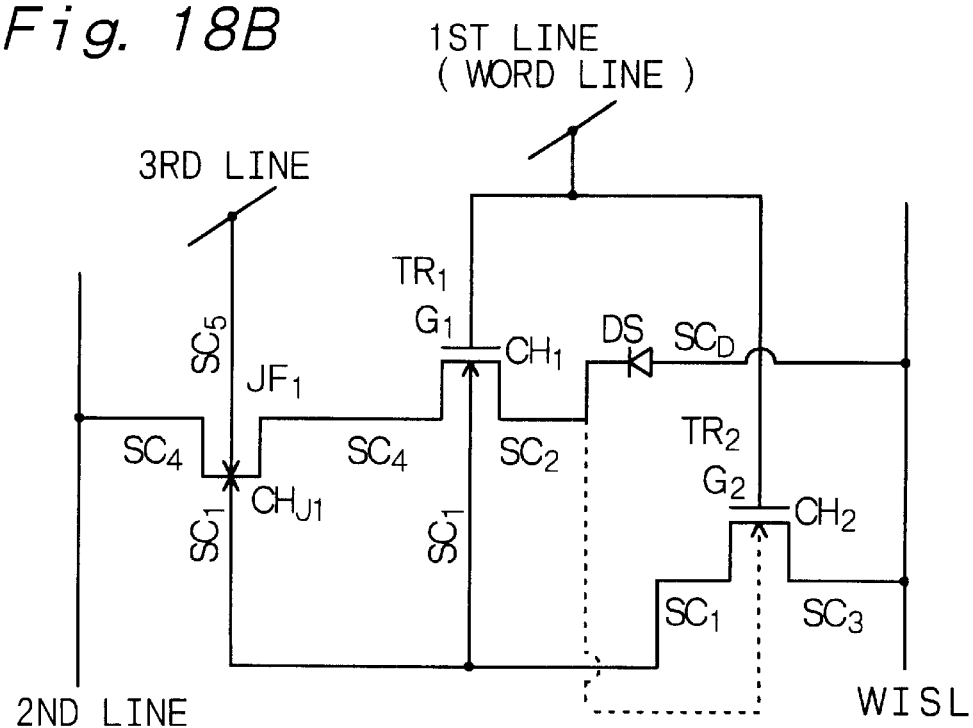
Figure 20B:
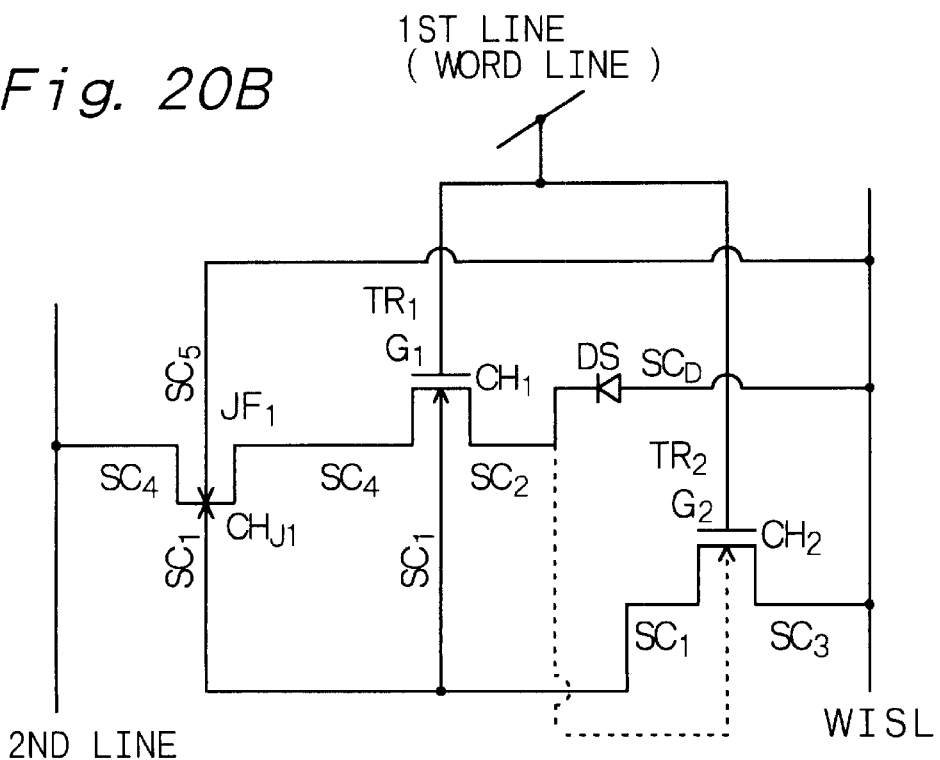
Figure 22B:
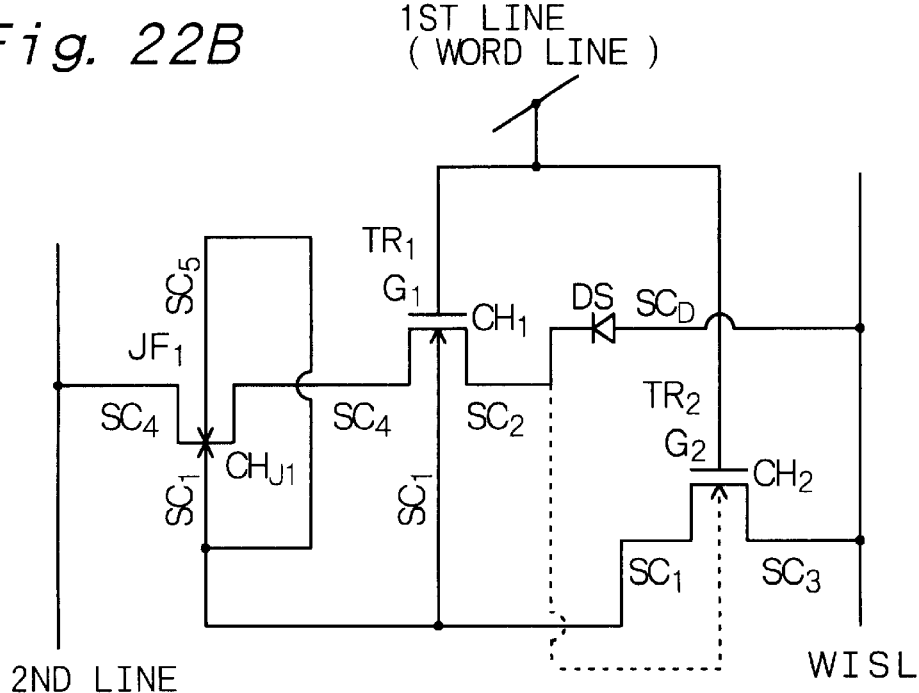
Figure 31:
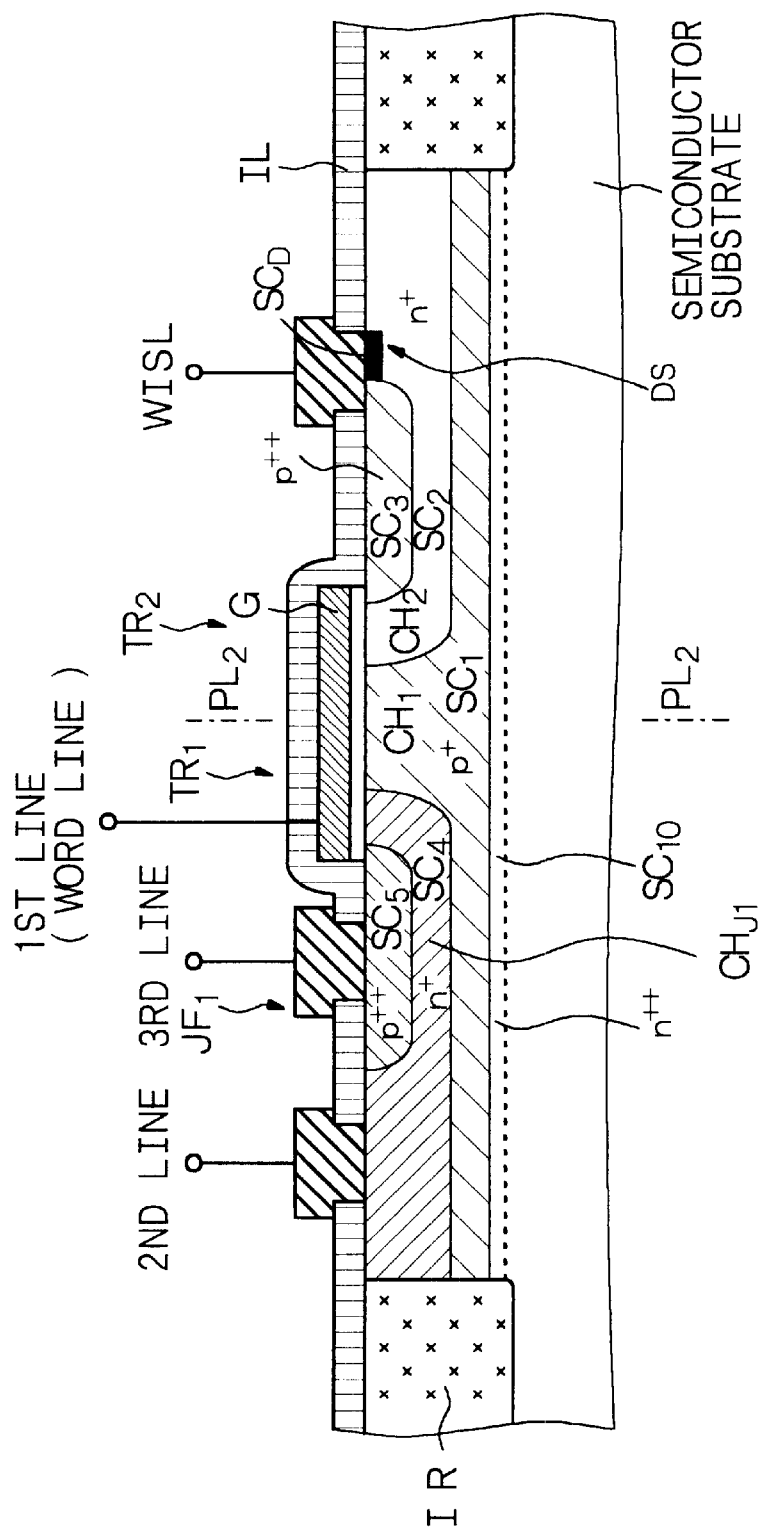
FIG. 31 is a schematic partial cross-sectional view of a variant of the semiconductor memory cell of Example 3.
Figure 34:
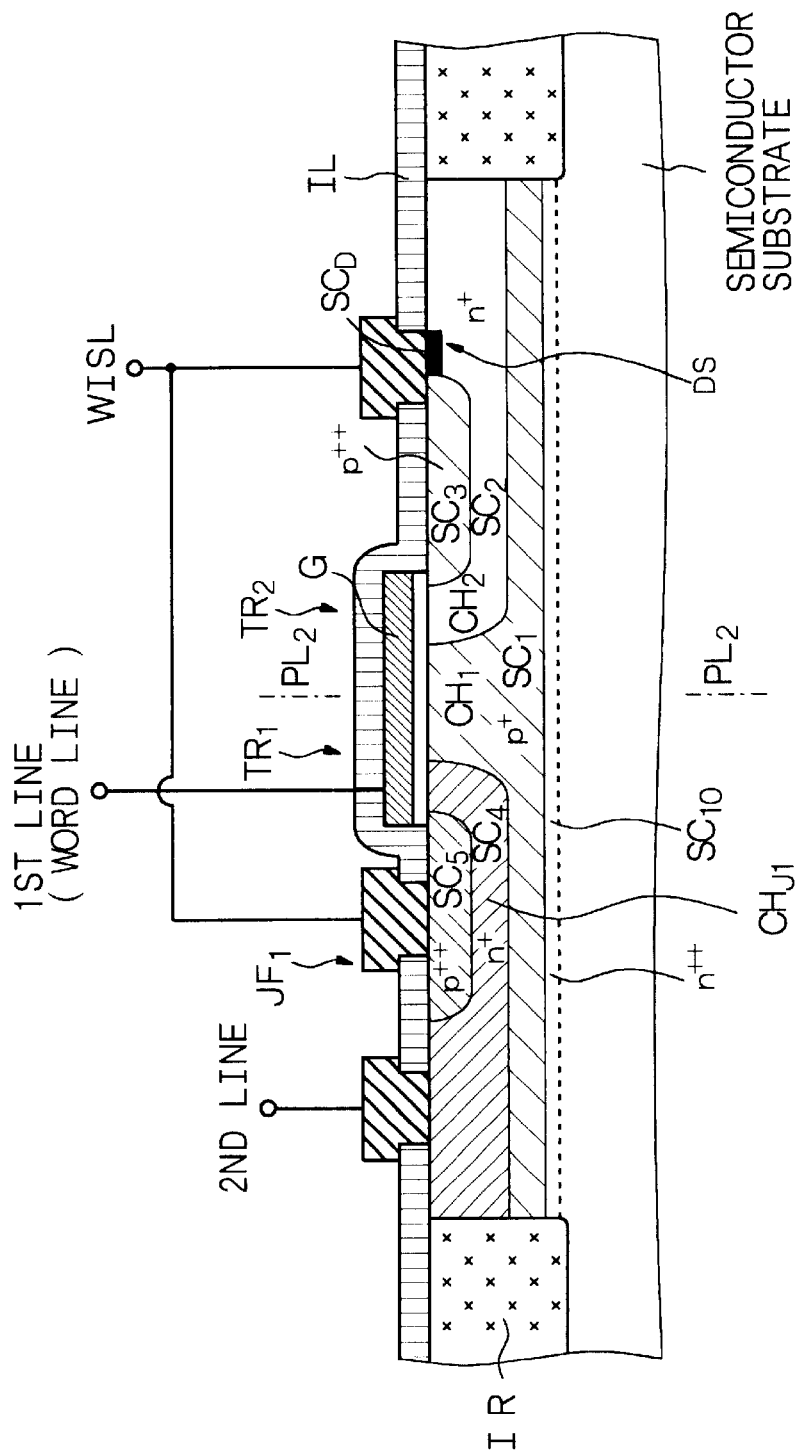
FIG. 34 is a schematic partial cross-sectional view of a variant of the semiconductor memory cell of Example 3.
Figure 35:
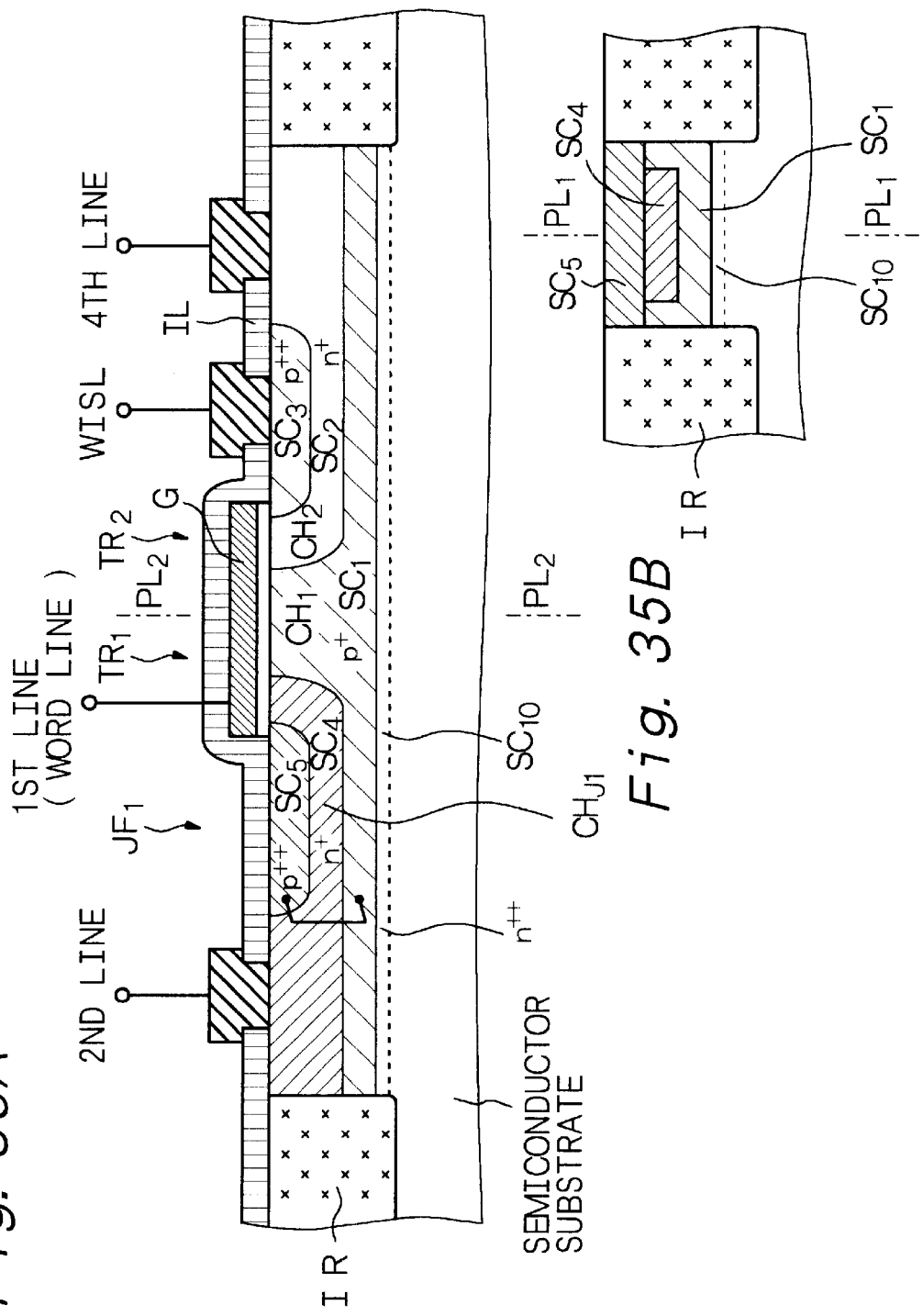
FIGS. 35A and 35B are schematic partial cross-sectional views of a variant of the semiconductor memory cell of Example 3.
Figure 37:
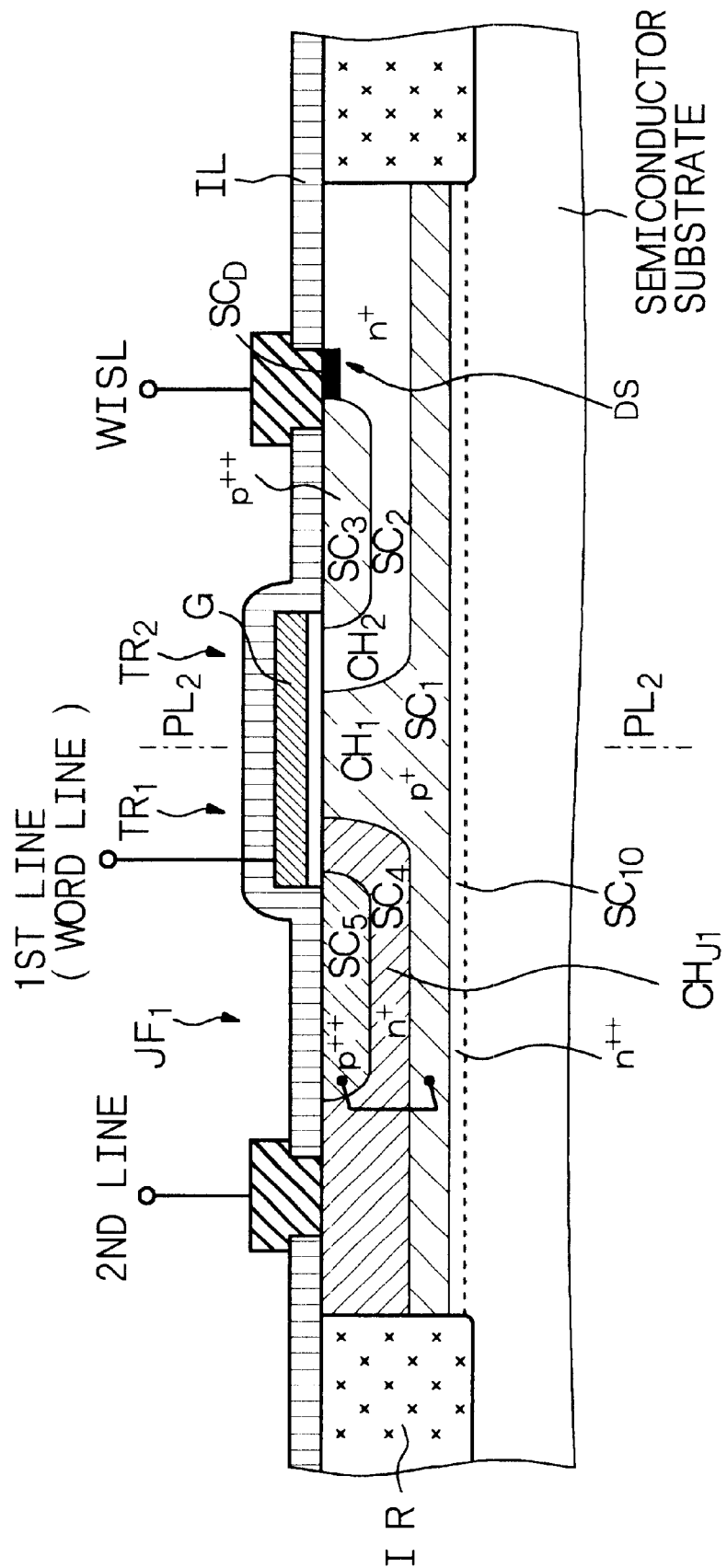
FIG. 37 is a schematic partial cross-sectional view of a variant of the semiconductor memory cell of Example 3.

A semiconductor memory cell shown in the schematic partial cross-sectional view of FIG. 31, 34 or 37 (see FIG. 18B, 20B or 22B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the fourth line. That is, one source/drain region of the first transistor $TR_1$ is connected to the write-in information setting line WISL through the majority carrier diode DS. In the semiconductor memory cell shown in any one of these Figures, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line. The semiconductor memory cell shown in FIG. 31 is basically the same as the semiconductor memory cell shown in FIG. 27 in constitution. The semiconductor memory cell shown in FIG. 34 is basically the same as the semiconductor memory cell shown in FIG. 32 in constitution. The semiconductor memory cell shown in FIG. 37 is basically the same as the semiconductor memory cell shown in FIG. 35 in constitution.

Figure 38:
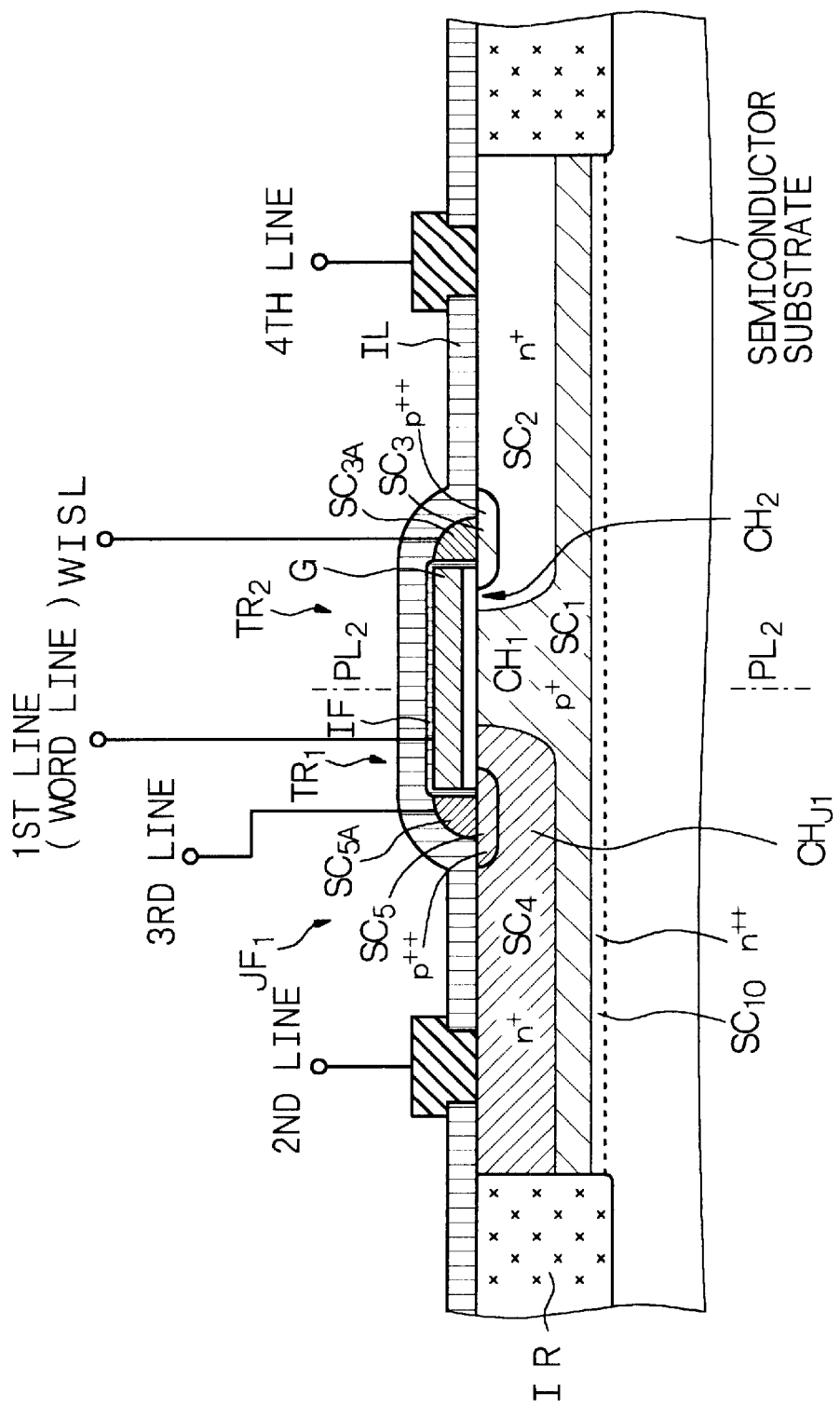
FIG. 38 is a schematic partial cross-sectional view of a variant of the semiconductor memory cell of Example 3.

A semiconductor memory cell shown in the schematic partial cross-sectional view of FIG. 38 is obtained by constitutionally modifying the third region $SC_3$ and the fifth region $SC_5$ of the semiconductor memory cell shown in the schematic partial cross-sectional view of FIGS. 27A and 27B. That is, a first impurity-containing layer $SC_{3A}$ having the second conductivity type (for example, $p^{++}$ type) is formed on the third region $SC_3$. The third region $SC_3$ is connected to the write-in information setting line WISL through the first impurity-containing layer $SC_{3A}$. The third region $SC_3$ is formed in a self-alignment manner by solid phase diffusion of a p-type impurity from the first impurity-containing layer $SC_{3A}$, and it has a shallow p junction. Further, the first impurity-containing layer $SC_{3A}$ is positioned on one side of the gate region G through an insulation material layer IF and has the form of a side-wall. There may be employed a constitution in which the first impurity-containing layer $SC_{3A}$ works as the write-in information setting line WISL as well. That is, the first impurity-containing layer $SC_{3A}$ extends in the direction perpendicular to a paper surface of the drawing, and an extending portion of the first impurity-containing layer $SC_{3A}$ is an impurity-containing layer $SC_{3A}$ of an adjacent semiconductor memory cell and works as the write-in information setting line WISL. This structure serves to simplify a wiring structure and to attain the formation of a finer-structure of the semiconductor memory cell.

Figure 39:
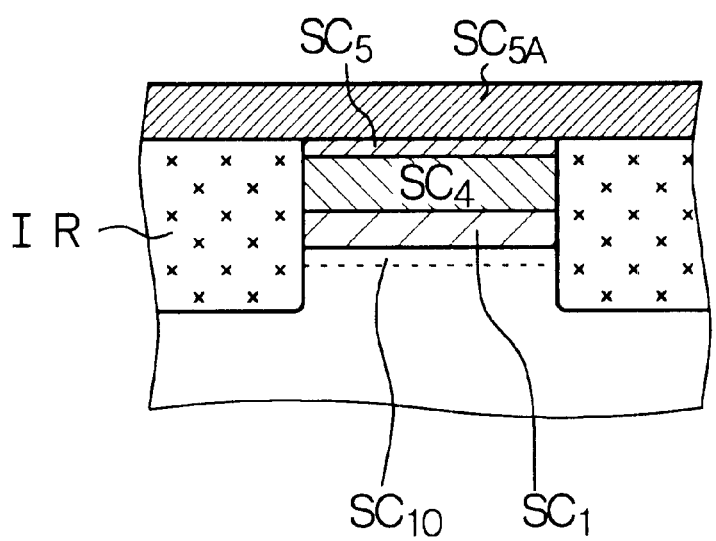
FIG. 39 is a schematic partial cross-sectional view of the variant shown in FIG. 38, prepared by cutting the same through other plane.

A second impurity-containing layer $SC_{5A}$ having the second conductivity type (for example, $p^{++}$ type) is formed on the fifth region $SC_5$. The fifth region $SC_5$ is connected to the third line through the second impurity-containing layer $SC_{5A}$. The fifth region $SC_5$ is formed in a self-alignment manner by solid phase diffusion of a p-type impurity from the second impurity-containing layer $SC_{5A}$, and it has a shallow p junction. Further, the second impurity-containing layer $SC_{5A}$ is positioned on the other side surface of the gate region G through the insulation material layer IF and has the form of a side-wall. FIG. 39 shows a schematic partial cross-sectional view prepared by cutting the semiconductor memory cell including the fifth region $SC_5$ with an imaginary perpendicular plane in parallel with the second imaginary perpendicular plane which is in parallel with the extending direction of the gate region G and passes through the center of the gate region G. There may be employed a constitution in which the second impurity-containing layer $SC_{5A}$ works as the third line as well. That is, the second impurity-containing layer $SC_{5A}$ extends in the direction perpendicular to the paper surface of the drawing, and, an extending portion of the second impurity-containing layer $SC_{5A}$ is a second impurity-containing layer $SC_{5A}$ of an adjacent semiconductor memory cell and works as the third line. This structure serves to simplify a wiring structure and to attain the formation of a finer structure of the semiconductor memory cell.

The third region $SC_3$ and the fifth region $SC_5$ of each of the semiconductor memory cells shown in FIGS. 28 to 37 and semiconductor memory cells shown in FIGS. 40 to 45 to be discussed later may be replaced with a constitution of the impurity-containing layers $SC_{3A}$ and $SC_{5A}$, the third region $SC_3$ and the fifth region $SC_5$ of the semiconductor memory cell shown in FIG. 38.

EXAMPLE 4

Figure 23:
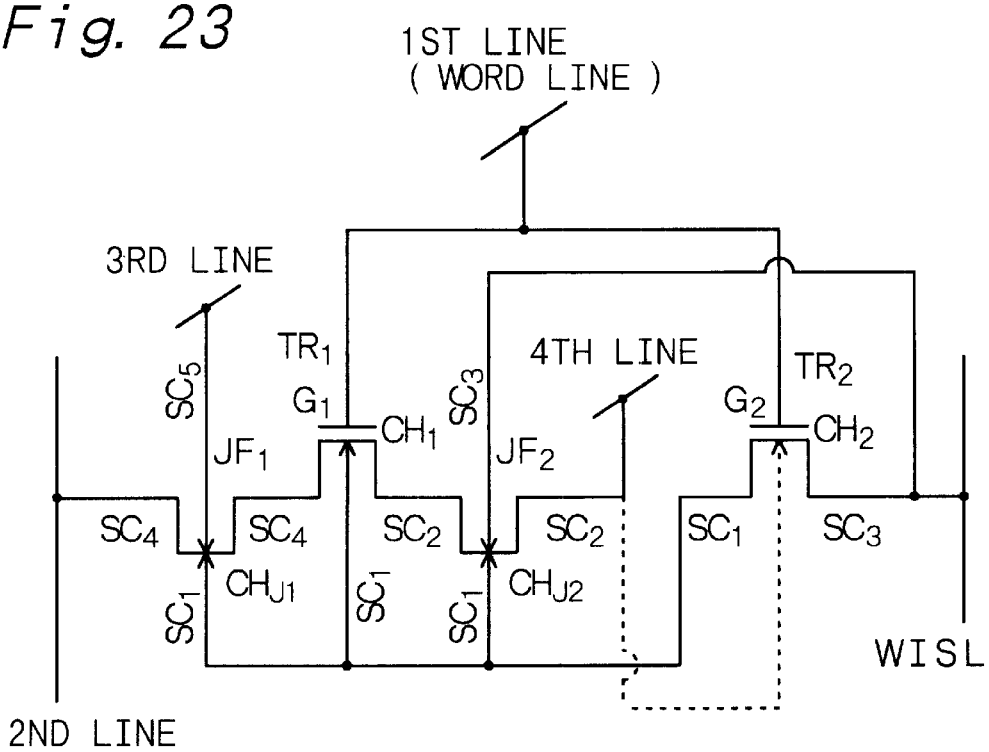
FIG. 23 is a principle-showing view of a variant of the semiconductor memory cell according to the third aspect of the present invention.

The semiconductor memory cell of Example 4 is a variant of the semiconductor memory cell of Example 3. The semiconductor memory cell of Example 4 differs from the semiconductor memory cell of Example 3 in that a second junction-field-effect transistor $JF_2$ is formed of the first region $SC_1$, the second region $SC_2$ and the third region $SC_3$. That is, as shown in the principle-showing view of FIG. 23 and the schematic partial cross-sectional view of FIG. 40, the semiconductor memory cell of Example 4 further has;

a second junction-field-effect transistor $JF_2$ for current control, having source/drain regions, a channel region $CH_{J2}$ and gate portions, wherein;

the gate portions of the second junction-field-effect transistor $JF_2$ are formed of the third region $SC_3$ and a portion of the first region $SC_1$ which portion is opposed to the third region $SC_3$, the channel region $CH_{J2}$ of the second junction-field-effect transistor $JF_2$ is formed of a portion of the second region $SC_2$ which portion is interposed between or sandwiched by the third region $SC_3$ and said portion of the first region $SC_1$, one source/drain region of the second junction-field-effect transistor $JF_2$ is formed of a surface region of the second region $SC_2$ which surface region extends from one end of the channel region $CH_{J2}$ of the second junction-field-effect transistor $JF_2$ and forms the one source/drain region of the first transistor $TR_1$, and the other source/drain region of the second junction-field-effect transistor $JF_2$ is a portion of the second region $SC_2$ which portion extends from the other end of the channel region $CH_{J2}$ of the second junction-field-effect transistor $JF_2$.

The semiconductor memory cell of Example 4 is substantially the same as the semiconductor memory cell of Example 3 in other constitutions shown in FIGS. 27A and 27B, so that detailed explanations thereof are omitted.

The second junction-field-effect transistor $JF_2$ is formed by (iii) optimizing the distance (thickness of the channel region $CH_{J2}$) between the opposing gate portions (the third region $SC_3$ and the portion of the first region $SC_1$ which portion is opposed to the third region $SC_3$) and (iv) optimizing impurity concentrations of the opposing gate portions (the third region $SC_3$ and the portion of the first region $SC_1$ which portion is opposed to the third region $SC_3$) and the impurity concentration of the channel region $CH_{J2}$.

Figure 40:
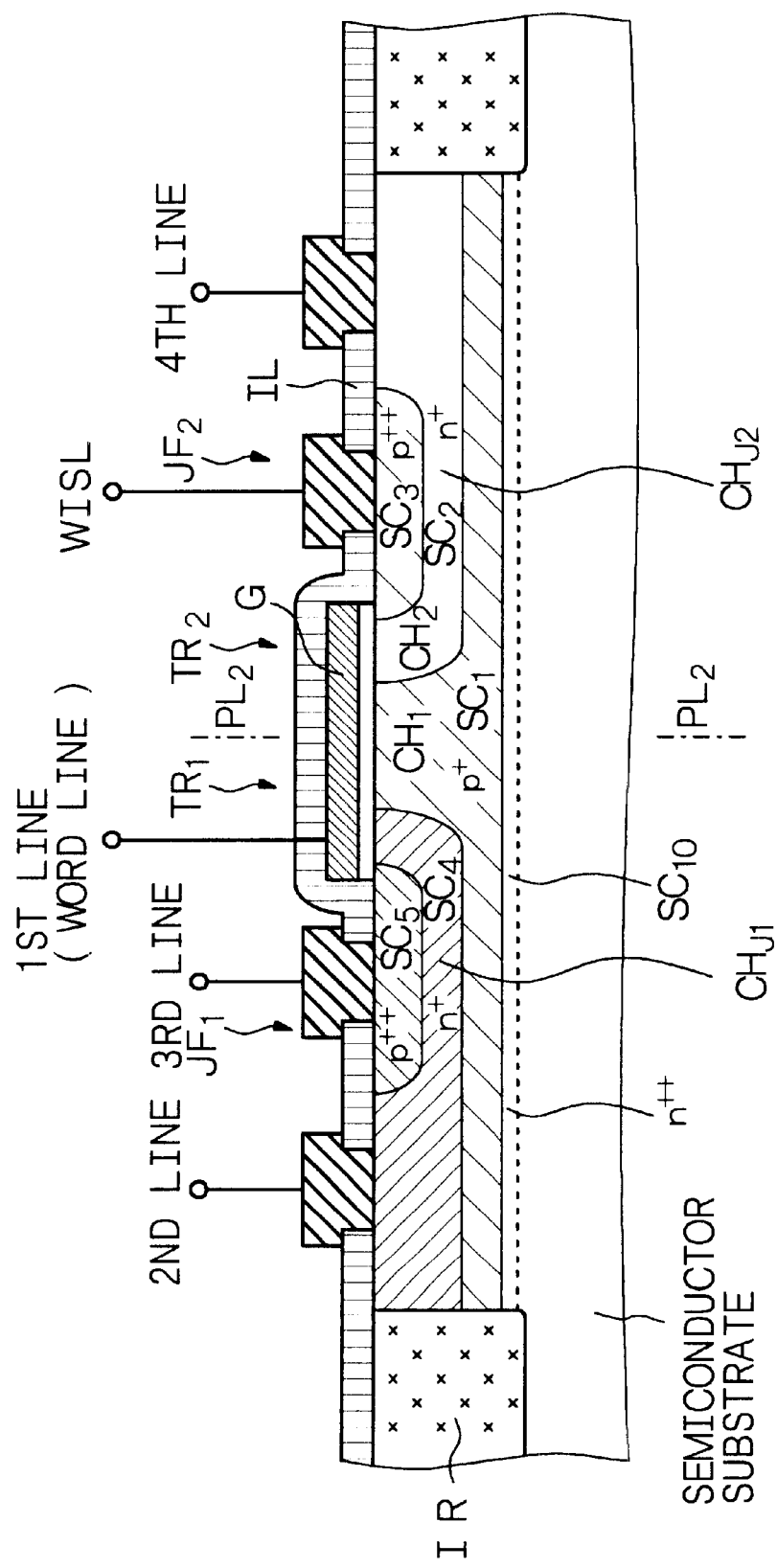
FIG. 40 is a schematic partial cross-sectional view of a semiconductor memory cell of Example 4.

FIGS. 41 to 45 show variants of the semiconductor memory cell shown in FIG. 40.

Figure 25:
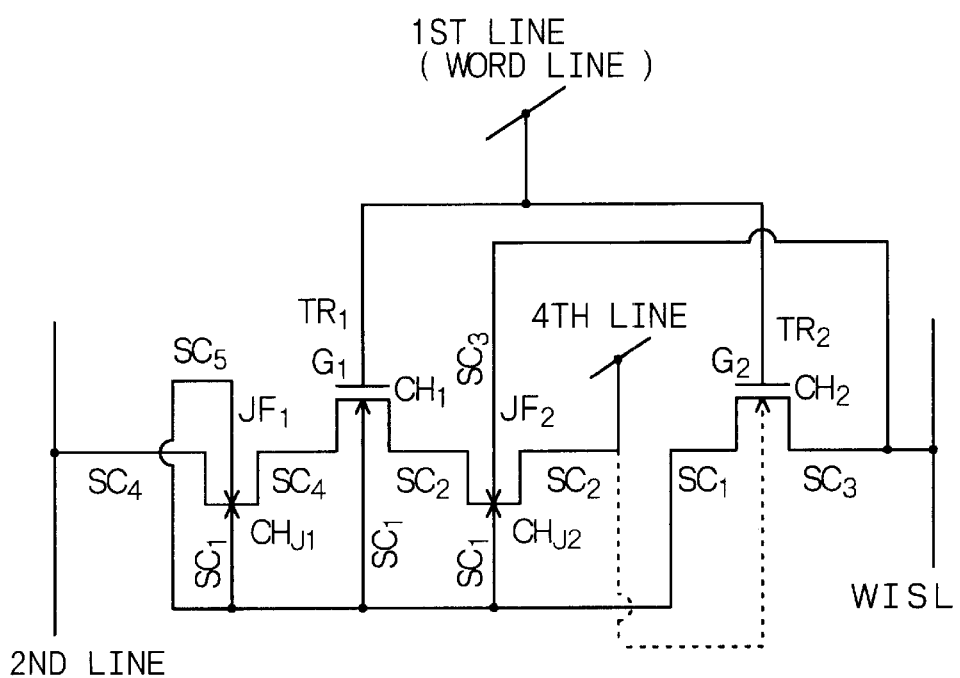
FIG. 25 is a principle-showing view of a variant of the semiconductor memory cell according to the third aspect of the present invention.
Figure 43:
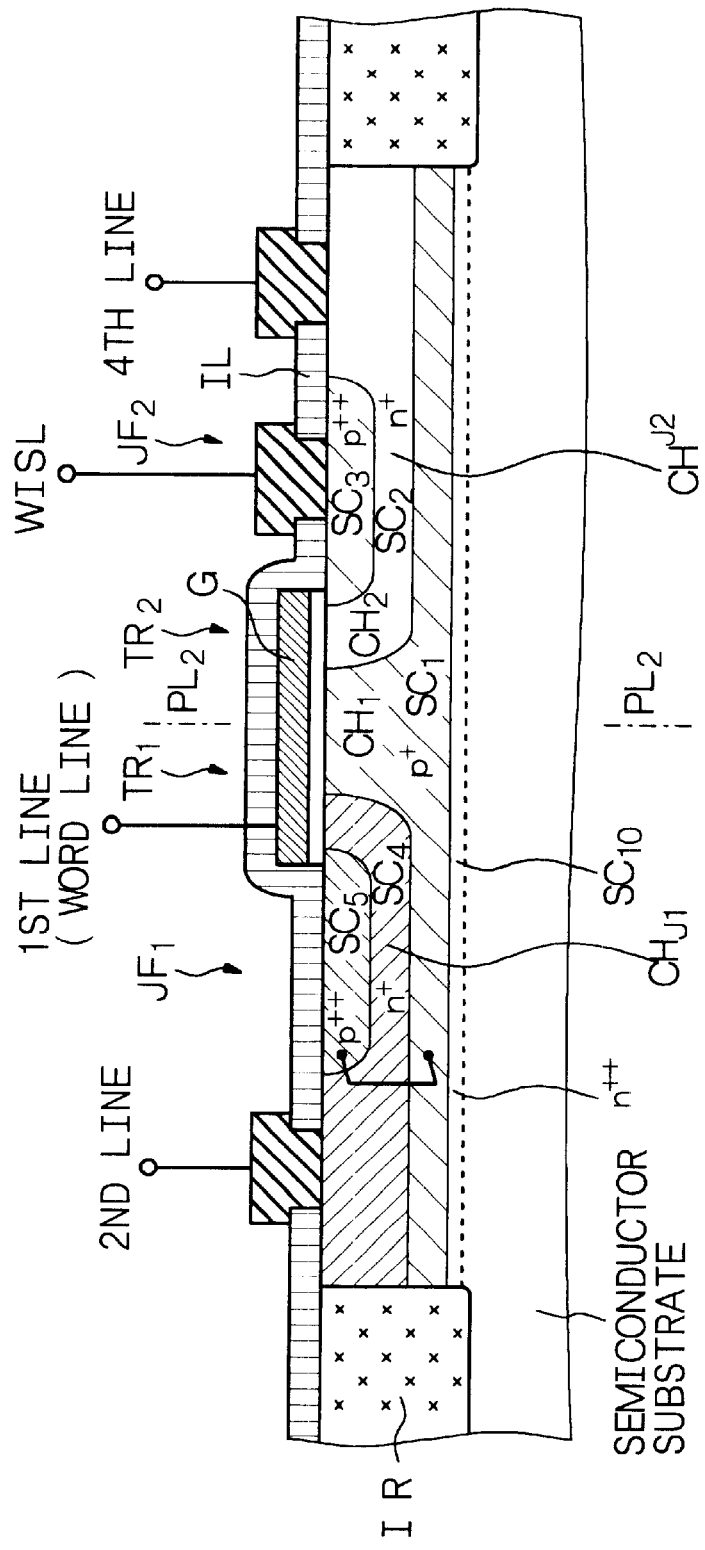
FIG. 43 is a schematic partial cross-sectional view of a variant of the semiconductor memory cell of Example 4.

A semiconductor memory cell shown in the schematic partial cross-sectional view of FIG. 43 and the principle-showing view of FIG. 25 is a variant of the semiconductor memory cell shown in FIG. 40, and the fifth region $SC_5$ is connected to the first region $SC_1$ in place of being connected to the third line. This structure serves to simplify a wiring structure. The first region $SC_1$ and the fifth region $SC_5$ can be connected to each other by forming, for example, a structure in which a portion of the first region $SC_1$ is extended up to a vicinity of the surface of the semiconductor substrate and the fifth region $SC_5$ and the extending portion of the first region $SC_1$ come into contact with each other outside the fourth region $SC_4$, similarly as shown in FIG. 35B.

Figure 24A:
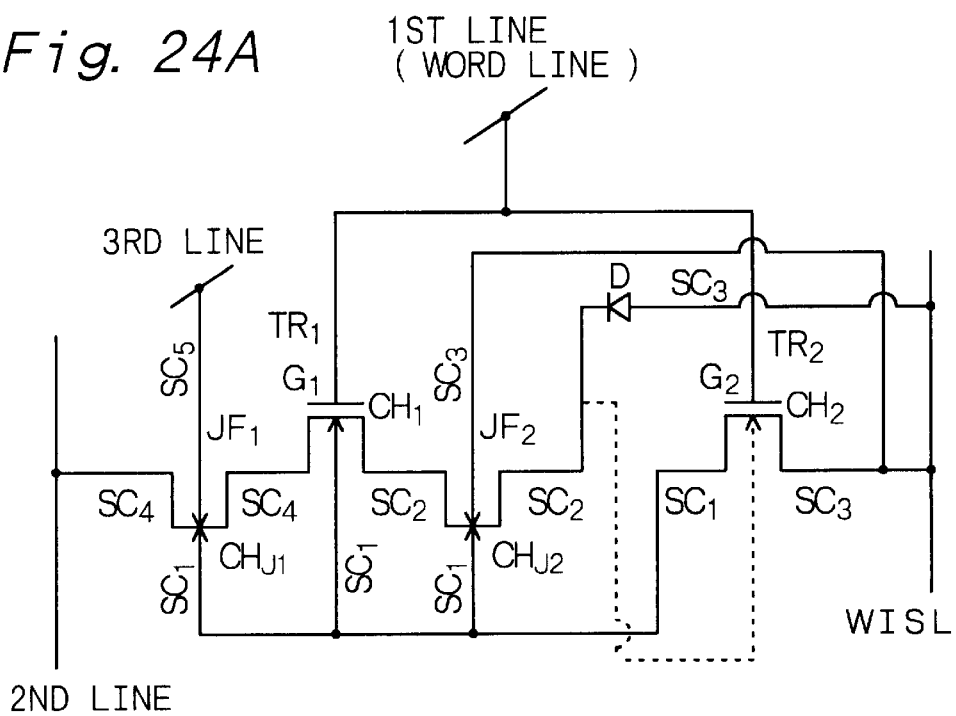
FIGS. 24A and 24B are principle-showing views of variants of the semiconductor memory cell according to the third aspect of the present invention.
Figure 26A:
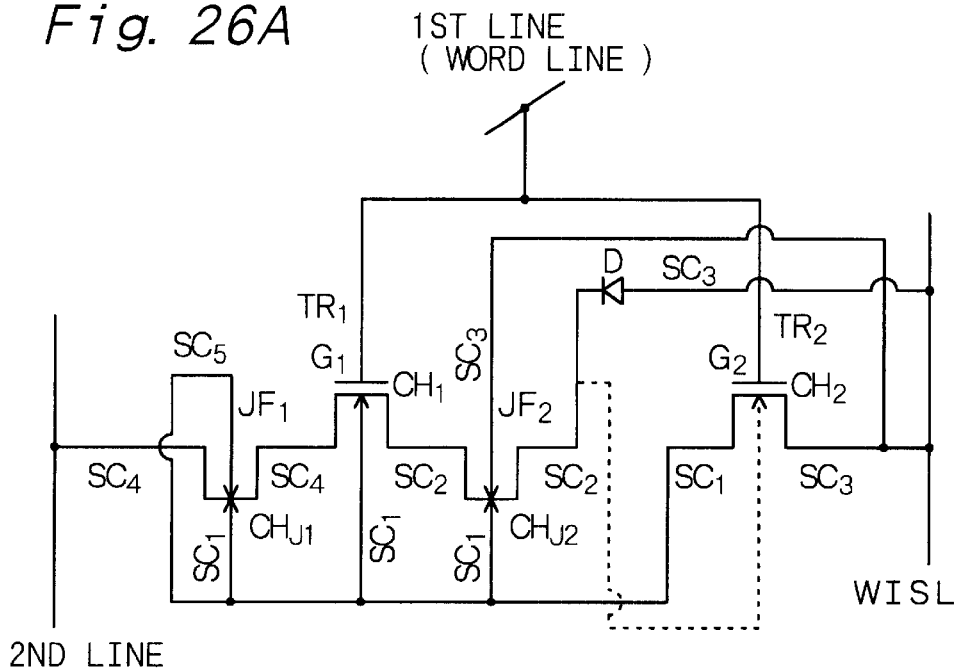
FIGS. 26A and 26B are principle-showing views of variants of the semiconductor memory cell according to the third aspect of the present invention.
Figure 41:
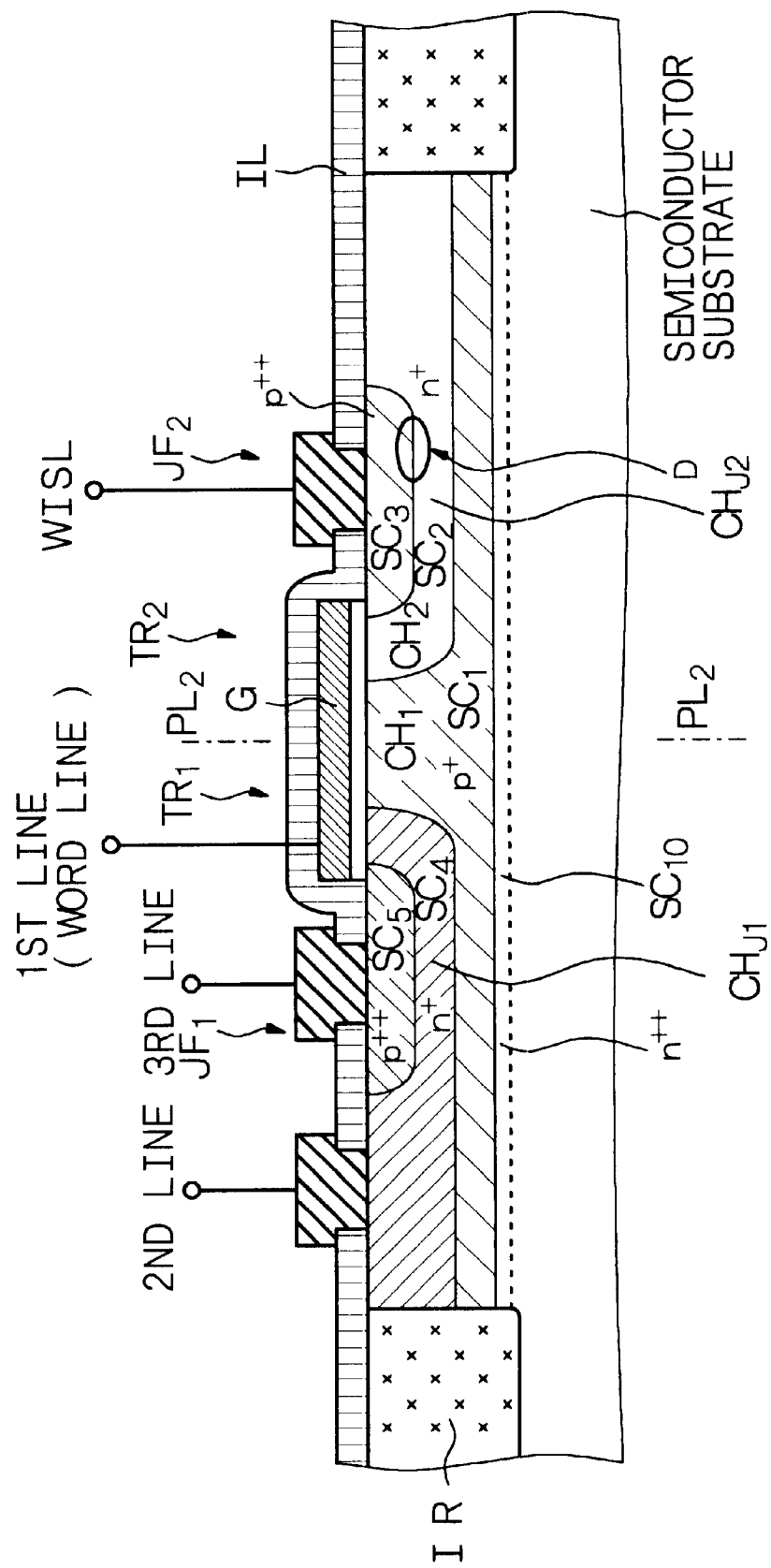
FIG. 41 is a schematic partial cross-sectional view of a variant of the semiconductor memory cell of Example 4.
Figure 44:
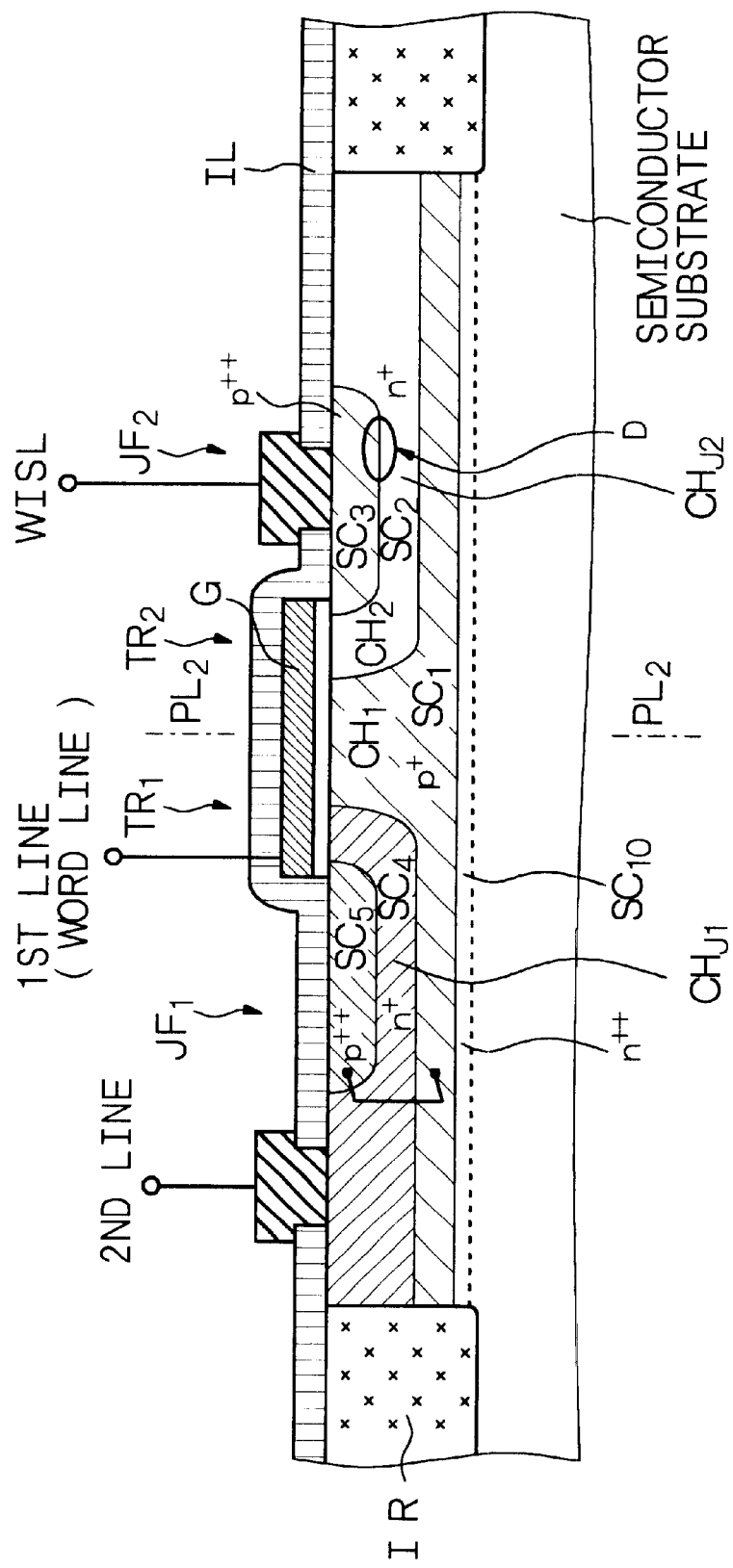
FIG. 44 is a schematic partial cross-sectional view of a variant of the semiconductor memory cell of Example 4.

In a semiconductor memory cell shown in the schematic partial cross-sectional view of FIG. 41 or 44 and the principle-showing view of FIG. 24A or 26A, one source/drain region (second region $SC_2$) of the first transistor $TR_1$ is connected to the write-in information setting line WISL through a pn junction diode D in place of being connected to the fourth line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line. The semiconductor memory cell shown in FIG. 41 is basically the same as the semiconductor memory cell shown in FIG. 40 in constitution. The semiconductor memory cell shown in FIG. 44 is basically the same as the semiconductor memory cell shown in FIG. 43 in constitution.

Figure 24B:
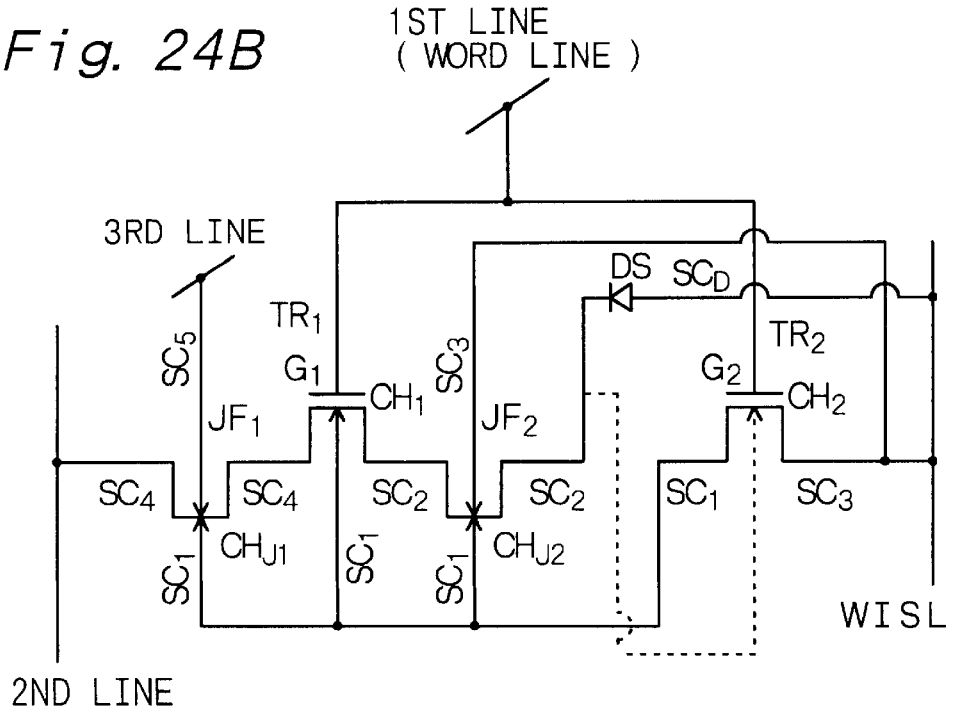
Figure 26B:
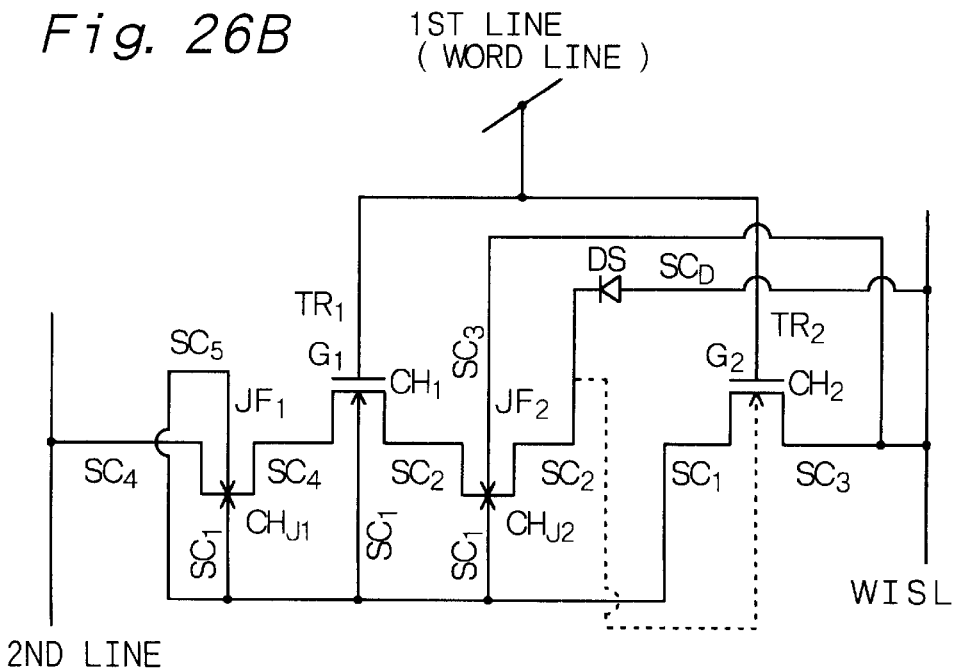
Figure 42:
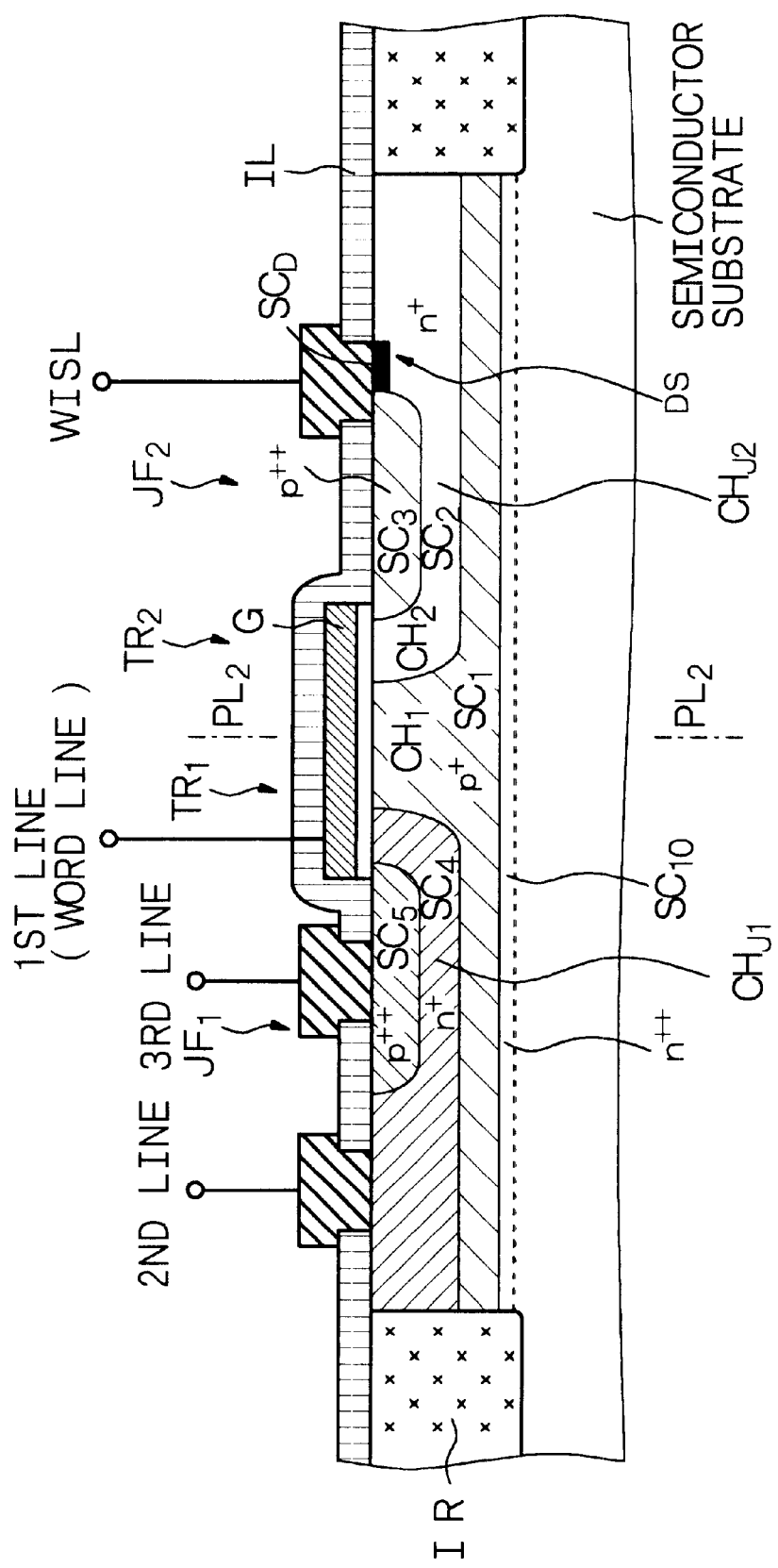
FIG. 42 is a schematic partial cross-sectional view of a variant of the semiconductor memory cell of Example 4.
Figure 45:
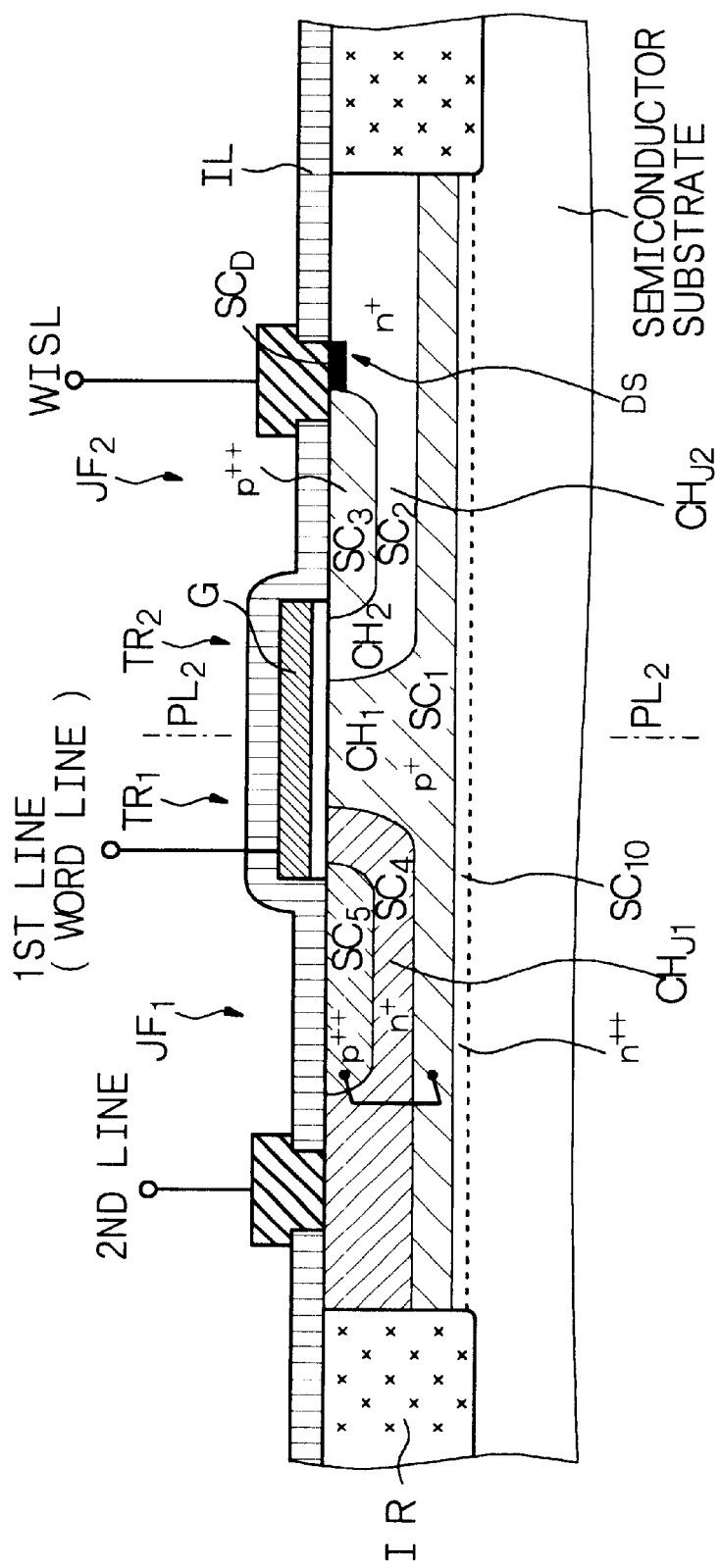
FIG. 45 is a schematic partial cross-sectional view of a variant of the semiconductor memory cell of Example 4.

A semiconductor memory cell shown in the schematic partial cross-sectional view of FIG. 42 or 45 (see FIG. 24B or 26B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the fourth line. That is, one source/drain region of the first transistor $TR_1$ is connected to the write-in information setting line WISL through the majority carrier diode DS. In the semiconductor memory cell shown in each Figure above, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line. The semiconductor memory cell shown in FIG. 42 is basically the same as the semiconductor memory cell shown in FIG. 40 in constitution. The semiconductor memory cell shown in FIG. 45 is basically the same as the semiconductor memory cell shown in FIG. 43 in constitution.

EXAMPLE 5

Figure 46:
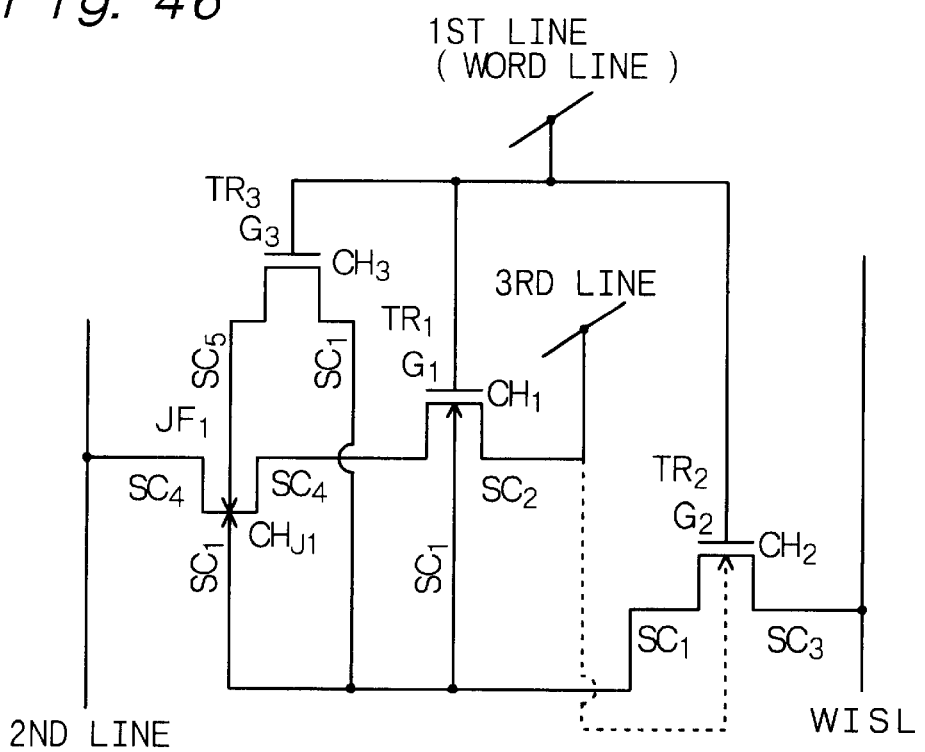
FIG. 46 is a principle-showing view of a semiconductor memory cell according to the fourth aspect of the present invention.
Figure 51:
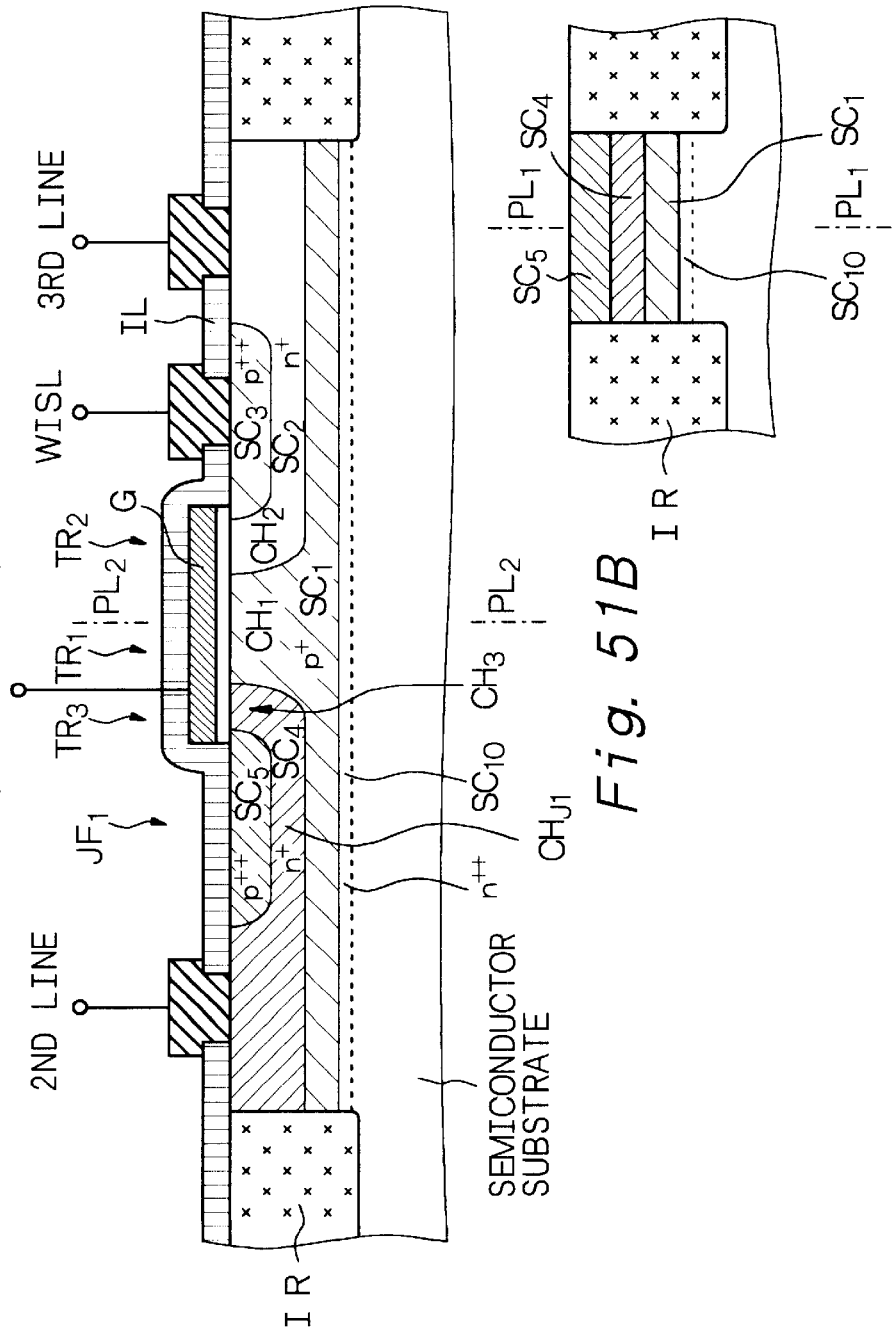
FIGS. 51A and 51B are schematic partial cross-sectional views of a semiconductor memory cell of Example 5.

Example 5 is concerned with the semiconductor memory cell according to the fourth aspect of the present invention. The semiconductor memory cell of Example 5 has a third transistor $TR_3$ for current control, and in this point, the semiconductor memory cell of Example 5 differs from the semiconductor memory cell of Example 3. FIG. 46 shows the principle of the semiconductor memory cell of Example 5, and FIGS. 51A and 51B show schematic partial cross-sectional views thereof. FIG. 51A is a partial cross-sectional view prepared by cutting the semiconductor memory cell with a first imaginary perpendicular plane (shown by a chain line $PL_1$ in FIG. 51B) which is perpendicular to the extending direction of the gate region G and passes through the center of the gate region G. FIG. 51B is a partial cross-sectional view prepared by cutting the semiconductor memory cell including a fifth region $SC_5$ with an imaginary perpendicular plane in parallel with a second imaginary perpendicular plane (shown by a chain line $PL_2$ in FIG. 51A) which is in parallel with the extending direction of the gate region G and passes through the center of the gate region G.

The semiconductor memory cell of Example 5 comprises;

(1) a first transistor $TR_1$ for readout, having source/drain regions, a channel forming region $CH_1$ and a gate region G and having a first conductivity type (for example, n channel type), (2) a second transistor $TR_2$ for switching, having source/drain regions, a channel forming region $CH_2$ and a gate region G and having a second conductivity type (for example, p channel type), (3) a third transistor $TR_3$ for current control, having source/drain regions, a channel forming region $CH_3$ and a gate region G and having the second conductivity type (for example, p channel type), and (4) a junction-field-effect transistor $JF_1$ for current control, having source/drain regions, a channel region $CH_{J1}$ and gate portions, and the semiconductor memory cell has;

(a) a semi-conductive first region $SC_1$ having a second conductivity type (for example, $p^+$ type), (b) a semi-conductive second region $SC_2$ which is formed in a surface-region of the first region $SC_1$ and has a first conductivity type (for example, $n^+$ type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$ type) or which is conductive and is made of silicide, metal or a metal compound, (d) a semi-conductive fourth region $SC_4$ which is formed in a surface region of the first region $SC_1$ and spaced from the second region $SC_2$ and which has the first conductivity type (for example, $n^+$ type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$ type) or which is conductive and is made of silicide, metal or a metal compound, and (f) a gate region G which is formed on an insulation layer so as to bridge the first region $SC_1$ and the third region $SC_3$, so as to bridge the second region $SC_2$ and the fourth region $SC_4$ and so as to bridge the first region $SC_1$ and the fifth region $SC_5$ and which is shared by the first transistor $TR_1$, the second transistor $TR_2$ and the third transistor $TR_3$.

Concerning the first transistor $TR_1$, (A-1) one source/drain region is formed of a surface region of the second region $SC_2$, (A-2) the other source/drain region is formed of a surface region of the fourth region $SC_4$, and (A-3) the channel forming region $CH_1$ is formed of a surface region of the first region $SC_1$ which surface region is interposed between or sandwiched by said surface region of the second region $SC_2$ and said surface region of the fourth region $SC_4$.

Concerning the second transistor $TR_2$, (B-1) one source/drain region is formed of said surface region of the first region $SC_1$ which surface region forms the channel forming region $CH_1$ of the first transistor $TR_1$, (B-2) the other source/drain region is formed of the third region $SC_3$, and (B-3) the channel forming region $CH_2$ is formed of said surface region of the second region $SC_2$ which surface region forms the one source/drain region of the first transistor $TR_1$.

Concerning the third transistor $TR_3$, further, (C-1) one source/drain region is formed of said surface region of the first region $SC_1$, (C-2) the other source/drain region is formed of the fifth region $SC_5$, and (C-3) the channel forming region $CH_3$ is formed of said surface region of the fourth region $SC_4$.

Concerning the junction-field-effect transistor $JF_1$, (D-1) the gate portions are formed of the fifth region $SC_5$ and a portion of the first region $SC_1$ which portion is opposed to the fifth region $SC_5$, (D-2) the channel region $CH_{J1}$ is formed of a portion of the fourth region $SC_4$ which portion is interposed between or sandwiched by the fifth region $SC_5$ and said portion of the first region $SC_1$, (D-3) one source/drain region is formed of said surface region of the fourth region $SC_4$ which surface region extends from one end of the channel region $CH_{J1}$ of the junction-field-effect transistor $JF_1$, forms the other source/drain region of the first transistor $TR_1$ and forms the channel forming region $CH_3$ of the third transistor $TR_3$, and (D-4) the other source/drain region is formed of a portion of the fourth region $SC_4$ which extends from the other end of the channel region $CH_{J1}$ of the junction-field-effect transistor $JF_1$.

Further, (E) the gate region G is connected to a first line for memory cell selection (for example, word line), (F) the third region $SC_3$ is connected to a write-in information setting line WISL, and (G) the fourth region $SC_4$ is connected to a second line.

When the semiconductor memory cell is cut with a first imaginary perpendicular plane (shown by a chain line $PL_1$ in FIG. 51B) which is perpendicular to the extending direction of the gate region G and passes through the center of the gate region G, the second region $SC_2$ and the fourth region $SC_4$ in the vicinity of the gate region G are nearly symmetrical with respect to a second imaginary perpendicular plane (shown by a chain line $PL_2$ in FIG. 51A) which is in parallel with the extending direction of the gate region G and passes through the center of the gate region G. That is, the surface region of the second region $SC_2$ and the surface region of the fourth region $SC_4$, which are positioned immediately below the gate region G, are nearly symmetrical in position with respect to the second imaginary perpendicular plane $PL_2$. Further, the depth of the second region $SC_2$ and the depth of the fourth region $SC_4$ are nearly equal to each other.

In the semiconductor memory cell of Example 5, further, when the semiconductor memory cell is cut with the first imaginary perpendicular plane $PL_1$, the third region $SC_3$ and the fifth region $SC_5$ in the vicinity of the gate region G are nearly symmetrical with respect to the second imaginary perpendicular plane $PL_2$. That is, an edge portion of the surface region of the third region $SC_3$ positioned immediately below the gate region G and an edge portion of the surface region of the fifth region $SC_5$ positioned immediately below the gate region G are nearly symmetrical in position with respect to the second imaginary perpendicular plane $PL_2$. Further, the depth of the third region $SC_3$ and the depth of the fifth region $SC_5$ are nearly equal to each other.

The junction-field-effect transistor $JF_1$ is formed by (i) optimizing the distance (thickness of the channel region $CH_{J1}$) between the opposing gate portions (the fifth region $SC_5$ and the portion of the first region $SC_1$ which portion is opposed to the fifth region $SC_5$) and (ii) optimizing impurity concentrations of the opposing gate portions (the fifth region $SC_5$ and the portion of the first region $SC_1$ which portion is opposed to the fifth region $SC_5$) and the impurity concentration of the channel region $CH_{J1}$.

In the semiconductor memory cell shown in FIGS. 51A and 51B, the second region $SC_2$ is connected to a third line. It is preferred to employ a constitution in which the second line is used as a bit line and a predetermined potential is applied to the third line, or a constitution in which the third line is used as a bit line and a predetermined potential is applied to the second line.

The semiconductor memory cell (specifically, the first region $SC_1$) is formed in the second conductivity type (for example, p type) well structure formed in, for example, an n type semiconductor substrate. And, when a high-concentration-impurity-containing layer $SC_{10}$ having the first conductivity type (for example, $n^{++}$ type) is formed immediately below the first region $SC_1$, a potential or a charge to be stored in the channel forming region $CH_1$ of the first transistor $TR_1$ for readout can be increased.

Figure 52:
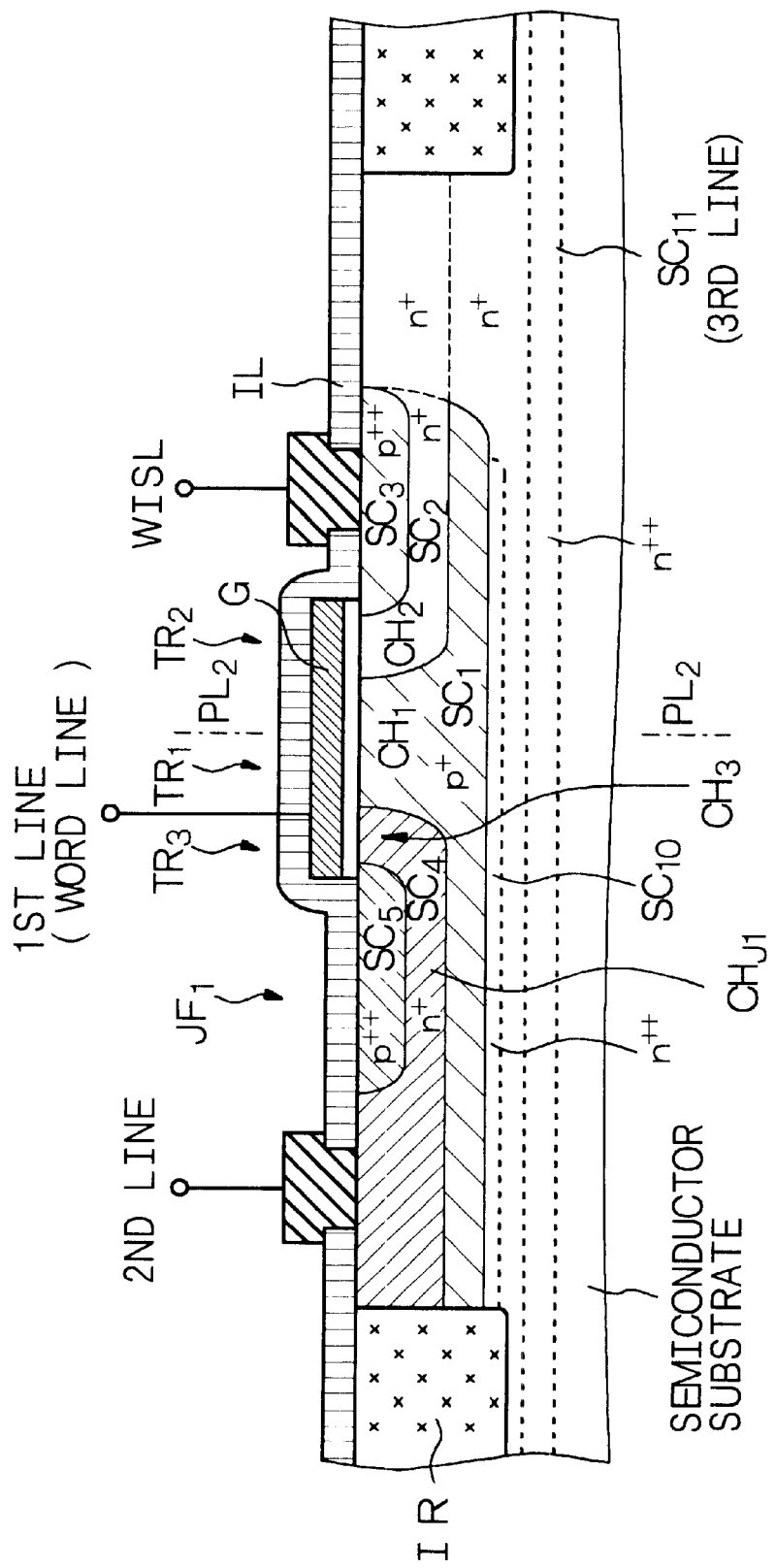
FIG. 52 is a schematic partial cross-sectional view of a variant of the semiconductor memory cell of Example 5.
Figure 53:
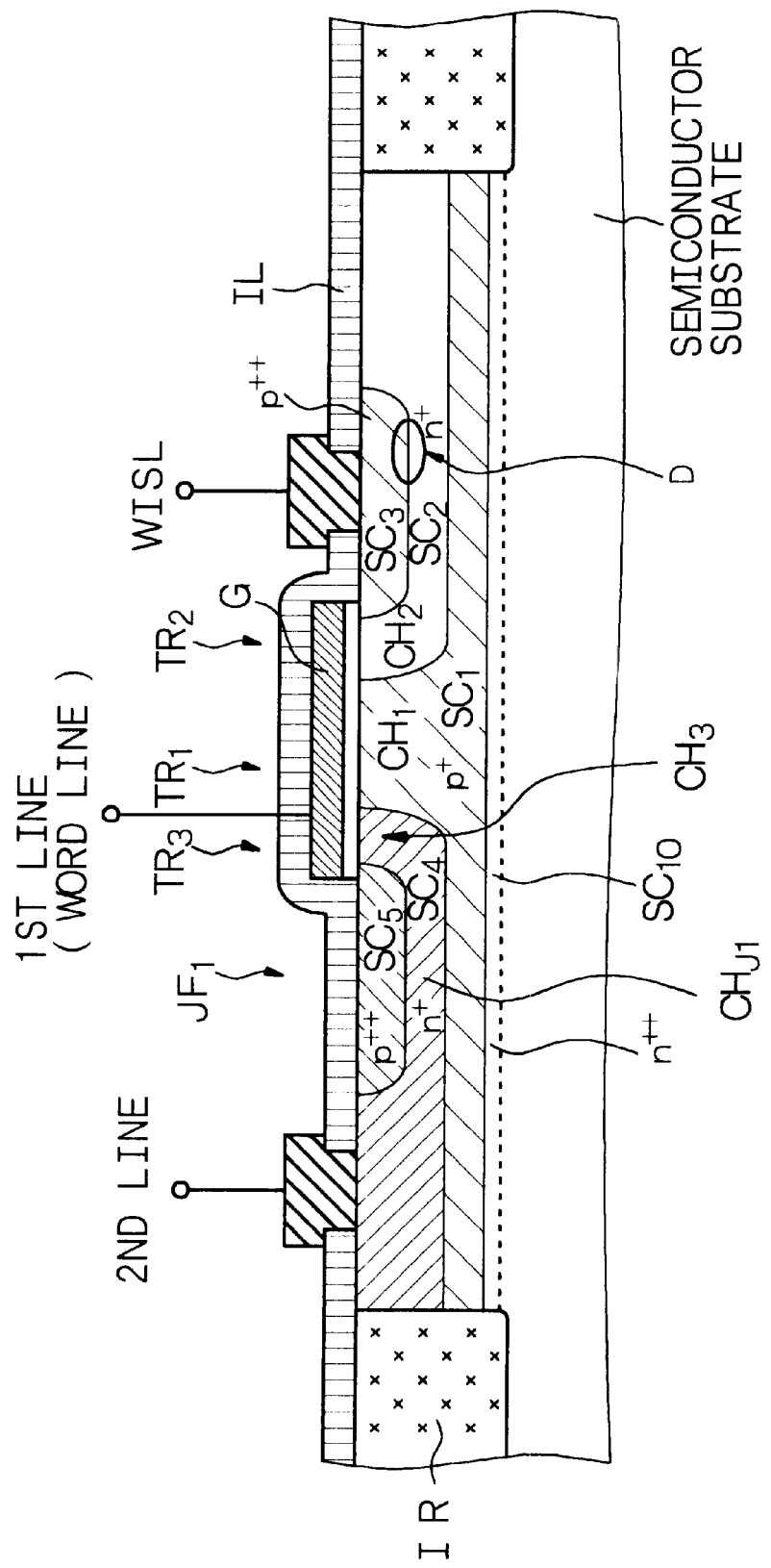
FIG. 53 is a schematic partial cross-sectional view of a variant of the semiconductor memory cell of Example 5.
Figure 54:
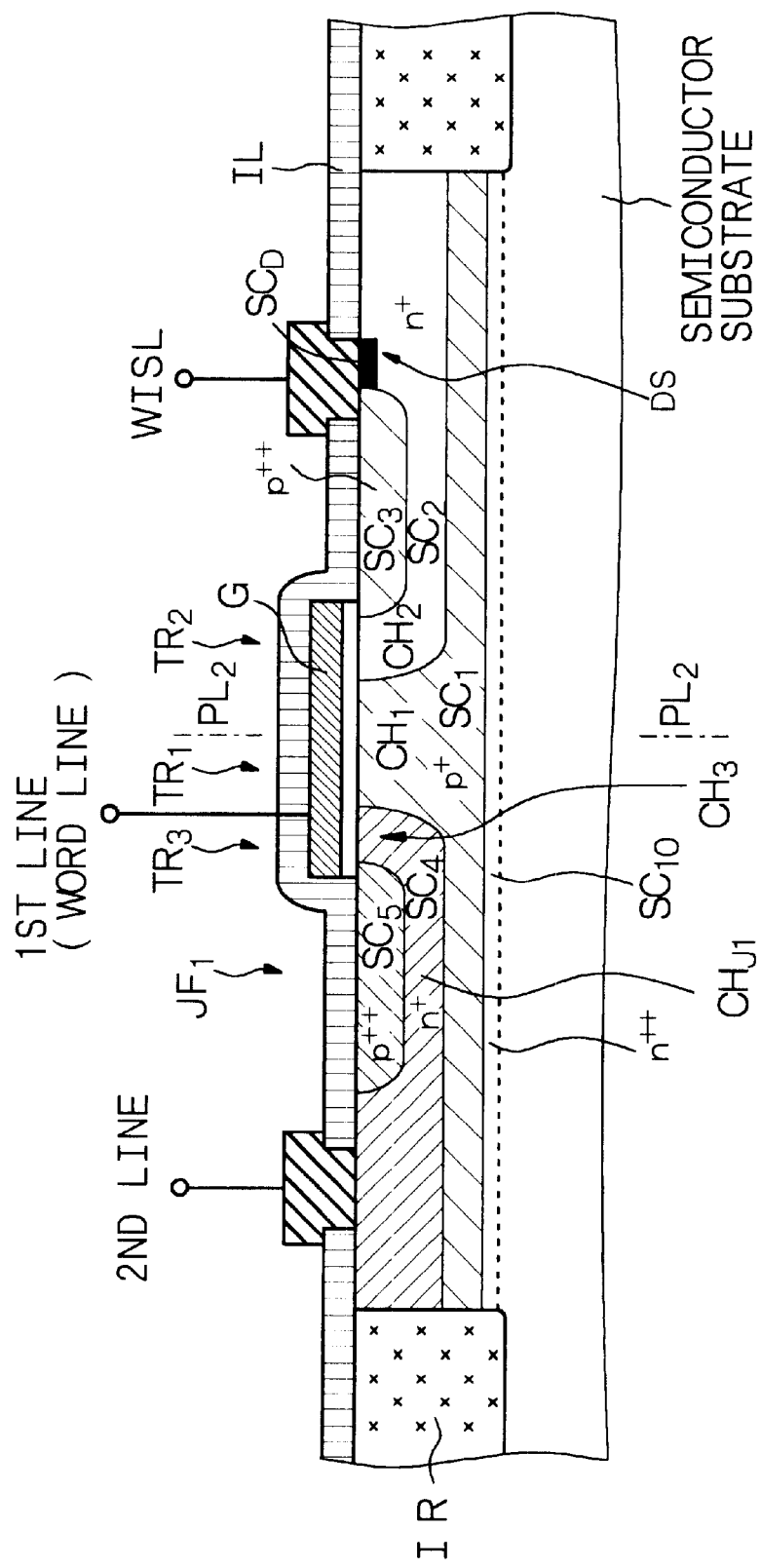
FIG. 54 is a schematic partial cross-sectional view of a variant of the semiconductor memory cell of Example 5.

FIGS. 52 to 54 show variants of the semiconductor memory cell shown in FIGS. 51A and 51B.

In a semiconductor memory cell shown in FIG. 52, a high-concentration-impurity-containing layer $SC_{11}$ which has the first conductivity type (for example, $n^{++}$ type) and works as the third line is formed below the first region $SC_1$, and the high-concentration-impurity-containing layer $SC_{11}$ is connected to the second region $SC_2$. This structure serves to simplify a wiring structure.

Figure 47A:
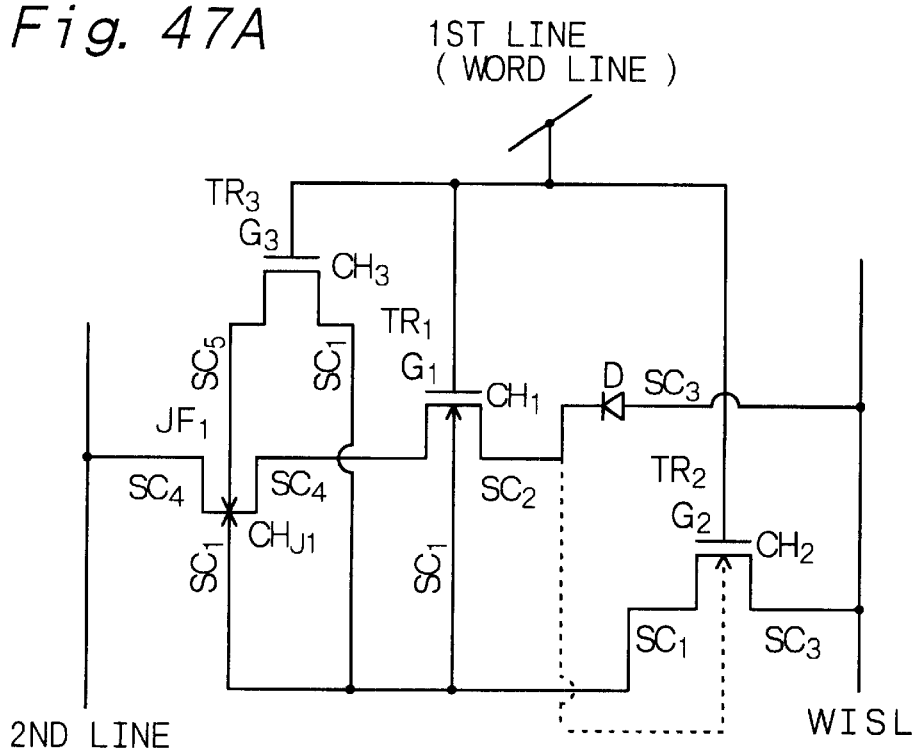
FIGS. 47A and 47B are principle-showing views of variants of the semiconductor memory cell according to the fourth aspect of the present invention.

In a semiconductor memory cell shown in the schematic:partial cross-sectional view of FIG. 53 and the principle-showing view of FIG. 47A, one source/drain region (second region $SC_2$) of the first transistor $TR_1$ is connected to the write-in information setting line WISL through a pn junction diode D in place of being connected to the third line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region SC3 by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line.

Figure 47B:
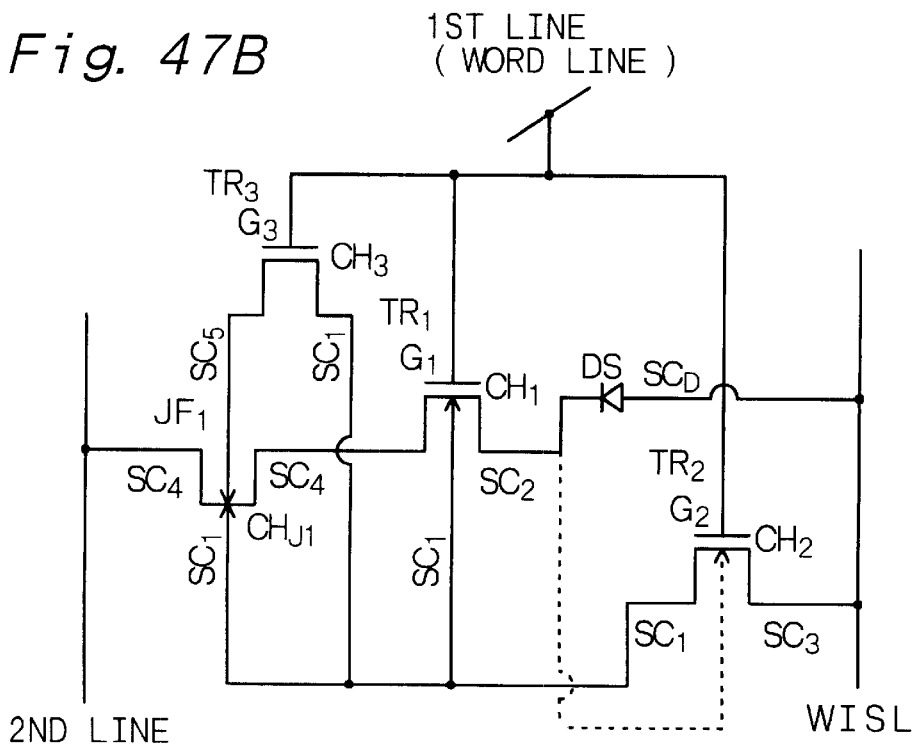

A semiconductor memory cell shown in the schematic partial cross-sectional view of FIG. 54 (see FIG. 47B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the third line. That is, one source/drain region of the first transistor $TR_1$ is connected to the write-in information setting line WISL through the majority carrier diode DS. In the semiconductor memory cell shown in FIG. 54, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line.

Figure 55:
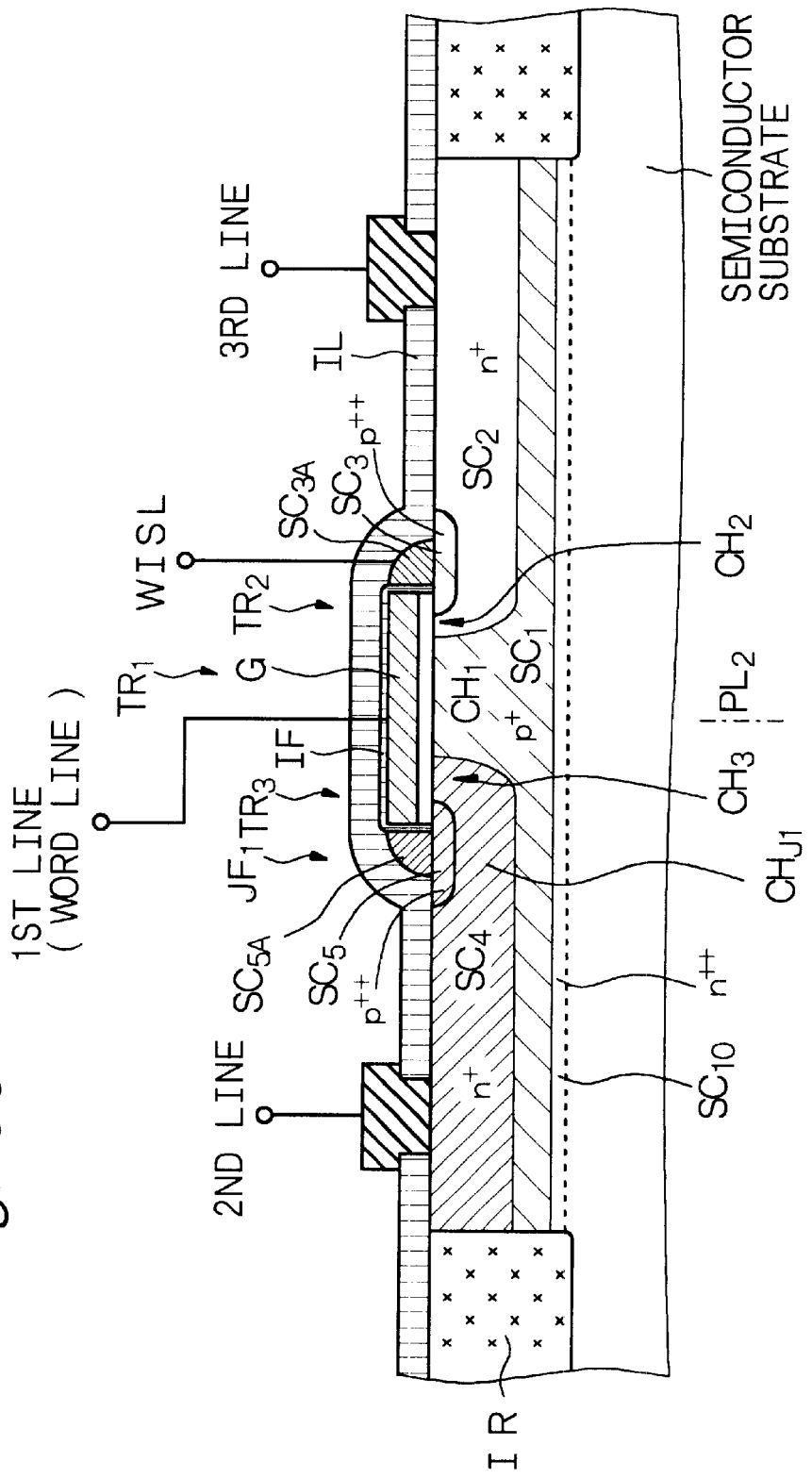
FIG. 55 is a schematic partial cross-sectional view of a variant of the semiconductor memory cell of Example 5.

A semiconductor memory cell shown in the schematic partial cross-sectional view of FIG. 55 is obtained by constitutionally modifying the third region $SC_3$ and the fifth region $SC_5$ of the semiconductor memory cell shown in the schematic partial cross-sectional view of FIGS. 51A and 51B. That is, a first impurity-containing layer $SC_{3A}$ having the second conductivity type (for example, $p^{++}$ type) is formed on the third region $SC_3$. The third region $SC_3$ is connected to the write-in information setting line WISL through the first impurity-containing layer $SC_{3A}$. The third region $SC_3$ is formed in a self-alignment manner by solid phase diffusion of a p-type impurity from the first impurity-containing layer $SC_3A$, and it has a shallow p junction. Further, the first impurity-containing layer $SC_{3A}$ is positioned on one side of the gate region G through an insulation material layer IF and has the form of a side-wall. There may be employed a constitution in which the first impurity-containing layer $SC_{3A}$ works as the write-in information setting line WISL as well. That is, the first impurity-containing layer $SC_{3A}$ extends in the direction perpendicular to a paper surface of the drawing, and an extending portion of the first impurity-containing layer $SC_{3A}$ is a first impurity-containing layer $SC_{3A}$ of an adjacent semiconductor memory cell and works as the write-in information setting line WISL. This structure serves to simplify a wiring structure and to attain the formation of a finer-structure of the semiconductor memory cell.

A second impurity-containing layer $SC_{5A}$ having the second conductivity type (for example, $p^{++}$ type) is formed on the fifth region $SC_5$. The fifth region $SC_5$ is formed in a self-alignment manner by solid phase diffusion of a p-type impurity from the second impurity-containing layer $SC_{5A}$, and it has a shallow p junction. Further, the second impurity-containing layer $SC_{5A}$ is positioned on the other side of the gate region G through the insulation material layer IF, and has the form of a side-wall.

The third region $SC_3$ and the fifth region $SC_5$ of each of the semiconductor memory cells shown in FIGS. 51 to 54 and semiconductor memory cells shown in FIGS. 56 to 58 to be discussed later may be replaced with a constitution of the impurity-containing layers $SC_{3A}$ and $SC_{5A}$, the third region $SC_3$ and the fifth region $SC_5$ of the semiconductor memory cell shown in FIG. 55.

EXAMPLE 6

Figure 48:
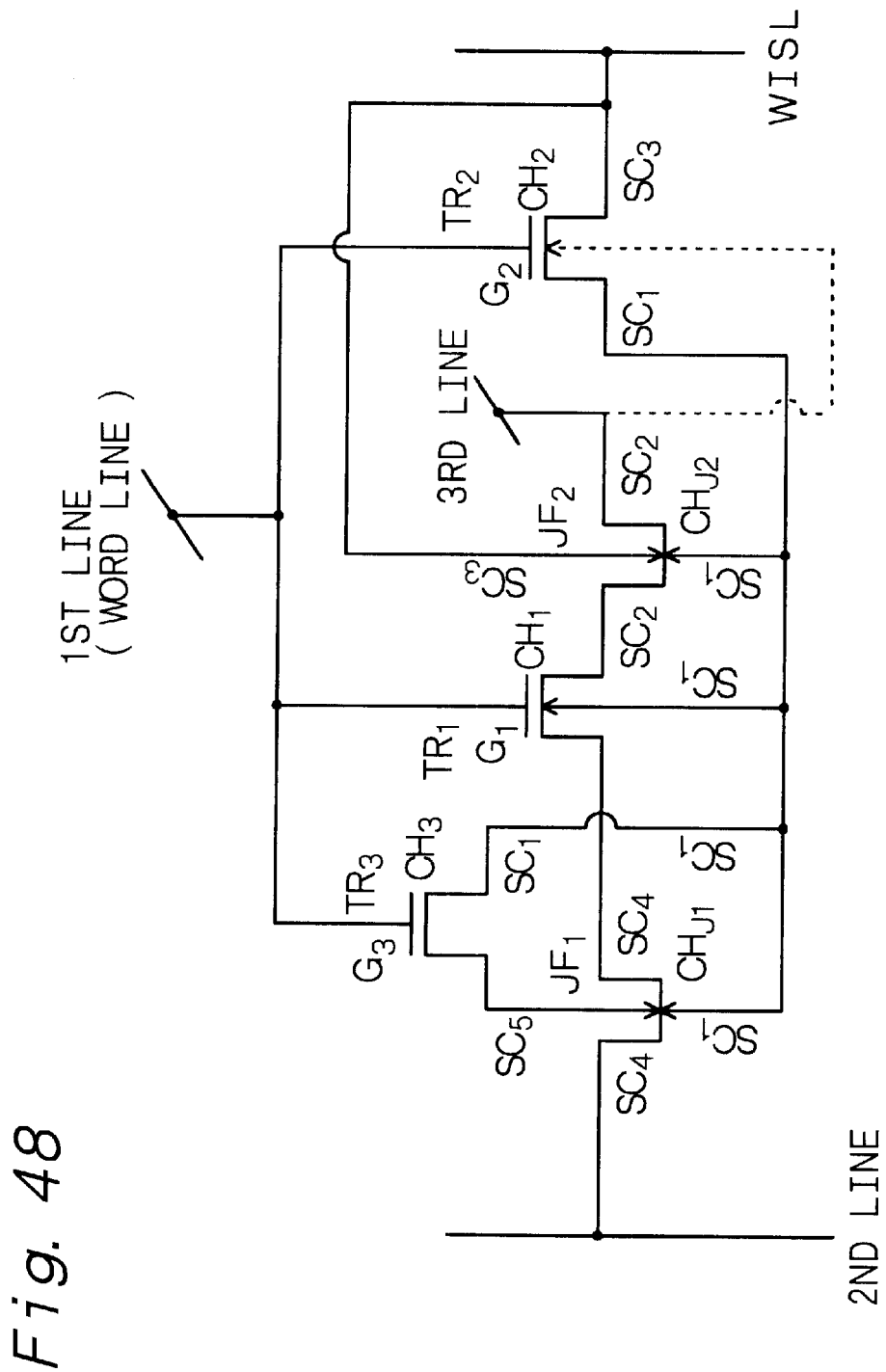
FIG. 48 is a principle-showing view of a variant of the semiconductor memory cell according to the fourth aspect of the present invention.

The semiconductor memory cell of Example 6 is a variant of the semiconductor of Example 5. The semiconductor memory cell of Example 6 differs from the semiconductor memory cell of Example 5 in that a second junction-field-effect transistor $JF_2$ is formed of the first region $SC_1$, the second region $SC_2$ and the third region $SC_3$. That is, as shown in the principle-showing view of FIG. 48 and the schematic partial cross-sectional view of FIG. 56, the semiconductor memory cell of Example 6 further has;

a second junction-field-effect transistor $JF_2$ for current control, having source/drain regions, a channel region $CHJ_2$ and gate portions, wherein;

the gate portions of the second junction-field-effect transistor $JF_2$ are formed of the third region $SC_3$ and a portion of the first region $SC_1$ which portion is opposed to the third region $SC_3$, the channel region $CH_{J2}$ of the second junction-field-effect transistor $JF_2$ is formed of a portion of the second region $SC_2$ which portion is interposed between or sandwiched by the third region $SC_3$ and said portion of the first region $SC_1$, one source/drain region of the second junction-field-effect transistor $JF_2$ is formed of a surface region of the second region $SC_2$ which surface region extends from one end of the channel region $CH_{J2}$ of the second junction-field-effect transistor $JF_2$ and forms the one source/drain region of the first transistor $TR_1$, and the other source/drain region of the second junction-field-effect transistor $JF_2$ is a portion of the second region $SC_2$ which portion extends from the other end of the channel region $CH_{J2}$ of the second junction-field-effect transistor $JF_2$.

The semiconductor memory cell of Example 6 is substantially the same as the semiconductor memory cell of Example 5 shown in FIGS. 51A and 51B in other constitutions, so that detailed explanations thereof are therefore omitted.

The second junction-field-effect transistor $JF_2$ is formed by (iii) optimizing the distance (thickness of the channel region $CH_{J2}$) between the opposing gate portions (the third region $SC_3$ and the portion of the first region $SC_1$ which portion is opposed to the third region $SC_3$) and (iv) optimizing impurity concentrations of the opposing gate portions (the third region $SC_3$ and the portion of the first region $SC_1$ which portion is opposed to the third region $SC_3$) and the impurity concentration of the channel region $CH_{J2}$.

Figure 56:
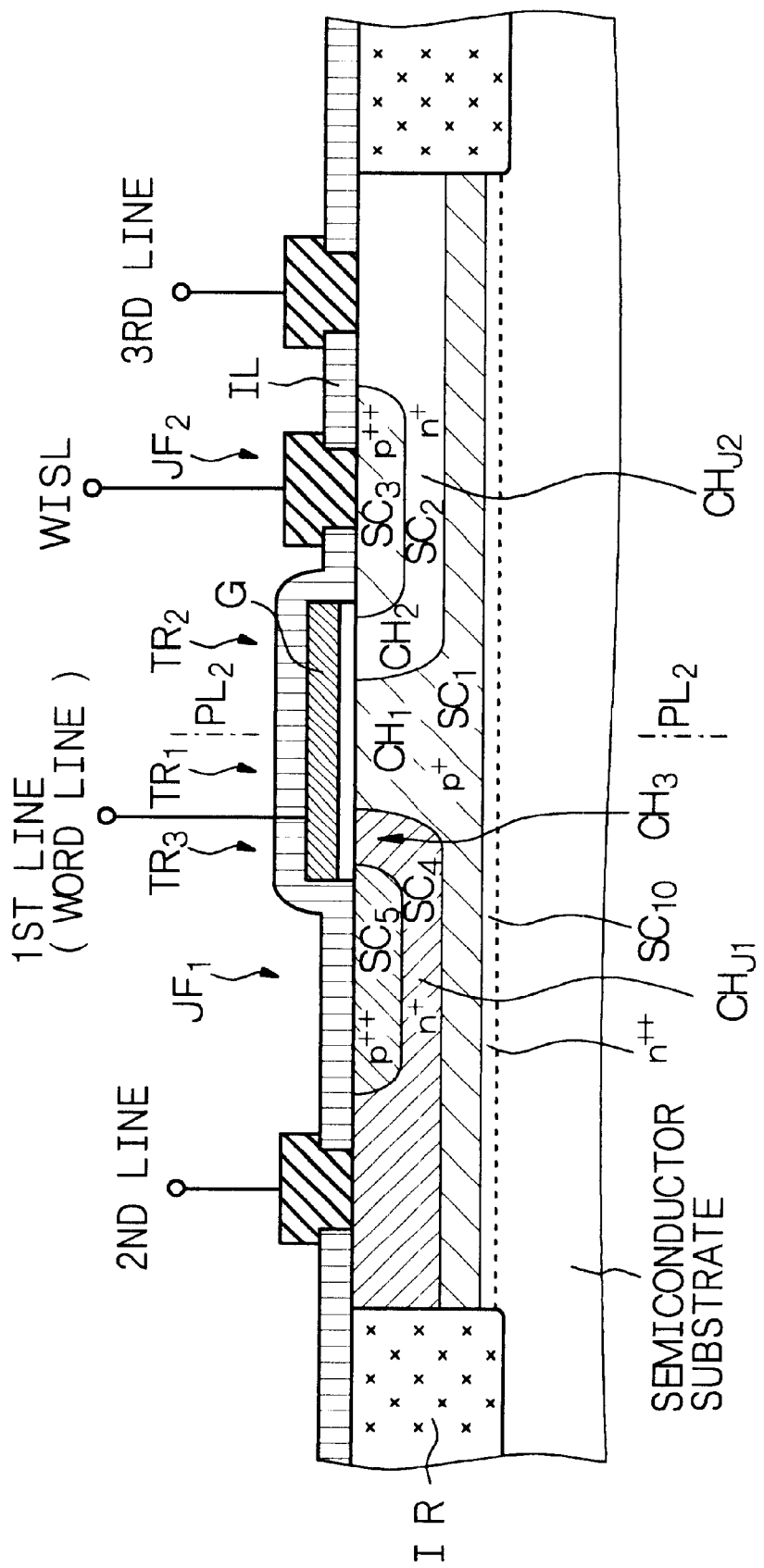
FIG. 56 is a schematic partial cross-sectional view of a semiconductor memory cell of Example 6.
Figure 57:
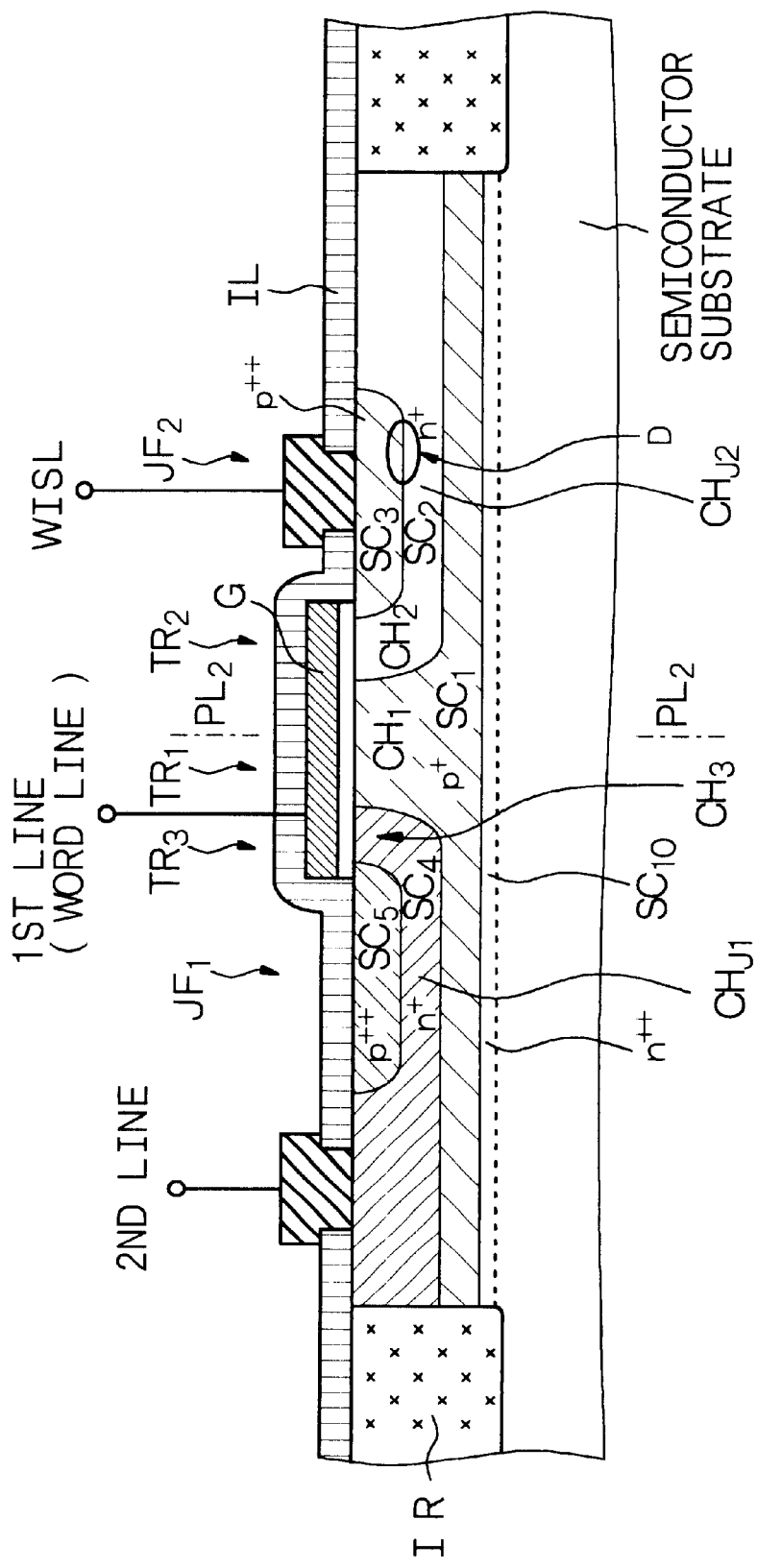
FIG. 57 is a schematic partial cross-sectional view of a variant of the semiconductor memory cell of Example 6.
Figure 58:
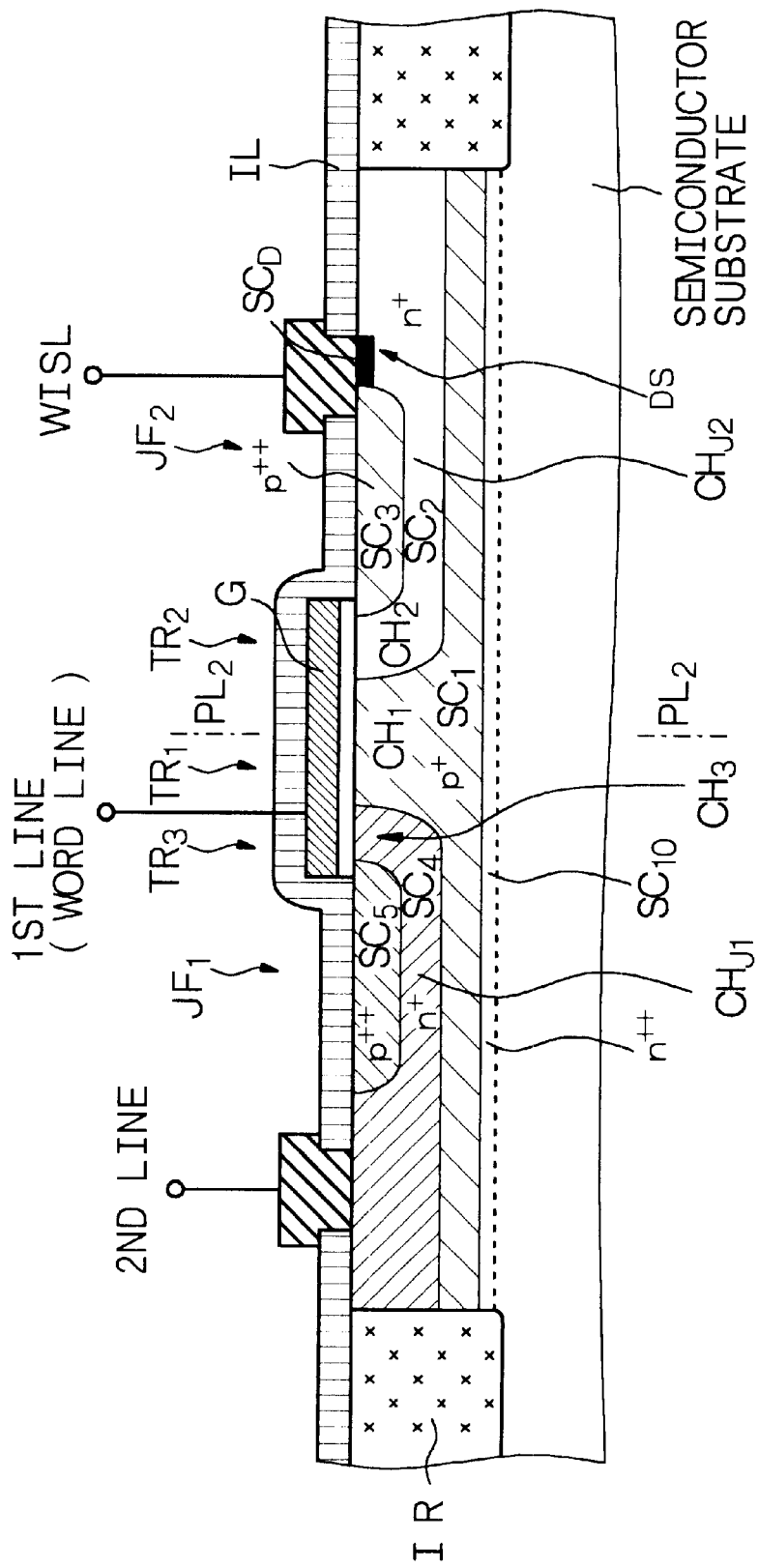
FIG. 58 is a schematic partial cross-sectional view of a variant of the semiconductor memory cell of Example 6.

FIGS. 57 and 58 show variants of the semiconductor memory cell shown in FIG. 56.

Figure 49:
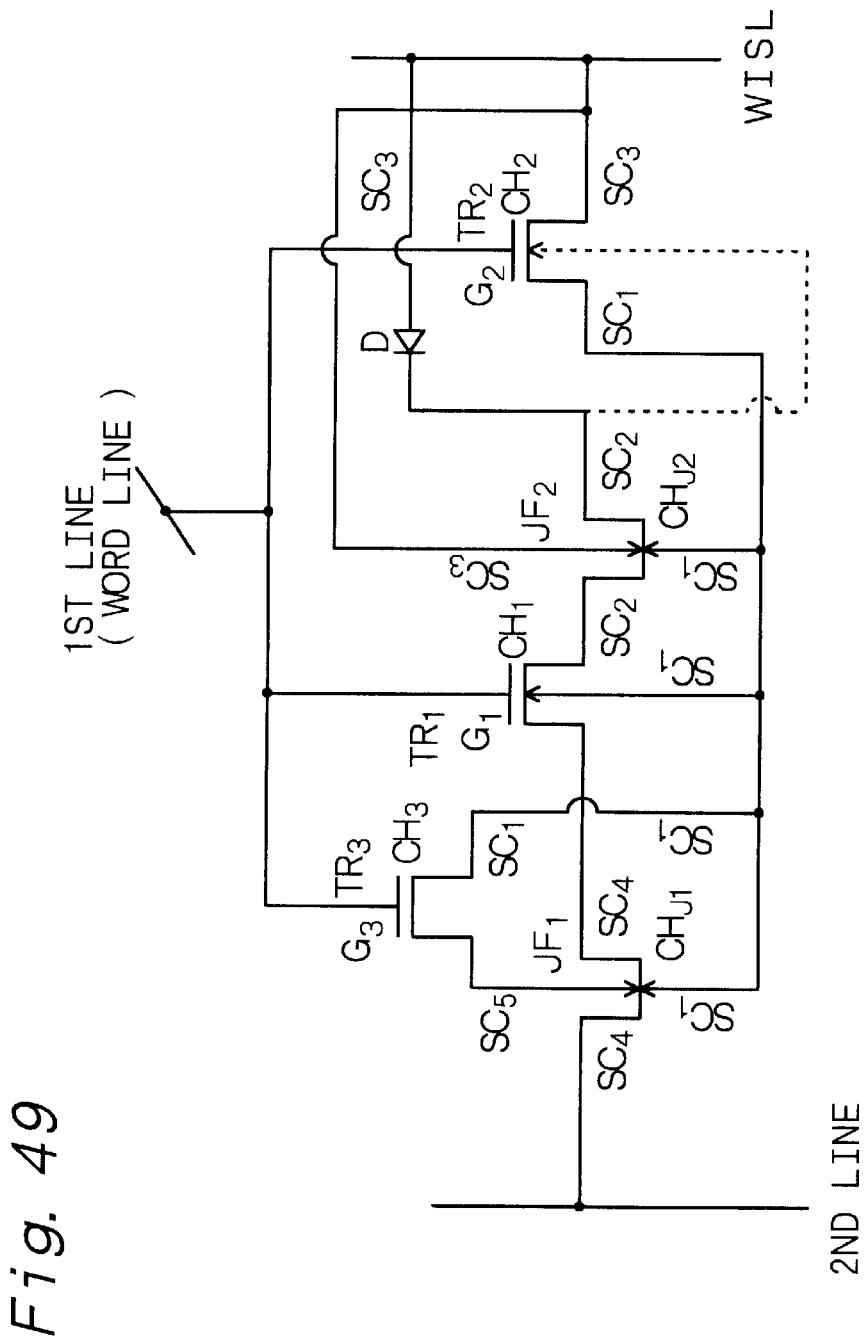
FIG. 49 is a principle-showing view of a variant of the semiconductor memory cell according to the fourth aspect of the present invention.

In a semiconductor memory cell shown in the schematic partial cross-sectional view of FIG. 57 and the principle-showing view of FIG. 49, one source/drain region (second region $SC_2$) of the first transistor $TR_1$ is connected to the write-in information setting line WISL through a pn junction diode D in place of being connected to the third line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line.

Figure 50:
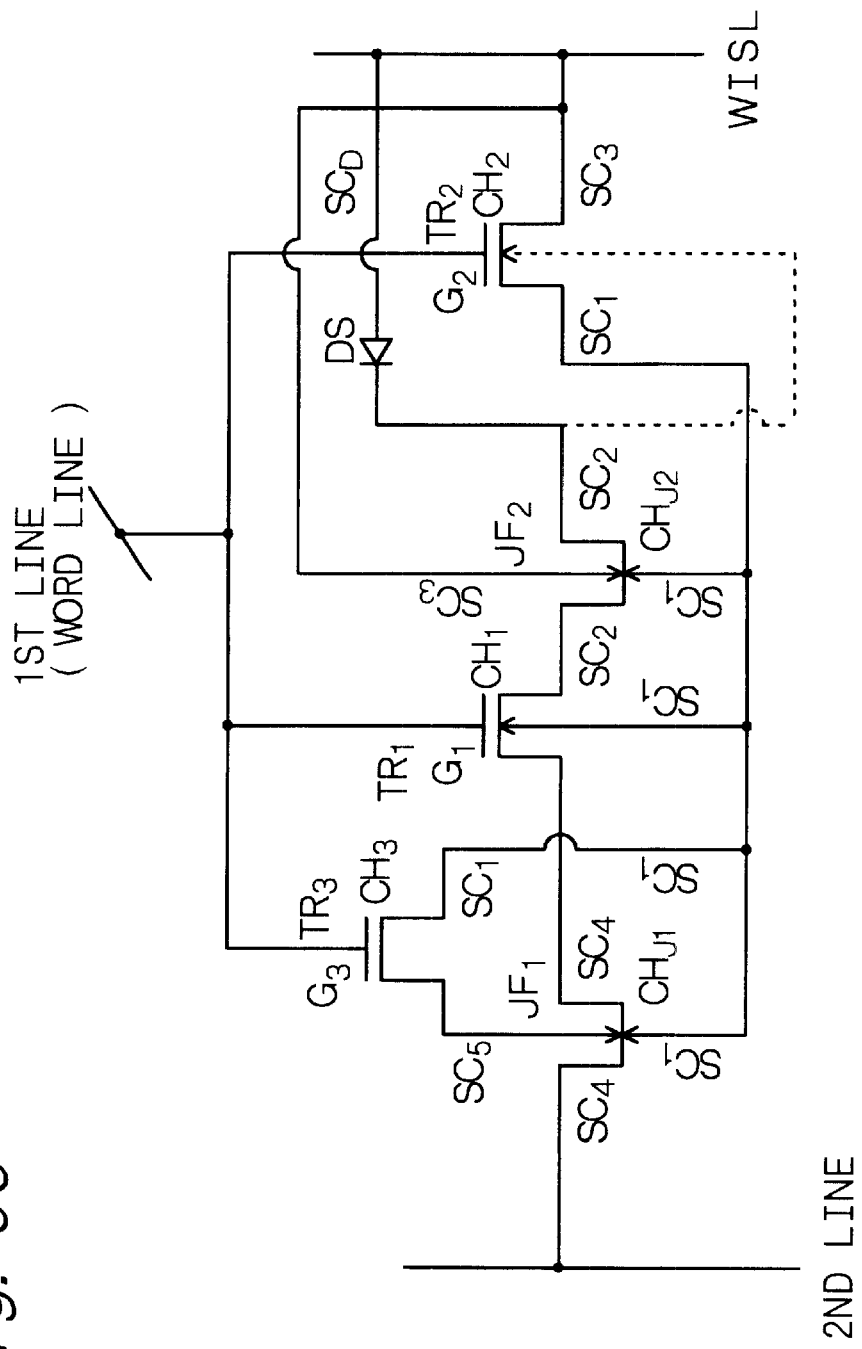
FIG. 50 is a principle-showing view of a variant of the semiconductor memory cell according to the fourth aspect of the present invention.

A semiconductor memory cell shown in the schematic partial cross-sectional view of FIG. 58 (see FIG. 50 for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the third line. That is, one source/drain region of the first transistor $TR_1$ is connected to the write-in information setting line WISL through the majority carrier diode DS. In the semiconductor memory cell shown in FIG. 58, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line.

EXAMPLE 7

Example 7 is concerned with the semiconductor memory cell according to the fifth aspect of the present invention.

Figure 59:
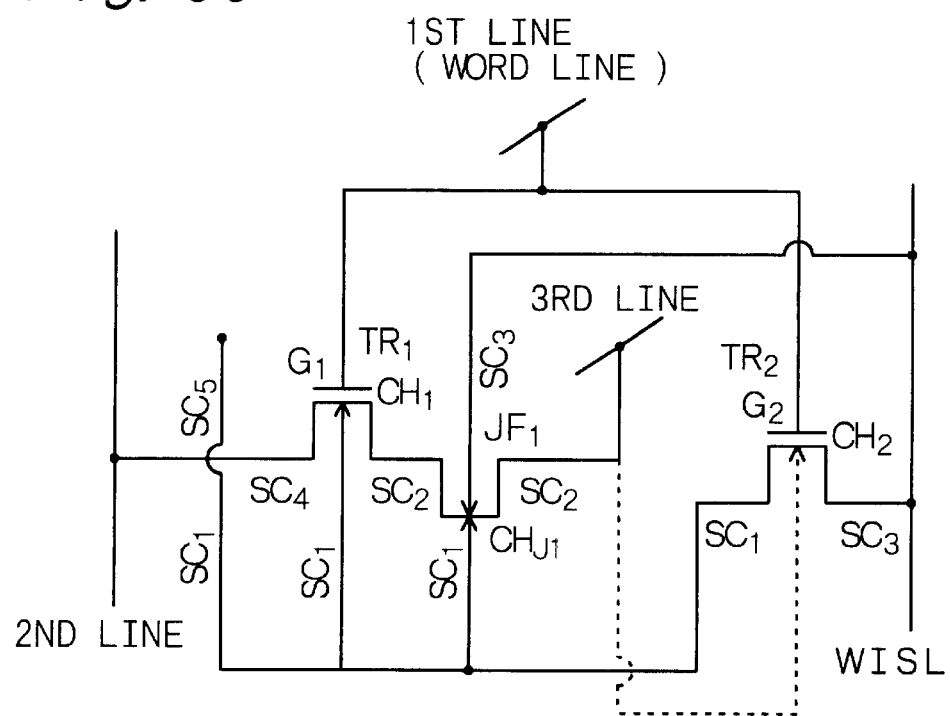
FIG. 59 is a principle-showing view of a semiconductor memory cell according to the fifth aspect of the present invention.

The semiconductor memory cell of Example 7 differs from the semiconductor memory cell of Example 3 in a position where the junction-field-effect transistor $JF_1$ is formed. FIG. 59 shows a principle-showing view of the semiconductor memory cell of Example 7, and FIGS. 61A and 61B show schematic partial cross-sectional views thereof. FIG. 61A is a partial cross-sectional view prepared by cutting the semiconductor memory cell with a first imaginary perpendicular plane (shown by a chain line $PL_1$ in FIG. 61B) which is perpendicular to the extending direction of the gate region G and passes through the center of the gate region G. FIG. 61B is a partial cross-sectional view prepared by cutting the semiconductor memory cell including a fifth region $SC_5$ with an imaginary perpendicular plane in parallel with a second imaginary perpendicular plane (shown by a chain line $PL_2$ in FIG. 61A) which is in parallel with the extending direction of the gate region G and passes through the center of the gate region G.

The semiconductor memory cell of Example 7 comprises;

(1) a first transistor $TR_1$ for readout, having source/drain regions, a channel forming region $CH_1$ and a gate region G and having a first conductivity type (for example, n channel type), (2) a second transistor $TR_2$ for switching, having source/drain regions, a channel forming region $CH_2$ and a gate region G and having a second conductivity type (for example, p channel type), and (3) a junction-field-effect transistor $JF_1$ having source/drain regions, a channel region $CH_{J1}$ and gate portions, and the semiconductor memory cell has;

(a) a semi-conductive first region $SC_1$ having a second conductivity type (for example, $p^+$ type), (b) a semi-conductive second region $SC_2$ which is formed in a surface region of the first region $SC_1$ and has a first conductivity type (for example, $n^+$ type), (c) a third region $SC_3$ which is formed in a surface region of the second region $SC_2$ and is in contact with the second region $SC_2$ so as to form a rectifier junction together with the second region $SC_2$, the third region $SC_3$ being a region which is semi-conductive and has the second conductivity type (for example, $p^{++}$ type) or which is conductive and is made of silicide, metal or a metal compound, (d) a semi-conductive fourth region $SC_4$ which is formed in a surface region of the first region $SC_1$ and is spaced from the second region $SC_2$ and which has the first conductivity type (for example, $n^+$ type), (e) a fifth region $SC_5$ which is formed in a surface region of the fourth region $SC_4$ and is in contact with the fourth region $SC_4$ so as to form a rectifier junction together with the fourth region $SC_4$, the fifth region $SC_5$ being a region which is semi-conductive and has the second conductivity type (for example, $p^{++}$ type) or which is conductive and is made of silicide, metal or a metal compound, and (f) a gate region G which is formed on an insulation layer so as to bridge the first region $SC_1$ and the third region $SC_3$ and so as to bridge the second region $SC_2$ and the fourth region $SC_4$ and which is shared by the first transistor $TR_1$ and the second transistor $TR_2$.

Concerning the first transistor $TR_1$, (A-1) one source/drain region is formed of a surface region of the second region $SC_2$, (A-2) the other source/drain region is formed of a surface region of the fourth region $SC_4$, and (A-3) the channel forming region $CH_1$ is formed of a surface region of the first region $SC_1$ which surface region is interposed between or sandwiched by said surface region of the second region $SC_2$ and said surface region of the fourth region $SC_4$.

Concerning the second transistor $TR_2$, (B-1) one source/drain region is formed of said surface region of the first region $SC_1$ which surface region forms the channel forming region $CH_1$ of the first transistor $TR_1$, (B-2) the other source/drain region is formed of the third region $SC_3$, and (B-3) the channel forming region $CH_2$ is formed of said surface region of the second region $SC_2$ which surface region forms the one source/drain of the first transistor $TR_1$.

Concerning the junction-field-effect transistor $JF_1$, further, (C-1) the gate portions are formed of the third region $SC_3$ and a portion of the first region $SC_1$ which portion is opposed to the third region $SC_3$, (C-2) the channel region $CH_{J1}$ is formed of a portion of the second region $SC_2$ which portion is interposed between or sandwiched by the third region $SC_3$ and said portion of the first region $SC_1$, (C-3) one source/drain region is formed of said surface region of the second region $SC_2$ which surface region extends from one end of the channel region $CH_{J1}$ of the junction-field-effect transistor $JF_1$ and forms the one source/drain region of the first transistor $TR_1$, and (C-4) the other source/drain region is formed of a portion of the second region $SC_2$ which portion extends from the other end of the channel region $CH_{J1}$ of the junction-field-effect transistor $JF_1$.

Further, (D) the gate region G is connected to a first line for memory cell selection (for example, word line), (E) the third region $SC_3$ is connected to a write-in information setting line WISL, (F) the fourth region $SC_4$ is connected to a second line, and (G) the fifth region $SC_5$ is connected to the first region $SC_1$.

When the semiconductor memory cell is cut with a first imaginary perpendicular plane (shown by a chain line $PL_1$ in FIG. 61B) which is perpendicular to the extending direction of the gate region G and passes through the center of the gate region G, the second region $SC_2$ and the fourth region $SC_4$ in the vicinity of the gate region G are nearly symmetrical with respect to a second imaginary perpendicular plane (shown by a chain line $PL_2$ in FIG. 61A) which is in parallel with the extending direction of the gate region G and passes through the center of the gate region G. That is, the surface region of the second region $SC_2$ and the surface region of the fourth region $SC_4$, which are positioned immediately below the gate region G, are nearly symmetrical in position with respect to the second imaginary perpendicular plane $PL_2$. Further, the depth of the second region $SC_2$ and the depth of the fourth region $SC_4$ are nearly equal to each other.

In the semiconductor memory cell of Example 7, further, when the semiconductor memory cell is cut with the first imaginary perpendicular plane $PL_1$, the third region $SC_3$ and the fifth region $SC_5$ in the vicinity of the gate region G are nearly symmetrical with respect to the second imaginary perpendicular plane $PL_2$. That is, an edge portion of the surface region of the third region $SC_3$ positioned immediately below the gate region G and an edge portion of the surface region of the fifth region $SC_5$ positioned immediately below the gate region G are nearly symmetrical in position with respect to the second imaginary perpendicular plane $PL_2$. Further, the depth of the third region $SC_3$ and the depth of the fifth region $SC_5$ are nearly equal to each other.

The first region $SC_1$ and the fifth region $SC_5$ can be connected to each other, for example, by forming a structure in which part of the first region $SC_1$ is extended up to a vicinity of the surface of a semiconductor substrate and the fifth region $SC_5$ and the extending portion of the first region $SC_1$ come in contact with each other outside the fourth region $SC_4$, as shown in FIG. 61B. When the semiconductor memory cell is so structured, a region where information is to be stored can be increased, and the length of a time period for which the semiconductor memory cell retains information can be increased.

The junction-field-effect transistor $JF_1$ is formed by (i) optimizing the distance (thickness of the channel region $CH_{J1}$) between the opposing gate portions (the third region $SC_3$ and the portion of the first region $SC_1$ which portion is opposed to the third region $SC_3$) and (ii) optimizing impurity concentrations of the opposing gate portions (the third region $SC_3$ and the portion of the first region $SC_1$ which portion is opposed to the third region $SC_3$) and the impurity concentration of the channel region $CH_{J1}$.

In the semiconductor memory cell shown in FIGS. 61A and 61B, the second region $SC_2$ is connected to a third line. It is preferred to employ a constitution in which the second line is used as a bit line and a predetermined potential is applied to the third line, or a constitution in which the third line is used as a bit line and a predetermined potential is applied to the second line.

The semiconductor memory cell (specifically, the first region $SC_1$) is formed in the second conductivity type (for example, p type) well structure formed in, for example, an n type semiconductor substrate. And, when a high-concentration-impurity-containing layer $SC_{10}$ having the first conductivity type (for example, $n^{++}$ type) is formed immediately below the first region $SC_1$, a potential or a charge to be stored in the channel forming region $CH_1$ of the first transistor $TR_1$ for readout can be increased.

FIGS. 62 to 65 show variants of the semiconductor memory cell shown in FIGS. 61A and 61B.

Figure 62:
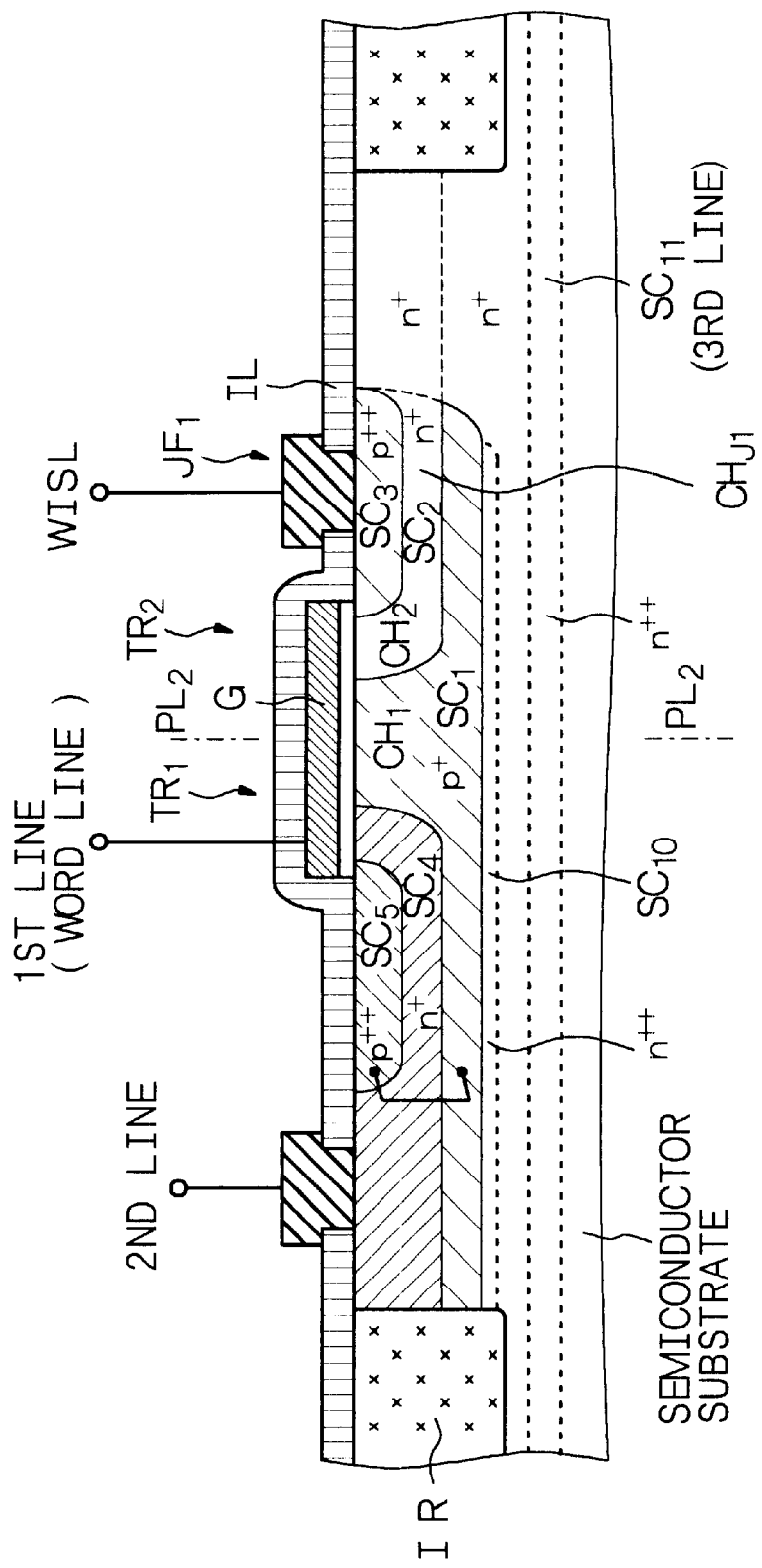
FIG. 62 is a schematic partial cross-sectional view of a variant of the semiconductor memory cell of Example 7.

In a semiconductor memory cell shown in FIG. 62, a high-concentration-impurity-containing layer $SC_{11}$ which has the first conductivity type (for example, $n^{++}$ type) and works as the third line is formed below the first region $SC_1$, and the high-concentration-impurity-containing layer $SC_1$, is connected to the second region $SC_2$. This structure serves to simplify a wiring structure.

Figure 60A:
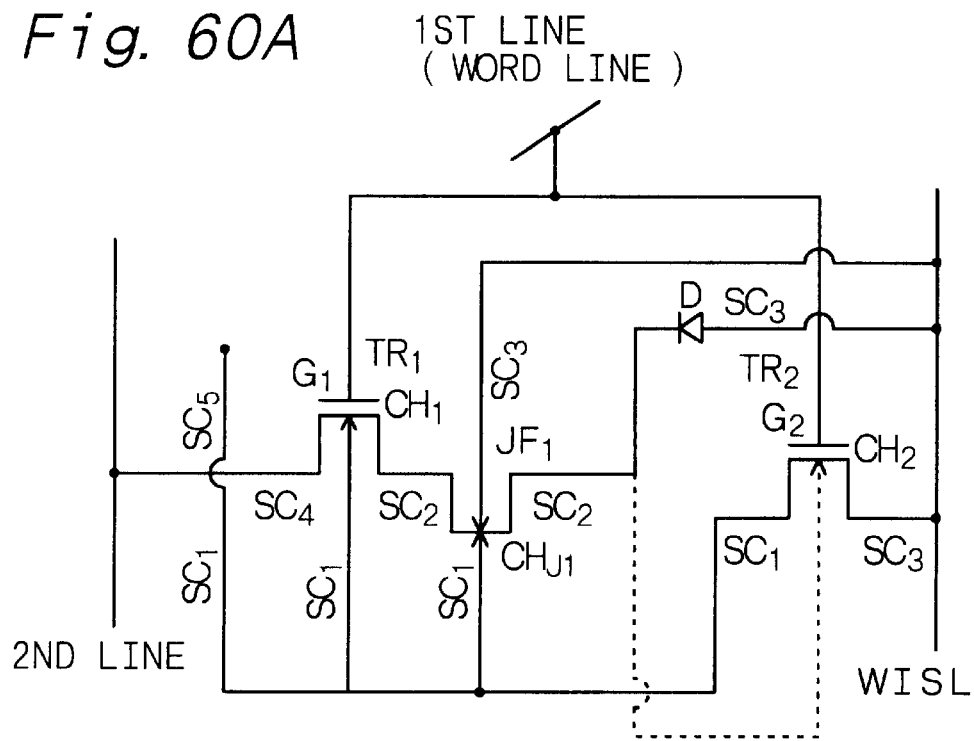
FIGS. 60A and 60B are principle-showing views of variants of the semiconductor memory cell according to the fifth aspect of the present invention.
Figure 63:
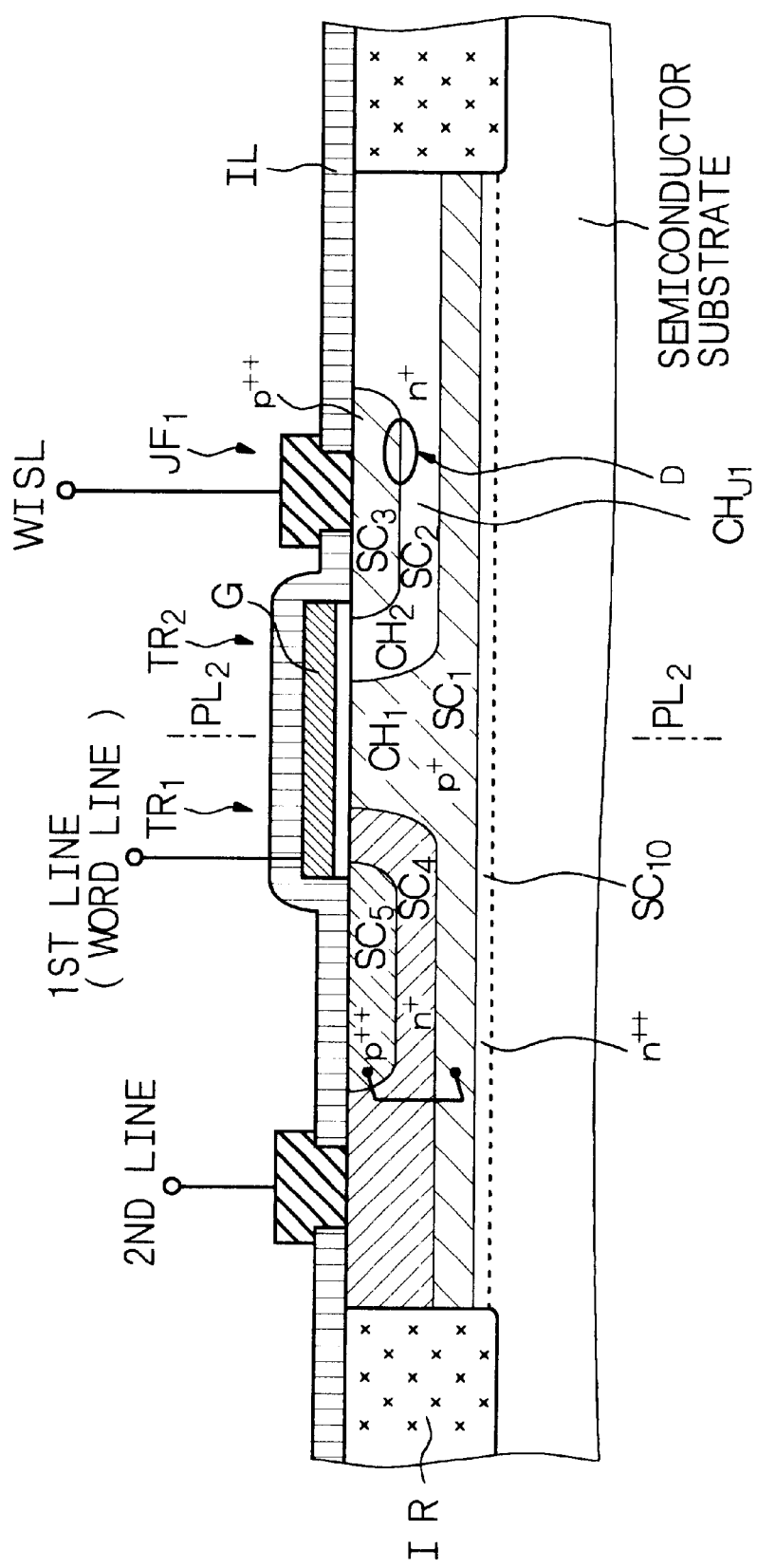
FIG. 63 is a schematic partial cross-sectional view of a variant of the semiconductor memory cell of Example 7.

In a semiconductor memory cell shown in the schematic partial cross-sectional view of FIG. 63 and the principle-showing view of FIG. 60A, one source/drain region (second region $SC_2$) of the first transistor $TR_1$ is connected to the write-in information setting line WISL through a pn junction diode D in place of being connected to the third line. That is, the pn junction diode D is formed between or formed of the second region $SC_2$ and the third region $SC_3$, and the second region $SC_2$ is connected to the write-in information setting line WISL through the third region $SC_3$. The pn junction diode D can be formed between or formed of the second region $SC_2$ and the third region $SC_3$ by optimizing impurity concentrations of the second region $SC_2$ and the third region $SC_3$. There may be employed a constitution in which the second line is used as a bit line or a constitution in which the write-in information setting line WISL is used as a bit line as well and a predetermined potential is applied to the second line.

Figure 60B:
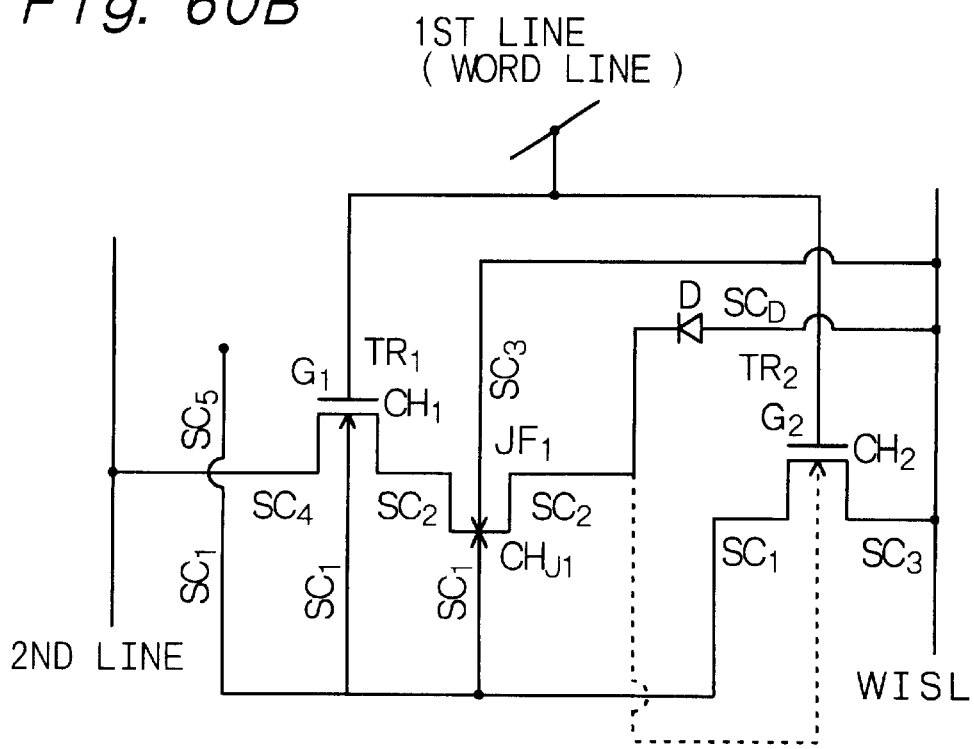
Figure 64:
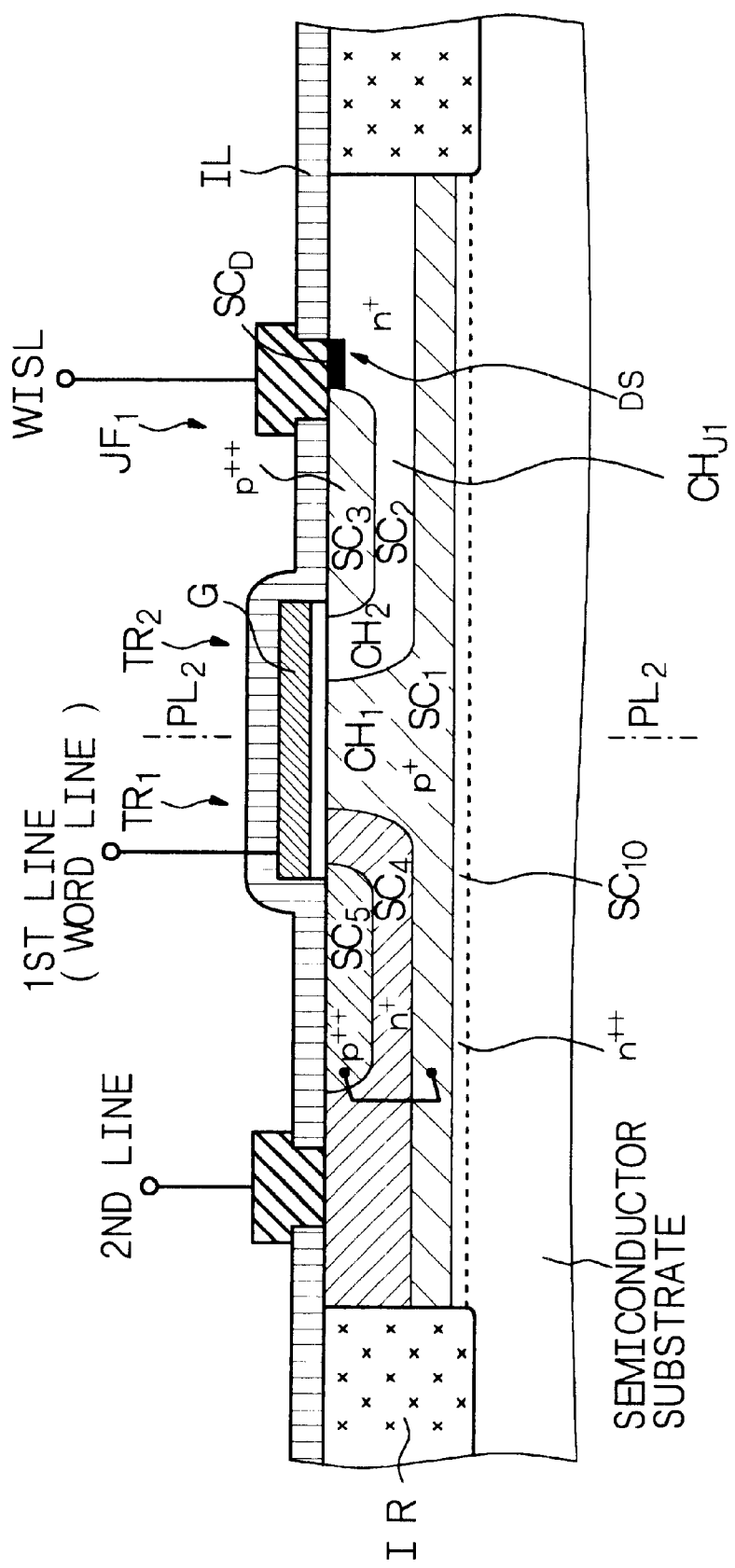
FIG. 64 is a schematic partial cross-sectional view of a variant of the semiconductor memory cell of Example 7.

A semiconductor memory cell shown in the schematic partial cross-sectional view of FIG. 64 (see FIG. 60B for the principle thereof) further has a majority carrier diode DS formed of the second region $SC_2$ and a diode-constituting region $SC_D$ which is in contact with a surface region of the second region $SC_2$ so as to form a rectifier junction together with the second region $SC_2$. The second region $SC_2$ is connected to the write-in information setting line WISL through the diode-constituting region $SC_D$ in place of being connected to the third line. That is, one source/drain region of the first transistor $TR_1$ is connected to the write-in information setting line WISL through the majority carrier diode DS. In the semiconductor memory cell shown in FIG. 64, the diode-constituting region $SC_D$ is formed adjacently to the third region $SC_3$, while the layout thereof shall not be limited to such a layout. There may be employed a constitution in which the second line is used as a bit line or a constitution in which the write-in information setting line WISL is used as a bit line as well and a predetermined potential is applied to the second line.

Figure 65:
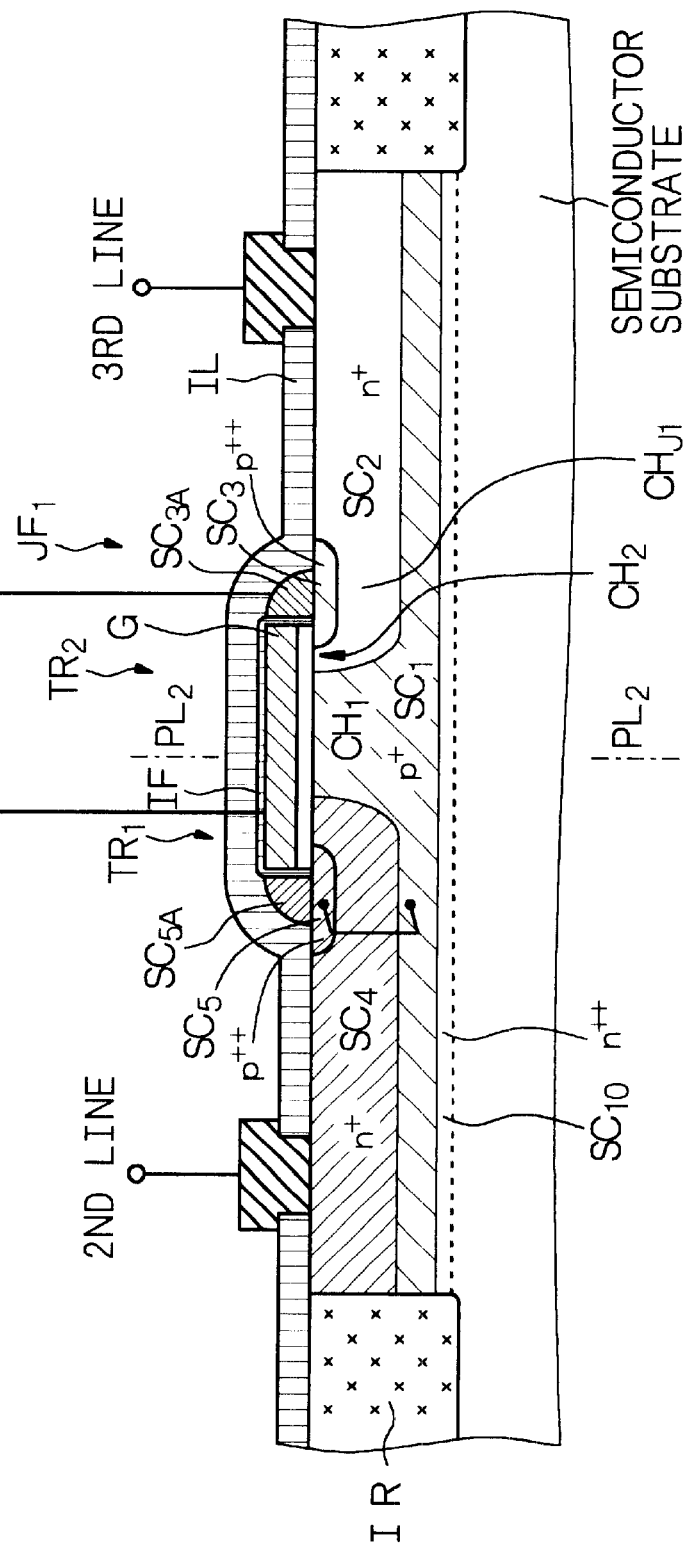
FIG. 65 is a schematic partial cross-sectional view of a variant of the semiconductor memory cell of Example 7.

A semiconductor memory cell shown in the schematic partial cross-sectional view of FIG. 65 is obtained by constitutionally modifying the third region $SC_3$ and the fifth region $SC_5$ of the semiconductor memory cell shown in the schematic partial cross-sectional view of FIGS. 61A and 61B. That is, a first impurity-containing layer $SC_{3A}$ having the second conductivity type (for example, $p^{++}$ type) is formed on the third region $SC_3$. The third region $SC_3$ is connected to the write-in information setting line WISL through the first impurity-containing layer $SC_{3A}$. The third region $SC_3$ is formed in a self-alignment manner by solid phase diffusion of a p-type impurity from the first impurity-containing layer $SC_{3A}$, and it has a shallow p junction. Further, the first impurity-containing layer $SC_{3A}$ is positioned on one side of the gate region G through an insulation material layer IF and has the form of a side-wall. There may be employed a constitution in which the first impurity-containing layer $SC_{3A}$ works as the write-in information setting line WISL as well. That is, the first impurity-containing layer $SC_{3A}$ extends in the direction perpendicular to a paper surface of the drawing, and an extending portion of the first impurity-containing layer $SC_{3A}$ is a first impurity-containing layer $SC_{3A}$ of an adjacent semiconductor memory cell and works as the write-in information setting line WISL. This structure serves to simplify a wiring structure and to attain the formation of a finer-structure of the semiconductor memory cell.

A second impurity-containing layer $SC_{5A}$ having the second conductivity type (for example, $p^{++}$ type) is formed on the fifth region $SC_5$. The fifth-region $SC_5$ is formed in a self-alignment manner by solid phase diffusion of a p-type impurity from the second impurity-containing layer $SC_{5A}$, and it has a shallow p junction. Further, the second impurity-containing layer $SC_{5A}$ is positioned on the other side of the gate region G through the insulation material layer IF, and has the form of a side-wall.

The third region $SC_3$ and the fifth region $SC_5$ of each of the semiconductor memory cells shown in FIGS. 61 to 64 may be replaced with a constitution of the impurity-containing layers $SC_{3A}$ and $SC_{5A}$, the third region $SC_3$ and the fifth region $SC_5$ of the semiconductor memory cell shown in FIG. 65.

There may be a case in which the fifth region $SC_5$ and the first region $SC_1$ do not need to be connected to each other. In this case, the fifth region $SC_5$ does not work at all, but is merely formed in the production process of the semiconductor memory cell. (Method of fabricating semiconductor memory cell)

Figure 66A:
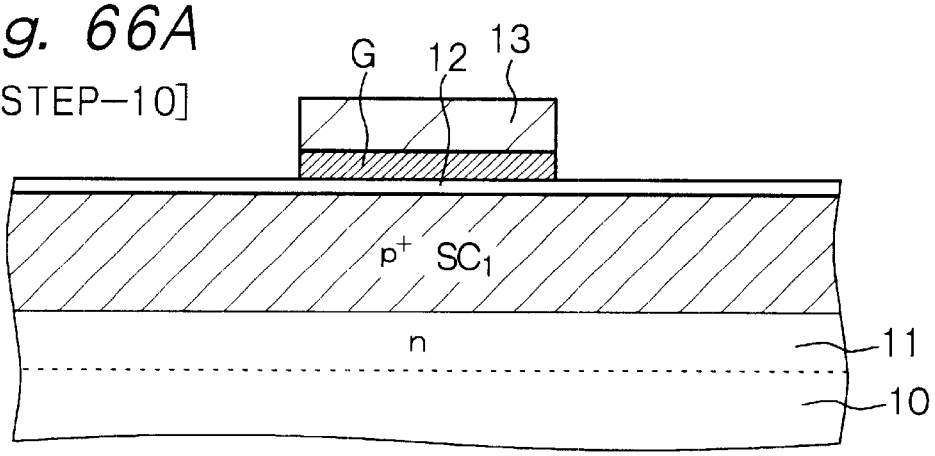
FIGS. 66A, 66B and 66C are schematic partial cross-sectional views of a semiconductor substrate, etc., for explaining the outline of the process for fabricating the semiconductor memory cell explained in Example 1 of the present invention.
Figure 66B:
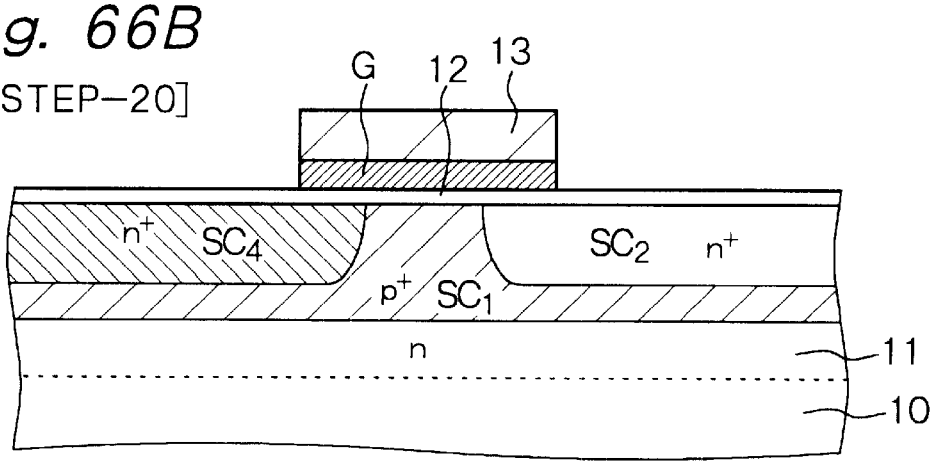
Figure 66C:
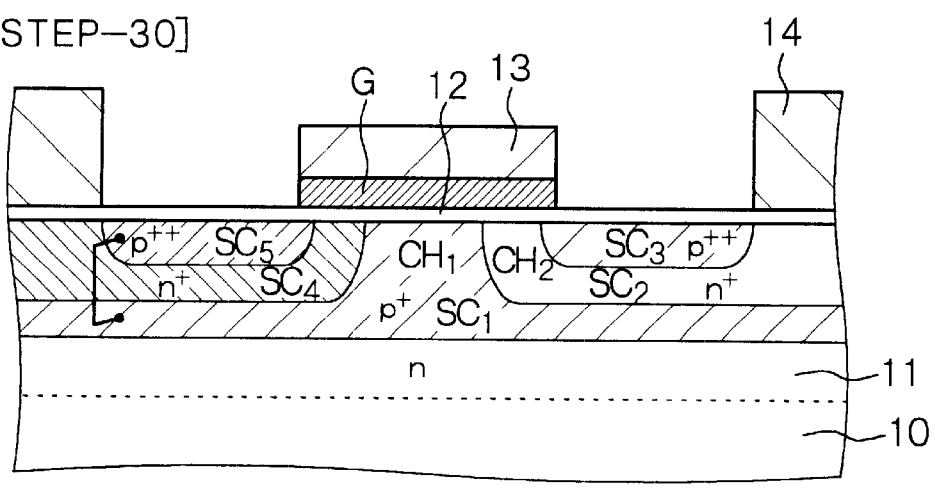
Figure 67A:
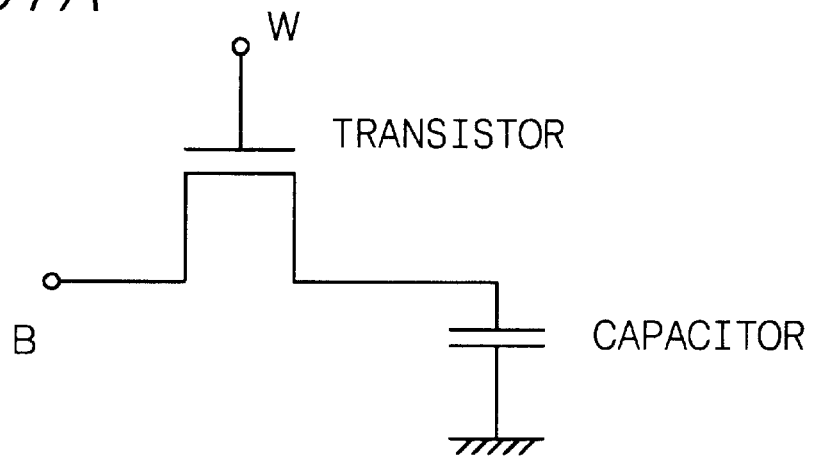
FIGS. 67A and 67B are a conceptual view of a conventional one-transistor memory cell and a conceptual cross-sectional view of a conventional memory cell having a trench capacitor cell structure.
Figure 67B:
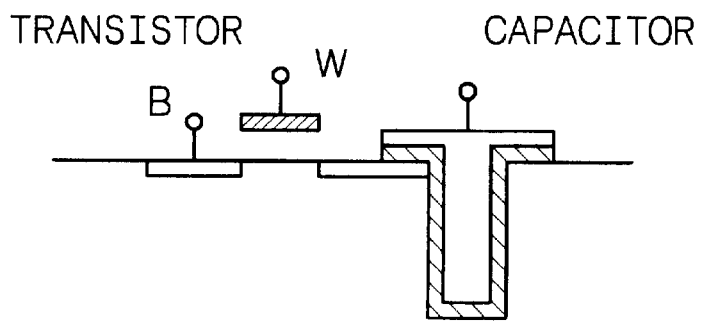

On the basis of the semiconductor memory cell of Example 1 shown in FIGS. 5A and 5B, the method of fabricating a semiconductor memory cell will be outlined with reference to FIGS. 66A to 66C.

[Step-10]

First, a device isolation region (not shown), a well of the first conductivity type (for example, n type well), an n type semiconductor layer 11, a well of the second conductivity type (for example, p type well, not shown), a semi-conductive first region $SC_1$ of the second conductivity type (for example, $p^+$ type), a high-concentration-impurity-containing layer $SC_{10}$ of the first conductivity type (for example, $n^{++}$ type, not shown) and a gate insulation layer 12 corresponding to an insulation layer are formed in a p type silicon semiconductor substrate 10 according to known methods. Then, a stacked structure of a gate region G and an offset insulation layer 13 made of $Si_3N_4$ is formed, as is shown in FIG. 66A. The gate region G is made of, for example, a polysilicon containing an n type impurity or has a polyside structure. The n type semiconductor layer 11 was arranged to have an impurity concentration of $1.0\times10^{17}/cm^3$, and the p type first region $SC_1$ was arranged to have an impurity concentration of $1.0\times10^{18}/cm^3$. The gate region G had a gate length of 0.3 µm.

[Step-20]

A semi-conductive second region $SC_2$ having the first conductivity type (for example, $n^+$ type) and a semi-conductive fourth region $SC_4$ having the first conductivity type (for example, $n^+$ type) are formed by ion implanting with an impurity of the first conductivity type (for example, $n^+$ type). The semi-conductive second region $SC_2$ is formed in a surface region of the first region $SC_1$, and the fourth region $SC_4$ which is spaced from the second region $SC_2$ is formed in a surface region of the first region $SC_1$ (see FIG. 66B). The second region $SC_2$ and the fourth region $SC_4$ were arranged to have an impurity concentration of $1.0\times10^{19}/cm^3$ each.

[Step-30]

An ion-implanting mask 14 is made from a resist material, and then an impurity of a second conductivity type (for example, p type) is ion-implanted, to form a semi-conductive third region $SC_3$ and a semi-conductive fifth region $SC_5$. The semi-conductive third region $SC_3$ is formed in a surface region of the second region $SC_2$ and is in contact with the second region $SC_2$ so as to form a rectifier junction together with the second region $SC_2$, and the fifth region $SC_5$ is formed in a surface region of the fourth region $SC_4$ and is in contact with the fourth region $SC_4$ so as to form a rectifier junction together with the fourth region $SC_4$ (see FIG. 66C). The third region $SC_3$ and the fifth region $SC_5$ were arranged to have an impurity concentration of $1.0\times10^{20}/cm^3$ each.

[Step-40]

A write-in information setting line, a second line, a third line and the like are formed according to known methods.

Steps of fabricating the semiconductor memory cell shall not be limited to the above steps. The gate region and the device isolation region may be formed after [Step-30]. The impurity concentration in each region is an example and may be modified as required.

When a majority carrier diode DS of a Schottky junction type is formed, a diode-constituting region $SC_D$ made, for example, of a titanium silicide layer is formed in a surface region of the second region $SC_2$. The titanium silicide layer can be formed, for example, by the following method. That is, for example, an insulation interlayer is formed on the entire surface, and the insulation interlayer is removed from a region (corresponding to the second region $SC_2$) on the silicon semiconductor substrate 10, the region being a region where the titanium silicide layer is to be formed. Then, a titanium layer is formed on the insulation interlayer including the exposed surface of the silicon semiconductor substrate 10, by a sputtering method. Then, a first annealing treatment is carried out to allow the titanium layer and the silicon semiconductor substrate to react with each other, whereby the titanium silicide layer is formed on the surface of the silicon semiconductor substrate 10. Then, unreacted titanium layer on the insulation interlayer is removed, for example, with an ammonium hydrogen peroxide aqueous solution (mixture containing $NH_4OH$, $H_2O_2$ and $H_2O$), and then, a second annealing treatment is carried out, whereby a stable titanium silicide layer can be obtained. The material for the majority carrier diode DS shall not be limited to titanium silicide, and it can be selected from cobalt silicide, tungsten silicide or the like.

The method for forming the majority carrier diode DS or methods for forming conductive regions in surface regions of various regions shall not be limited to the above-described methods. For example, when the write-in information setting line WISL is formed, a barrier layer or a glue layer made, for example, of titanium silicide or TiN is formed, and the barrier layer or glue layer is formed on the surface of the second region $SC_2$ as well. In this case, the diode-constituting region $SC_D$ common to a portion of the write-in information setting line WISL (more specifically, a portion of the barrier layer or the glue layer) can be formed on the surface of the second region $SC_2$. Similarly, conductive regions can be also formed on surface regions of various regions.

Since the semiconductor memory cells of the other Examples can be also fabricated by substantially the same method as above, detailed explanations of the production methods therefore are omitted. When the second junction-field-effect transistor is not formed, ion-implantation in the third region $SC_3$ and ion-implantation in the fifth region $SC_5$ are carried out separately in [Step-30] such that the impurity concentration of the third region $SC_3$ and the impurity concentration of the fifth region $SC_5$ differ from each other.

The operation of the semiconductor memory cell of the present invention will be explained with reference to the semiconductor memory cell of Example 1 shown in FIGS. 5A and 5B, while the operational principle of the semiconductor memory cell of any other Example is substantially the same. When the write-in information setting line works as a second line (for example, bit line) as well, the write-in information setting line WISL in the following explanation can be read as the second line (for example, bit line) in principle.

In write-in operation, potentials at portions of the semiconductor memory cell are set as shown in the following Table 1. In read-out operation, potentials at portions of the semiconductor memory cell are set as shown in the following Table 2. When the write-in information setting line is provided separately from the fourth line, the predetermined potential including 0 volt is applied to the write-in information setting line.

TABLE 1

| First line for memory cell selection | $V_W$ |
|---|---|
| Write-in information setting line | |
| when writing "0" | $V_0$ |
| when writing "1" | $V_1$ |

TABLE 2

| First line for memory cell selection | $V_R$ |
|---|---|
| Second line | $V_2$ |

A threshold voltage of the first transistor $TR_1$ seen from the gate region G is given as shown in the following Table 3. Further, the relationship among potentials in the first transistor $TR_1$ is set as shown in Table 3. A potential in the channel forming region $CH_1$ of the first transistor $TR_1$ when information "0" is read out is different from that when information "1" is read out. As a result, the threshold voltage of the first transistor $TR_1$ seen from the gate region G changes, depending upon whether the stored information is "0" or "1". However, unlike a conventional DRAM, the semiconductor memory cell of the present invention does not require a capacitor with a large capacitance required by a conventional DRAM. When the junction-field-effect transistor $JF_1$ for current control is provided, and when the ratio of an ON-state current to an OFF-state current of the junction-field-effect transistor $JF_1$ for current control is large, the information can be read out without any error even if $|V_R| \geq |V_{TH\_11}|$.

TABLE 3

| When "0" | $V_{TH\_10}$ |
|---|---|
| When "1" | $V_{TH\_11}$ |
| $|V_{TH\_11}| > |V_R| > |V_{TH\_10}|$ | |

[Operation to Write Information]

In operation to write "0" (the potential in the write-in information setting line: $V_0$) or write "1" (the potential in the write-in information setting line: $V_1$), the potential in the first line for memory cell selection is set at $V_W$ (<0). As a result, the potential in the gate region G of the second transistor $TR_2$ is set at $V_W$ (<0) as well, and the second transistor $TR_2$ is brought into an ON-state. Therefore, the potential in the channel forming region $CH_1$ of the first transistor $TR_1$ is $V_0$ when information "0" is written in, or $V_1$ (where, $V_W$–$V_{TH2}$ in case of $|V_W|<|V_1+V_{TH2}|$) when information "1" is written in.

In an information maintaining state after the information has been written in and before the information is read out, potentials in portions in the first transistor $TR_1$ and the second transistor $TR_2$ should be set at such values that these transistors do not conduct. For this purpose, typically, the potential in the first line for memory cell selection is set at 0 volt and the potential in the write-in information setting line is set at $V_1$.

When information is written, the gate region G of the first transistor $TR_1$ has a potential of $V_W$ (<0). The first transistor $TR_1$ is therefore in an OFF-state. In this manner, when date of "0" or "1" is written, the channel forming region $CH_1$ of the first transistor $TR_1$ has a potential of $V_0$ (a case of "0"), or $V_1$ or $V_W$–$V_{TH2}$ (a case of "1"). This state is retained in a tolerable range until information is read out although it changes with the passage of time due to a leak current (between the channel forming region $CH_1$ of the first transistor $TR_1$ and, for example, a semiconductor substrate, and an off current of the second transistor $TR_2$). Before the change of the potential in the channel forming region $CH_1$ of the first transistor $TR_1$ with the passage of time comes to be large enough to cause an error in reading operation, a so-called refreshing operation is carried out.

[Operation to Read Out Information]

In operation to read out the information "0" or "1", the potential in the first line for memory cell selection is set at $V_R$ (>0). Therefore, the potential in the gate region G of the second transistor $TR_2$ is also set at $V_R$ (>0). As a result, the second transistor $TR_2$ is brought into an OFF-state.

The potential in the gate region G of the first transistor $TR_1$ is set at $V_R$ (>0) as well. The threshold voltage of the first transistor $TR_1$ seen from the gate region G is $V_{TH\_10}$ or $V_{TH\_11}$. The threshold voltage of the first transistor $TR_1$ depends upon the state of the potential in the channel forming region $CH_1$. The relationship among the potentials and the threshold voltages is as follows.

$$|V_{TH\_11}|>|V_R|>|V_{TH\_10}|$$

Therefore, when the stored information is "0", the first transistor $TR_1$ is brought into an ON-state. When the stored information is "1", on the other hand, the first transistor $TR_1$ is brought into an OFF-state. However, when the ratio of an ON-state current to an OFF-state current of the junction-field-effect transistor $JF_1$ is large, the information can be read out without any error even if $|V_R|\geq|V_{TH\_11}|$.

Further, when the junction-field-effect transistor $JF_1$ is provided, the first transistor $TR_1$ is controlled by the junction-field-effect transistor $JF_1$ on the basis of the bias conditions of each regions constituting the gate portions of the junction-field-effect transistor $JF_1$. That is, when the stored information is "0", the junction-field-effect transistor $JF_1$ is brought into an ON-state. When the stored information is "1", on the other hand, the junction-field-effect transistor $JF_1$ is brought into an OFF-state.

In the above manner, the first transistor $TR_1$ can be brought into an ON-state or an OFF-state with a high degree of reliability depending upon the stored information. Since the fourth region $SC_4$ is connected to the second line (for example, bit line), a current flows or does not flow in the first transistor $TR_1$ depending upon whether the stored information is "0" or "1". As a result, the stored information can be read out by the first transistor $TR_1$.

Table 4 summarizes the above-explained operation states of the first transistor $TR_1$ and the second transistor $TR_2$. When the third transistor $TR_3$ for current control is provided, the third transistor $TR_3$ is controlled such that it is in an ON-state when information is written, that it is also in an ON-state when the information is retained and that it is in an OFF-state when the information is read out. Values of potentials in Table 4 are shown as examples, and the potentials can have any values so long as the values satisfy the above conditions.

TABLE 4 unit:volt

| Write-in operation | | Write-in of "0" | | Write-in of "1" |
| --- | --- | --- | --- | --- |
| Potential in first line | $V_W$ | −3.0 | $V_W$ | −3.0 |
| Potential in write-in information setting line | $V_0$ | 0 | $V_1$ | −2.0 |
| Potential in gate region | $V_W$ | −3.0 | $V_W$ | −3.0 |
| State of $TR_2$ | | ON | | ON |
| Potential in channel forming region $CH_1$ | $V_0$ | 0 | $V_1$ | −2.0 |
| State of $TR_1$ | | OFF | | OFF |

TABLE 4-continued unit:volt

| Read-out operation | | Read-out of "0" | | Read-out of "1" |
| --- | --- | --- | --- | --- |
| Potential in first line | $V_R$ | 1.0 | $V_R$ | 1.0 |
| Potential in gate region | $V_R$ | 1.0 | VR | 1.0 |
| State of $TR_2$ | | OFF | | OFF |
| Potential in channel forming region $CH_1$ | $V_0$ | 0 | $V_1$ | −2.0 |
| Threshold voltage of $TR_1$ seen from gate region | $V_{TH}$—0 | 0.5 | $V_{TH}$—1 | 1.1 |
| State of $TR_1$ | | ON | | OFF |
| Potential in second line | $V_2$ | 0.5 | $V_2$ | 0.5 |

The semiconductor memory cell of the present invention is explained with reference to the preferred embodiments of the present invention hereinabove, while the present invention shall not be limited thereto. Those structures of the semiconductor memory cells and those values of voltages and potentials which are explained in Examples are shown as examples and may be altered as required. Further, in the semiconductor memory cell of the present invention explained in each Example, the first transistor $TR_1$, the junction-field-effect transistor $JF_1$ and the second junction-field-effect transistor $JF_2$ may be formed as p channel types, and the second transistor $TR_2$ and the third transistor $TR_3$ may be formed as n channel types. Layouts of elements in the transistors are shown as examples and may be altered as required. Further, the SOI structure and TFT structure shown in FIG. 7 may be applied to various semiconductor memory cells of the present invention. Further, an impurity can be introduced into various regions not only by an ion-implanting method but also by a diffusion method. Further, the present invention can be applied not only to a semiconductor memory cell made of a silicon semiconductor but also to a semiconductor memory cell made of a compound semiconductor such as a GaAs semiconductor. Furthermore, the semiconductor memory cell of the present invention can be applied to a semiconductor memory cell having an MIS type FET structure.

In the present invention, when the semiconductor memory cell is cut with the first imaginary perpendicular plane, the second region and the fourth region in the vicinity of the gate region are nearly symmetrical with respect to the second imaginary perpendicular plane. In some cases, further, the third region and the fifth region in the vicinity of the gate region are symmetrical with respect to the second imaginary perpendicular plane. Therefore, the freedom during designing or production of the semiconductor memory cell can be increased. Moreover, since the transistors are integrally formed, the area of the semiconductor memory cell can be further decreased, and a leak current can be decreased.

According to the third to fifth aspects of the present invention, the junction-field-effect transistor for current control is provided, and the junction-field-effect transistor is controlled to be in ON/OFF state when information is read out, so that the margin of a current which flows in the first transistor $TR_1$ can be broadened to a far greater extent. As a result, the number of the semiconductor memory cells that are connected to the bit line is limited to a least degree.

The process of the semiconductor memory cell of the present invention is compatible with a MOS logic circuit formation process as shown in FIGS. 66A to 66C. The semiconductor memory cell can be therefore materialized in an area of about one transistor although it depends upon the structure of the semiconductor memory cell. Further, DRAM functions can be incorporated into the MOS logic circuit by only adding up a few steps. Furthermore, semiconductor memory cells having an area of nearly one transistor each can be materialized without the necessity of an SOI technology but by a conventional semiconductor memory cell production technology.

What is claimed is:

1. A semiconductor memory cell comprising;
   (1) a first transistor for readout, having source/drain regions, a channel forming region and a gate region and having a first conductivity type,
   (2) a second transistor for switching, having source/drain regions, a channel forming region and a gate region and having a second conductivity type, and
   (3) a junction-field-effect transistor for current control, having source/drain regions, a channel region and gate portions,
   the semiconductor memory cell having;
      (a) a semi-conductive first region having a second conductivity type,
      (b) a semi-conductive second region which is formed in a surface region of the first region and has a first conductivity type,
      (c) a third region which is formed in a surface region of the second region and is in contact with the second region so as to form a rectifier junction together with the second region,
      (d) a semi-conductive fourth region which is formed in a surface region of the first region and spaced from the second region and which has the first conductivity type,
      (e) a fifth region which is formed in a surface region of the fourth region and is in contact with the fourth region so as to form a rectifier junction together with the fourth region, and
      (f) a gate region which is formed on an insulation layer so as to bridge the first region and the third region and so as to bridge the second region and the fourth region and is shared by the first and second transistors,
   wherein:
      (A-1) one source/drain region of the first transistor is formed of a surface region of the second region,
      (A-2) the other source/drain region of the first transistor is formed of a surface region of the fourth region,
      (A-3) the channel forming region of the first transistor is formed of a surface region of the first region which surface region is interposed between said surface region of the second region and said surface region of the fourth region,
      (B-1) one source/drain region of the second transistor is formed of said surface region of the first region which surface region forms the channel forming region of the first transistor,
      (B-2) the other source/drain region of the second transistor is formed of the third region,
      (B-3) the channel forming region of the second transistor is formed of said surface region of the second region which surface region forms the one source/drain region of the first transistor,
      (C-1) the gate portions of the junction-field-effect transistor are formed of the fifth region and a portion of the first region which portion is opposed to the fifth region,
      (C-2) the channel region of the junction-field-effect transistor is formed of a portion of the fourth region which portion is interposed between the fifth region and said portion of the first region,
      (C-3) one source/drain region of the junction-field-effect transistor is formed of said surface region of the fourth region which surface region extends from one end of the channel region of the junction-field-effect transistor and forms the other source/drain region of the first transistor,
      (C-4) the other source/drain region of the junction-field-effect transistor is formed of a portion of the fourth region which portion extends from the other end of the channel region of the junction-field-effect transistor,
      (D) the gate region is connected to a first line for memory cell selection,
      (E) the third region is connected to a write-in information setting line,
      (F) the fourth region is connected to a second line, and
      (G) the fifth region is connected to a third line, and further wherein:
         the second region and the fourth region at least in the areas thereof where the second region and the fourth region are bridged by the gate region are substantially mirror images of each other with respect to the center of the gate region, and
         wherein the fifth region is connected to the write-in information setting line in place of being connected to the third line.

2. The semiconductor memory cell according to claim 1, wherein a diode is formed of the second region and the third region, and the second region is connected to the write-in information setting line through the third region.

3. The semiconductor memory cell according to claim 1, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

4. The semiconductor memory cell according to claim 1, wherein a diode is formed of the second region and the third region, and the second region is connected to the write-in information setting line through the third region.

5. The semiconductor memory cell according to claim 1, wherein a diode-constituting region is formed in a surface region of the second region to e in contact with the second region so as to form a rectifier junction together with the second region, a majority carrier diode is formed of the diode-constituting region and the second region, and the second region is connected to the write-in information setting line through the diode-constituting region.

6. The semiconductor memory cell according to claim 1, wherein the fifth region is connected to the first region in place of being connected to the third line.

7. The semiconductor memory cell according to claim 6, wherein a diode is formed of the second region and the third region, and the second region is connected to the write-in information setting line through the third region.

8. The semiconductor memory cell according to claim 6, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

9. A semiconductor memory cell comprising;
(1) a first transistor for readout, having source/drain regions, a channel forming region and a gate region and having a first conductivity type,
(2) a second transistor for switching, having source/drain regions, a channel forming region and a gate region and having a second conductivity type, and
(3) a junction-field-effect transistor for current control, having source/drain regions, a channel region and gate portions, the semiconductor memory cell having;
- (a) a semi-conductive first region having a second conductivity type,
- b) a semi-conductive second region which is formed in a surface region of the first region and has a first conductivity type,
- (c) a third region which is formed in a surface region of the second region and is in contact with the second region so as to form a rectifier junction together with the second region,
- (d) a semi-conductive fourth region which is formed in a surface region of the first region and spaced from the second region and which has the first conductivity type,
- (e) a fifth region which is formed in a surface region of the fourth region and is in contact with the fourth region so as to form a rectifier junction together with the fourth region, and
- (f) a gate region which is formed on an insulation layer so as to bridge the first region and the third region and so as to bridge the second region and the fourth region and is shared by the first and second transistors, wherein:
- (A-1) one source/drain region of the first transistor is formed of a surface region of the second region,
- (A-2) the other source/drain region of the first transistor is formed of a surface region of the fourth region,
- (A-3) the channel forming region of the first transistor is formed of a surface region of the first region which surface region is interposed between said surface region of the second region and said surface region of the fourth region,
- (B-1) one source/drain region of the second transistor is formed of said surface region of the first region which surface region forms the channel forming region of the first transistor,
- B-2) the other source/drain region of the second transistor is formed of the third region,
- (B-3) the channel forming region of the second transistor is formed of said surface region of the second region which surface region forms the one source/drain region of the first transistor,
- (C-1) the gate portions of the junction-field-effect transistor are formed of the fifth region and a portion of the first region which portion is opposed to the fifth region,
- (C-2) the channel region of the junction-field-effect transistor is formed of a portion of the fourth region which portion is interposed between the fifth region and said portion of the first region,
- (C-3) one source/drain region of the junction-field-effect transistor is formed of said surface region of the fourth region which surface region extends from one end of the channel region of the junction-field-effect transistor and forms the other source/drain region of the first transistor,
- (C-4) the other source/drain region of the junction-field-effect transistor is formed of a portion of the fourth region which portion extends from the other end of the channel region of the junction-field-effect transistor,
- (D) the gate region is connected to a first line for memory cell selection,
- (E) the third region is connected to a write-in information setting line,
- (F) the fourth region is connected to a second line, and
- (G) the fifth region is connected to a third line, and further wherein:
  the second region and the fourth region at least in the areas thereof where the second region and the fourth region are bridged by the gate region are substantially mirror images of each other with respect to the center of the gate region, wherein the semiconductor memory cell further comprises a second junction-field-effect transistor for current control, having source/drain regions, a channel region and gate portions,
  the gate portions of the second junction-field-effect transistor are formed of the third region and a portion of the first region which portion is opposed to the third region,
  the channel region of the second junction-field-effect transistor is formed of a portion of the second region which portion is interposed between the third region and said portion of the first region,
  one source/drain region of the second junction-field-effect transistor is formed of said surface region of the second region which surface region extends from one end of the channel region of the second junction-field-effect transistor and forms the one source/drain region of the first transistor, and
  the other source/drain region of the second junction-field-effect transistor is formed of a portion of the second region which portion extends from the other end of the channel region of the second junction-field-effect transistor.

10. The semiconductor memory cell according to claim 9, wherein a diode is formed of the second region and the third region, and the second region is connected to the write-in information setting line through the third region.

11. The semiconductor memory cell according to claim 9, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

12. The semiconductor memory cell according to claim 9, wherein the fifth region is connected to the first region in place of being connected to the third line.

13. The semiconductor memory cell according to claim 12, wherein a diode is formed of the second region and the third region, and the second region is connected to the write-in information setting line through the third region.

14. The semiconductor memory cell according to claim 12, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

15. A semiconductor memory cell comprising;
   (1) a first transistor for readout, having source/drain regions, a channel forming region and a gate region and having a first conductivity type,
   (2) a second transistor for switching, having source/drain regions, a channel forming region and a gate region and having a second conductivity type,
   (3) a third transistor for current control, having source/drain regions, a channel forming region and a gate region and having the second conductivity type, and
   (4) a junction-field-effect transistor for current control, having source/drain regions, a channel region and gate portions,
   the semiconductor memory cell having;
      (a) a semi-conductive first region having a second conductivity type,
      (b) a semi-conductive second region which is formed in a surface region of the first region and has a first conductivity type,
      (c) a third region which is formed in a surface region of the second region and is in contact with the second region so as to form a rectifier junction together with the second region,
      (d) a semi-conductive fourth region which is formed in a surface region of the first region and spaced from the second region and which has the first conductivity type,
      (e) a fifth region which is formed in a surface region of the fourth region and is in contact with the fourth region so as to form a rectifier junction together with the fourth region, and
      (f) a gate region which is formed on an insulation layer so as to bridge the first region,and the third region, so as to bridge the second region and the fourth region and so as to bridge the first region and the fifth region and is shared by the first, second and third transistors,
   wherein:
      (A-1) one source/drain region of the first transistor is formed of a surface region of the second region,
      (A-2) the other source/drain region of the first transistor is formed of a surface region of the fourth region,
      (A-3) the channel forming region of the first transistor is formed of a surface region of the first region which surface region is interposed between said surface region of the second region and said surface region of the fourth region,
      (B-1) one source/drain region of the second transistor is formed of said surface region of the first region which surface region forms the channel forming region of the first transistor,
      (B-2) the other source/drain region of the second transistor is formed of the third region,
      (B-3) the channel forming region of the second transistor is formed of said surface region of the second region which surface region forms the one source/drain region of the first transistor,
      (C-1) one source/drain region of the third transistor is formed of said surface region of the first region,
      (C-2) the other source/drain region of the third transistor is formed of the fifth region,
      (C-3) the channel forming region of the third transistor is formed of said surface region of the fourth region,
      (D-1) the gate portions of the junction-field-effect transistor are formed of the fifth region and a portion of the first region which portion is opposed to the fifth region,
      (D-2) the channel region of the junction-field-effect transistor is formed of a portion of the fourth region which portion is interposed between the fifth region and said portion of the first region,
      (D-3) one source/drain region of the junction-field-effect transistor is formed of said surface region of the fourth region which surface region extends from one end of the channel region of the junction-field-effect transistor, forms the other source/drain region of the first transistor and forms the channel forming region of the third transistor,
      (D-4) the other source/drain region of the junction-field-effect transistor is formed of a portion of the fourth region which portion extends from the other end of the channel region of the junction-field-effect transistor,
   (E) the gate region is connected to a first line for memory cell selection,
   (F) the third region is connected to a write-in information setting line, and
   (G) the fourth region is connected to a second line, and further wherein:
      the second region and the fourth region at least in the areas thereof where the second region and the fourth are bridged by the gate region are substantially mirror images of each other with respect to the center of the gate region
      the semiconductor memory cell further comprises a second junction-field-effect transistor for current control, having source/drain regions, a channel region and gate portions, the gate portions of the second junction-field-effect transistor are formed of the third region and a portion of the first region which portion is opposed to the third region,
      the channel region of the second junction-field-effect transistor is formed of a portion of the second region which portion is interposed between the third region and said portion of the first region,
      one source/drain region of the second junction-field-effect transistor is formed of said surface region of the second region which surface region extends from one end of the channel region of the second junction-field-effect transistor and forms the one source/drain region of the first transistor, and
      the other source/drain region of the second junction-field-effect transistor is formed of a portion of the second region which portion extends from the other end of the channel region of the second junction-field-effect transistor.

16. The semiconductor memory cell according to claim 15, wherein a diode is formed of the second region and the third region, and the second region is connected to the write-in information setting line through the third region.

17. The semiconductor memory cell according to claim 15, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

18. The semiconductor memory cell according to claim 15, wherein a diode is formed of the second region and the third region, and the second region is connected to the write-in information setting line through the third region.

19. The semiconductor memory cell according to claim 15, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

20. A semiconductor memory cell comprising;
(1) a first transistor for readout, having source/drain regions, a channel forming region and a gate region and having a first conductivity type,
(2) a second transistor for switching, having source/drain regions, a channel forming region and a gate region and having a second conductivity type, and
(3) a junction-field-effect transistor for current control, having source/drain regions, a channel region and gate portions, the semiconductor memory cell having;
(a) a semi-conductive first region having a second conductivity type,
(b) a semi-conductive second region which is formed in a surface region of the first region and has a first conductivity type,
(c) a third region which is formed in a surface region of the second region and is in contact with the second region so as to form a rectifier junction together with the second region,
(d) a semi-conductive fourth region which is formed in a surface region of the first region and spaced from the second region and which has the first conductivity type,
(e) a fifth region which is formed in a surface region of the fourth region and is in contact with the fourth region so as to form a rectifier junction together with the fourth region, and
(f) a gate region which is formed on an insulation layer so as to bridge the first region and the third region and so as to bridge the second region and the fourth region and is shared by the first and second transistors, wherein:
(A-1) one source/drain region of the first transistor is formed of a surface region of the second region,
(A-2) the other source/drain region of the first transistor is formed of a surface region of the fourth region,
(A-3) the channel forming region of the first transistor is formed of a surface region of the first region which surface region is interposed between said surface region of the second region and said surface region of the fourth region,
(B-1) one source/drain region of the second transistor is formed of said surface region of the first region which surface region forms the channel forming region of the first transistor,
(B-2) the other source/drain region of the second transistor is formed of the third region,
(B-3) the channel forming region of the second transistor is formed of said surface region of the second region which surface region forms the one source/drain region of the first transistor,
(C-1) the gate portions of the junction-field-effect transistor are formed of the third region and a portion of the first region which portion is opposed to the third region,
(C-2) the channel region of the junction-field-effect transistor is formed of a portion of the second region which portion is interposed between the third region and said portion of the first region,
(C-3) one source/drain region of the junction-field-effect transistor is formed of said surface region of the second region which surface region extends from one end of the channel region of the junction-field-effect transistor and forms the one source/drain region of the first transistor,
(C-4) the other source/drain region of the junction-field-effect transistor is formed of a portion of the second region which portion extends from the other end of the channel region of the junction-field-effect transistor,
(D) the gate region is connected to a first line for memory cell selection,
(E) the third region is connected to a write-in information setting line,
(F) the fourth region is connected to a second line, and
(G) the fifth region is connected to the first region, and further wherein:
the second region and the fourth region at least in the areas thereof where the second region and the fourth region are bridged by the gate region are substantially mirror images of each other with respect to the center of the gate region.

21. The semiconductor memory cell according to claim 20, wherein a diode is formed of the second region and the third region, and the second region is connected to the write-in information setting line through the third region.

22. The semiconductor memory cell according to claim 20, wherein a diode-constituting region is formed in a surface region of the second region to be in contact with the second region so as to form a rectifier junction together with the second region, a majority carrier diode is formed of the diode-constituting region and the second region, and the second region is connected to the write-in information setting line through the diode-constituting region.

* * * * *